(12) United States Patent
Sakakibara et al.

(10) Patent No.: US 10,348,992 B2
(45) Date of Patent: Jul. 9, 2019

(54) COMPARATOR, AD CONVERTER, SOLID-STATE IMAGING DEVICE, ELECTRONIC APPARATUS, AND METHOD OF CONTROLLING COMPARATOR

(71) Applicant: SONY CORPORATION, Tokyo (JP)

(72) Inventors: Masaki Sakakibara, Kanagawa (JP); Kenichi Aoyagi, Kanagawa (JP); Seiji Yamada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/961,584

(22) Filed: Apr. 24, 2018

(65) Prior Publication Data

US 2018/0241960 A1 Aug. 23, 2018

Related U.S. Application Data

(63) Continuation of application No. 14/916,652, filed as application No. PCT/JP2015/068962 on Jul. 1, 2015, now Pat. No. 10,021,331.

(30) Foreign Application Priority Data

Jul. 14, 2014 (JP) .................................. 2014-144389

(51) Int. Cl.
*H04N 5/3745* (2011.01)
*H01L 27/146* (2006.01)
(Continued)

(52) U.S. Cl.
CPC ....... *H04N 5/3745* (2013.01); *H01L 27/1461* (2013.01); *H01L 27/1464* (2013.01);
(Continued)

(58) Field of Classification Search
None
See application file for complete search history.

(56) References Cited

U.S. PATENT DOCUMENTS

| 10,021,331 | B2 * | 7/2018 | Sakakibara | .......... | H04N 5/3745 |
| 2010/0321227 | A1 * | 12/2010 | Hales | ................... | G01R 19/257 |
| | | | | | 341/158 |
| 2011/0169681 | A1 * | 7/2011 | Naka | ...................... | H03K 5/249 |
| | | | | | 341/158 |

FOREIGN PATENT DOCUMENTS

JP        2013051527 A    *  3/2013

OTHER PUBLICATIONS

English translation of JP-2013051527-A Murakami, Mar. 2013 (Year: 2013).*

(Continued)

*Primary Examiner* — James M Hannett
(74) *Attorney, Agent, or Firm* — Sheridan Ross P.C.

(57) ABSTRACT

The present disclosure relates to a comparator, an AD converter, a solid-state imaging device, an electronic apparatus, and a comparator control method that can reduce power consumption while increasing the determination speed of the comparator.
The comparator includes a comparison unit, a positive feedback circuit, and a current limiting unit. The comparison unit compares the voltage of an input signal and the voltage of a reference signal, and outputs a comparison result signal. The positive feedback circuit increases the transition speed at the time when the comparison result signal is inverted. The current limiting unit limits the current flowing in the comparison unit after the inversion of the comparison result signal. The present disclosure can be applied to comparators, for example.

1 Claim, 67 Drawing Sheets

(51) Int. Cl.
*H03K 5/24* (2006.01)
*H04N 5/378* (2011.01)
*H04N 5/369* (2011.01)

(52) U.S. Cl.
CPC .. *H01L 27/14612* (2013.01); *H01L 27/14621* (2013.01); *H01L 27/14627* (2013.01); *H01L 27/14634* (2013.01); *H01L 27/14636* (2013.01); *H01L 27/14645* (2013.01); *H03K 5/24* (2013.01); *H03K 5/2481* (2013.01); *H04N 5/378* (2013.01); *H04N 5/379* (2018.08); *H04N 5/37455* (2013.01)

(56) References Cited

OTHER PUBLICATIONS

Official Action (with English translation) for Chinese Patent Application No. 201580001816.9, dated Mar. 1, 2019, 21 pages.
Official Action (with English translation) for Chinese Patent Application No. 201710089900.1, dated Apr. 3, 2019, 20 pages.

* cited by examiner

US 10,348,992 B2

COMPARATOR, AD CONVERTER, SOLID-STATE IMAGING DEVICE, ELECTRONIC APPARATUS, AND METHOD OF CONTROLLING COMPARATOR

CROSS REFERENCE TO RELATED APPLICATIONS

This application is a continuation of U.S. patent application Ser. No. 14/916,652, filed Mar. 4, 2016, which is a national stage application under 35 U.S.C. 371 and claims the benefit of PCT Application No. PCT/JP2015/068962 having an international filing date of 1 Jul. 2015, which designated the United States, which PCT application claimed the benefit of Japanese Patent Application No. 2014-144389 filed 14 Jul. 2014, the disclosures of each of which are incorporated herein by reference in their entirety.

TECHNICAL FIELD

The present disclosure relates to comparators, AD converters, solid-state imaging devices, electronic apparatuses, and comparator control methods, and more particularly, to a comparator, an AD converter, a solid-state imaging device, an electronic apparatus, and a comparator control method that can reduce power consumption while increasing the determination speed of the comparator.

BACKGROUND ART

In a case where AD conversion is performed in a limited area such as an area in a pixel by a signal read method designed for a solid-state imaging device, the method with the highest area efficiency is an AD conversion method of an integral type (sloped type) realized by a comparator and a digital circuit in the subsequent stage.

Non-Patent Documents 1 and 2 have been suggested as technologies for realizing AD conversion in a limited area by using an AD conversion method of an integral type. For example, Non-Patent Document 1 discloses a circuit structure in which a digital circuit in a later stage is a DRAM circuit, and a slope signal is input to a comparator more than once. When 8-bit AD conversion is performed, for example, the same slope signal is input to the comparator eight times. The operation to store a code of "0" or "1" into the DRAM circuit at the time when the output from the comparator is inverted is repeated eight times. When the comparison in the entire area is finished, the codes are read out.

CITATION LIST

Non-Patent Documents

Non-Patent Document 1: D. Yang, B. Fowler, and A. El Gamal, "A Nyquist rate pixel level ADC for CMOS image sensors," in Proc. IEEE 1998 Custom Integrated Circuits Conf., Santa Clara, Calif., May 1998, pp. 237-240.
Non-Patent Document 2: S. Kleinfelder, S. Lim, X. Liu, and A. El Gamal, "A 10 kframe/s 0.18 μm CMOS digital pixel sensor with pixel-level memory," IEEE International Solid-State Circuits Conference, vol. XLIV, pp. 88-89, February 2001.

SUMMARY OF THE INVENTION

Problems to be Solved by the Invention

In a case where AD converters are arranged for the respective pixel columns in a column parallel layout, a relatively high degree of freedom is allowed in terms of area. In a case where an AD converter is provided in each pixel, however, the circuit accommodation area is limited, and therefore, it is difficult to manufacture comparators that adequately satisfy requirements. For example, the determination speed of the comparators might become lower, or power consumption might increase if performance is improved.

The present disclosure is made in view of these circumstances, and aims to reduce power consumption while increasing the determination speed of a comparator.

Solutions to Problems

A comparator as a first aspect of the present disclosure includes: a comparison unit that compares the voltage of an input signal with the voltage of a reference signal, and outputs a comparison result signal; a positive feedback circuit that increases the speed of transition at the time when the comparison result signal is inverted; and a current limiting unit that limits the current flowing in the comparison unit after the inversion of the comparison result signal.

A method of controlling a comparator as a second aspect of the present disclosure includes: a comparison unit comparing the voltage of an input signal with the voltage of a reference signal, and outputting a comparison result signal; a positive feedback circuit increasing the speed of transition at the time when the comparison result signal is inverted; and a current limiting unit limiting the current flowing in the comparison unit after the inversion of the comparison result signal, the comparator including the comparison unit, the positive feedback circuit, and the current limiting unit.

In the first and second aspects of the present disclosure, the voltage of an input signal is compared with the voltage of a reference signal, and a comparison result signal is output. The speed of transition at the time when the comparison result signal is inverted is increased. After the inversion of the comparison result signal, the current flowing in the comparison unit is limited.

An AD converter as a third aspect of the present disclosure includes: a comparator including: a comparison unit that compares the voltage of an input signal with the voltage of a reference signal, and outputs a comparison result signal; a positive feedback circuit that increases the speed of transition at the time when the comparison result signal is inverted; and a current limiting unit that limits the current flowing in the comparison unit after the inversion of the comparison result signal; and a storage unit that stores the code input signal at the time when the comparison result signal is inverted, and outputs the code input signal.

In the third aspect of the present disclosure, the voltage of an input signal is compared with the voltage of a reference signal, and a comparison result signal is output. The speed of transition at the time when the comparison result signal is inverted is increased. After the inversion of the comparison result signal, the current flowing in the comparison unit is limited. The code input signal at the time when the comparison result signal is inverted is stored and output.

A solid-state imaging device as a fourth aspect of the present disclosure includes: an AD converter including: a comparator including: a comparison unit that compares the voltage of an input signal with the voltage of a reference signal, and outputs a comparison result signal; a positive feedback circuit that increases the speed of transition at the time when the comparison result signal is inverted; and a current limiting unit that limits the current flowing in the comparison unit after the inversion of the comparison result signal; and a storage unit that stores the code input signal at the time when the comparison result signal is inverted, and outputs the code input signal as a code output signal; and a pixel circuit that outputs a charge signal as the input signal to the comparison unit, the charge signal having been generated by receiving light entering a pixel and photoelectrically converting the light.

An electronic apparatus as a fifth aspect of the present disclosure includes a solid-state imaging device including: an AD converter including: a comparator including: a comparison unit that compares the voltage of an input signal with the voltage of a reference signal, and outputs a comparison result signal; a positive feedback circuit that increases the speed of transition at the time when the comparison result signal is inverted; and a current limiting unit that limits the current flowing in the comparison unit after the inversion of the comparison result signal; and a storage unit that stores the code input signal at the time when the comparison result signal is inverted, and outputs the code input signal as a code output signal; and a pixel circuit that outputs a charge signal as the input signal to the comparison unit, the charge signal having been generated by receiving light entering a pixel and photoelectrically converting the light.

In the fourth and fifth aspects of the present disclosure, the voltage of an input signal is compared with the voltage of a reference signal, and a comparison result signal is output. The speed of transition at the time when the comparison result signal is inverted is increased. After the inversion of the comparison result signal, the current flowing in the comparison unit is limited. The code input signal at the time when the comparison result signal is inverted is stored and output as a code output signal. At the pixel circuit, the charge signal generated by receiving light entering the pixel and photoelectrically converting the light is output as the input signal to the comparison unit.

The comparator, the AD converter, the solid-state imaging device, and the electronic apparatus may be independent devices, or may be modules to be incorporated into some other device.

Effects of the Invention

According to the first through fifth aspects of the present disclosure, power consumption can be reduced while the determination speed of the comparator is increased.

The effects of the present technology are not limited to the effects described herein, and may include any of the effects described in the present disclosure.

MODES FOR CARRYING OUT THE INVENTION

The following is a description of modes (hereinafter referred to as embodiments) for carrying out the present disclosure. Explanation will be made in the following order.

1. General Example Structure of a Solid-State Imaging Device
2. Specific Example Structure of the Comparator
3. First Embodiment of the ADC
4. Second Embodiment of the ADC
5. Third Embodiment of the ADC
6. Fourth Embodiment of the ADC
7. Fifth Embodiment of the ADC
8. First Embodiment of the Pixel Unit
9. Second Embodiment of the Pixel Unit
10. Third Embodiment of the Pixel Unit
11. Fourth Embodiment of the Pixel Unit
12. First Embodiment of Pixel Sharing
13. Second Embodiment of Pixel Sharing
14. Third Embodiment of Pixel Sharing
15. Fourth Embodiment of Pixel Sharing
16. Multiple Substrate Configuration 1
17. Multiple Substrate Configuration 2
18. Multiple Substrate Configuration 3
19. Fifth Embodiment of the Pixel Unit
20. Sixth Embodiment of the Pixel Unit
21. Example Structure of a Column ADC
22. Streaking Correction Calculation
23. Seventh Embodiment of the Pixel Unit
24. Latch Circuit Output Control
25. Example Application to an Electronic Apparatus <1. General Example Structure of a Solid-State Imaging Device>

Figure 1:
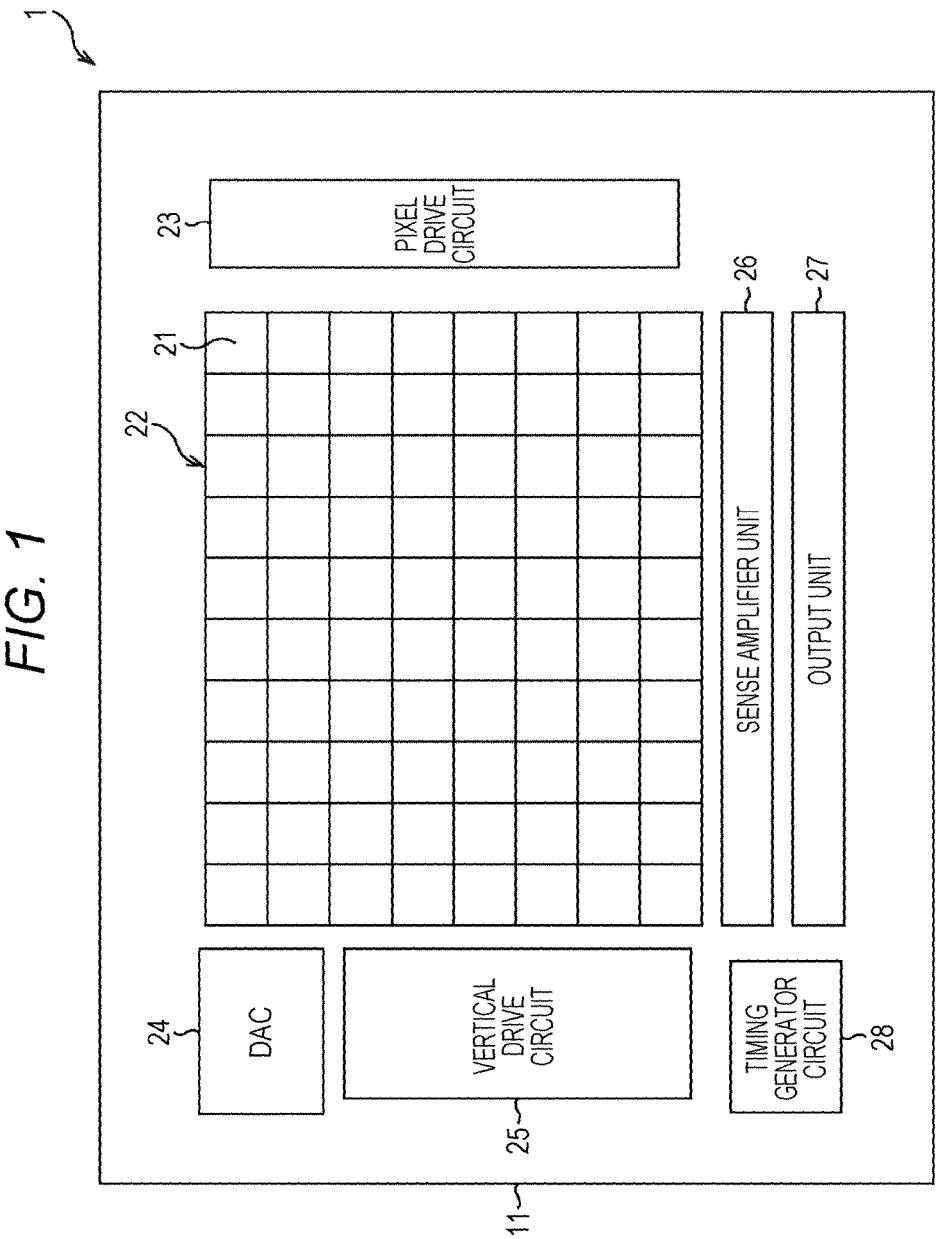
FIG. 1 is a diagram schematically showing the structure of a solid-state imaging device according to the present disclosure.

FIG. 1 schematically shows the structure of a solid-state imaging device according to the present disclosure.

The solid-state imaging device 1 in FIG. 1 includes a pixel array unit 22 in which pixels 21 are arranged in a two-dimensional array on a semiconductor substrate 11 made of silicon (Si) as a semiconductor. A pixel drive circuit 23, a D/A converter (DAC) 24, a vertical drive circuit 25, a sense amplifier unit 26, an output unit 27, and a timing generator circuit 28 are formed around the pixel array unit 22 on the semiconductor substrate 11.

Figure 2:
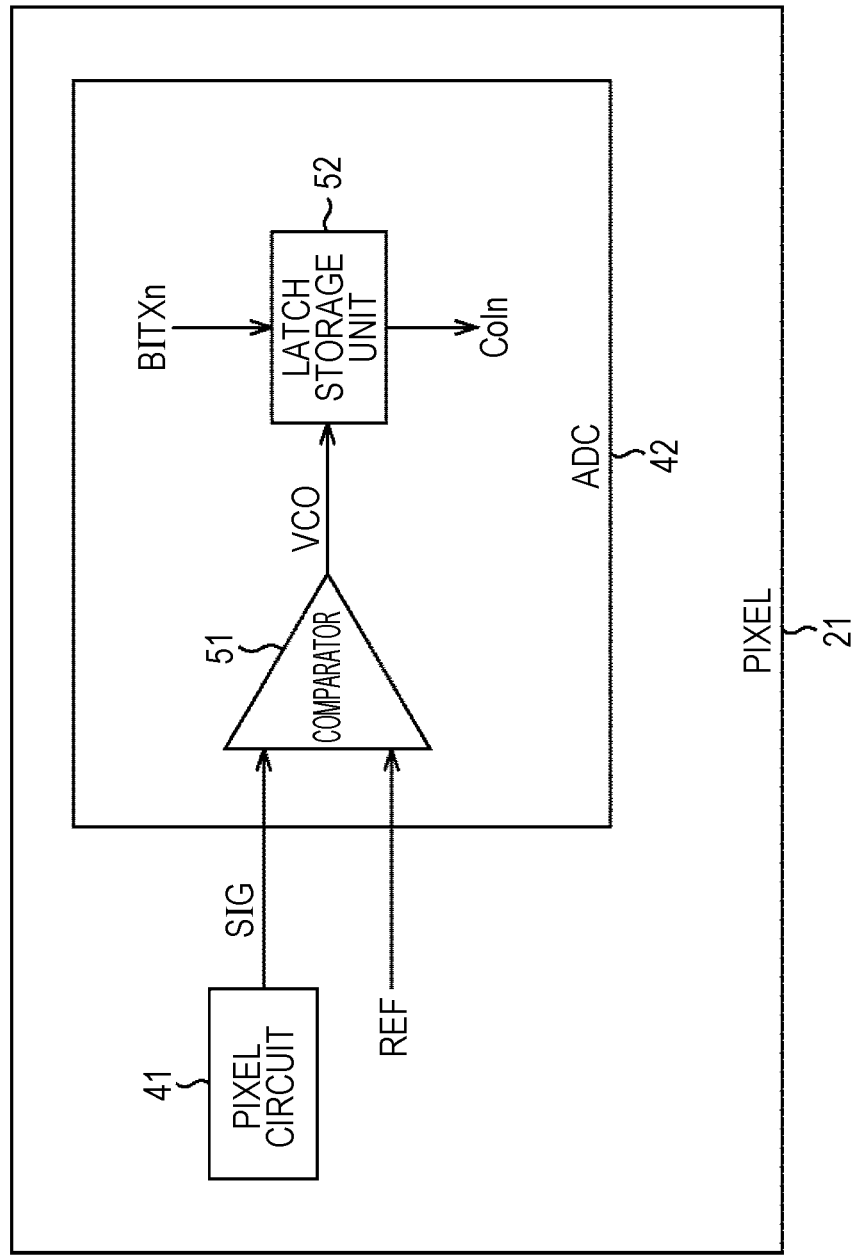
FIG. 2 is a block diagram showing an example structure of a pixel unit.

As shown in FIG. 2, each pixel 21 includes a pixel circuit 41 and an ADC 42. The pixel circuit 41 includes a photoelectric conversion unit that generates and stores a charge signal corresponding to an amount of received light, and outputs an analog pixel signal SIG obtained at the photoelectric conversion unit to the ADC 42. The ADC 42 converts the analog pixel signal SIG supplied from the pixel circuit 41 to a digital signal.

The AD converter (ADC) 42 includes a comparator 51 and a latch storage unit 52. The comparator 51 compares a reference signal REF supplied from the DAC 24 with the pixel signal SIG, and outputs an output signal VCO as the signal indicating the comparison result. When the reference signal REF and the pixel signal SIG become equal (in voltage), the comparator 51 inverts the output signal VCO.

A code value BITXn (n being an integer of 1 to N) indicating the current time is input as an input signal to the latch storage unit 52. The code value BITXn at the time when the output signal VCO of the comparator 51 is inverted is held in the latch storage unit 52, and is then read as an output signal Coln. As a result, a digital value obtained by digitizing the analog pixel signal SIG into an N-bit value is output from the ADC 42.

The pixel drive circuit 23 in FIG. 1 drives the pixel circuit 41 and the comparator 51 in each pixel 21. The DAC 24 generates the reference signal REF that is a slope signal having its level (voltage) monotonically decreasing with time, and supplies the reference signal REF to each pixel 21. The vertical drive circuit 25 outputs digital pixel signals SIG generated in the pixels 21 to the sense amplifier unit 26 in predetermined order based on timing signals supplied from the timing generator circuit 28. The digital pixel signals SIG output from the pixels 21 are amplified by the sense amplifier unit 26, and are then output from the output unit 27 to the outside of the solid-state imaging device 1. The output unit 27 performs predetermined digital signal processing such as a black level correction process to correct black levels and a correlated double sampling (CDS) process, and outputs the resultant signals to the outside.

The timing generator circuit 28 is formed with a timing generator or the like that generates various kinds of timing signals, and supplies the generated various timing signals to the pixel drive circuit 23, the DAC 24, the vertical drive circuit 25, and the like.

The solid-state imaging device 1 can have the above described structure. Although all the circuits constituting the solid-state imaging device 1 are formed on the single semiconductor substrate 11 in FIG. 1 as described above, the circuits constituting the solid-state imaging device 1 are formed on multiple semiconductor substrates 11 as will be described later.

<2. Specific Example Structure of the Comparator>

Figure 3:
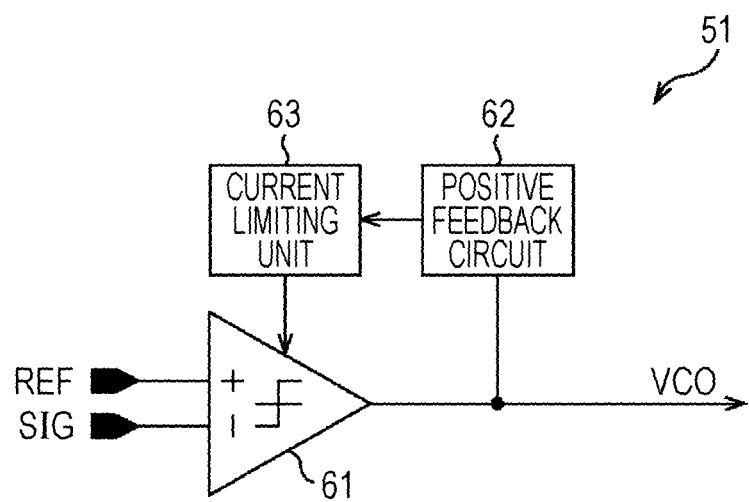
FIG. 3 is a block diagram showing a specific example structure of a comparator.

FIG. 3 is a block diagram showing a specific example structure of the comparator 51.

The comparator 51 includes a differential amplifier circuit 61, a positive feedback circuit (PFB) 62, and a current limiting unit 63.

Figure 4:
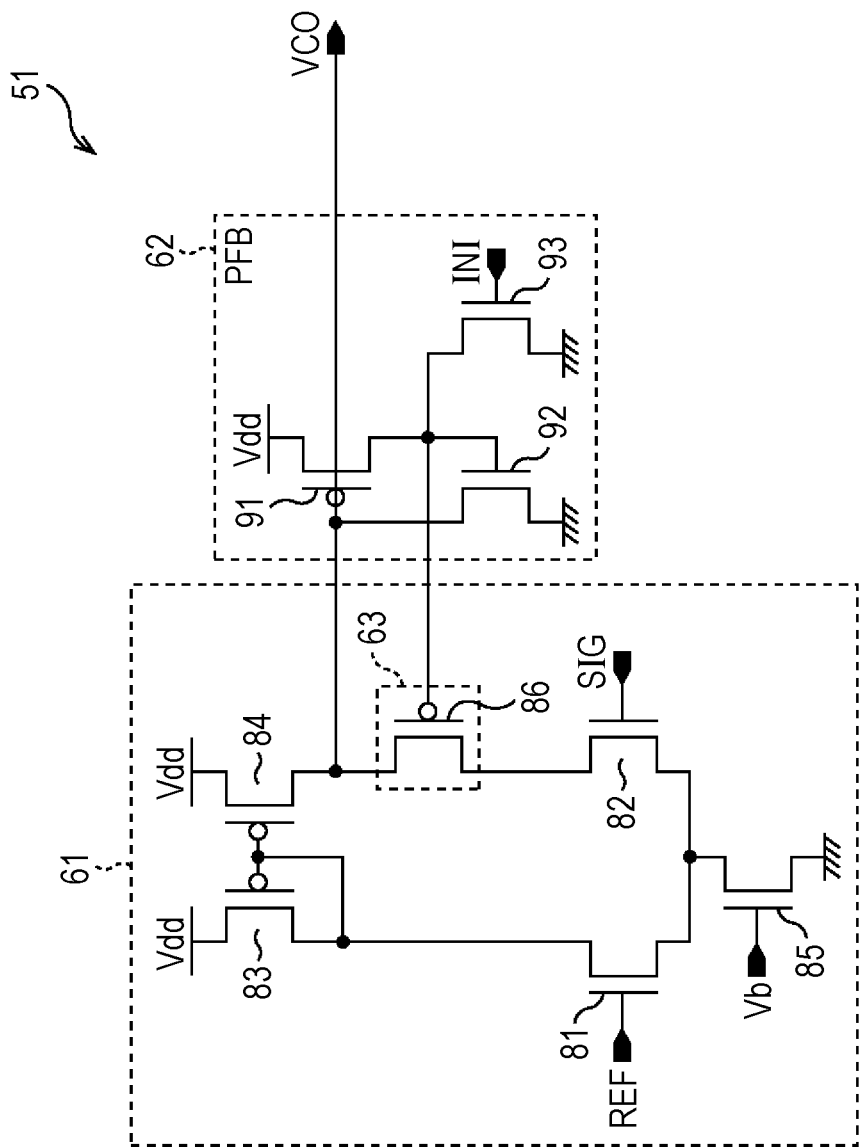
FIG. 4 is a circuit diagram of the comparator.

FIG. 4 is a circuit diagram showing the circuit structure of the differential amplifier circuit 61, the positive feedback circuit (PFB) 62, and the current limiting unit 63.

The differential amplifier circuit 61 includes transistors 81 and 82 as a differential pair, transistors 83 and 84 that form a current mirror, and a transistor 85 as a constant current source that supplies a current IB in accordance with an input bias current Vb. A transistor 86 serving as the current limiting unit 63 is connected between the transistors 82 and 84.

The transistors 81, 82, and 85 are formed with negative channel MOS (NMOS) transistors, and the transistors 83, 84, and 86 are formed with positive channel MOS (PMOS) transistors.

As for the transistors 81 and 82 forming a differential pair, the reference signal REF output from the DAC 24 is input to the gate of the transistor 81, and a pixel signal SIG output from the pixel circuit 41 in the pixel 21 is input to the gate of the transistor 82. The sources of the transistors 81 and 82 are connected to the drain of the transistor 85, and the source of the transistor 85 is connected to GND.

The drain of the transistor 81 is connected to the gates of the transistors 83 and 84, which form the current mirror circuit, and to the drain of the transistor 83. The drain of the transistor 82 is connected to the drain of the transistor 86 as the current limiting unit 63. The sources of the transistors 83 and 84 are connected to a power supply voltage Vdd.

The source of the transistor 86 as the current limiting unit 63 is connected to the drain of the transistor 84 forming the current mirror circuit, and the gate of the transistor 86 is connected to a predetermined connecting point in the positive feedback circuit 62.

The positive feedback circuit 62 is formed with three transistors 91 through 93. Here, the transistor 91 is formed with a PMOS transistor, and the transistors 92 and 93 are formed with NMOS transistors.

The connecting point between the drain of the transistor 84 and the source of the transistor 86 serves as the output end of the differential amplifier circuit 61, and is connected to the gate of the transistor 91 and the drain of the transistor 92 in the positive feedback circuit 62. An output signal VCO output from the differential amplifier circuit 61 is output to the latch storage unit 52 (FIG. 2) in the stage after the comparator 51, and is also output to the gate of the transistor 91 in the positive feedback circuit 62.

The source of the transistor 91 is connected to the power supply voltage Vdd, and the drain of the transistor 91 is connected to the gate of the transistor 92, the drain of the transistor 93, and the gate of the transistor 86 as the current limiting unit 63. The sources of the transistors 92 and 93 are connected to GND.

Operation of the comparator 51 having the above structure is now described.

The differential amplifier circuit 61 compares the reference signal REF input to the gate of the transistor 81 with a pixel signal SIG input to the gate of the transistor 82. When the reference signal REF and the pixel signal SIG become equal (in voltage), the differential amplifier circuit 61 inverts the output signal VCO from Hi to Low.

In a case where the output signal VCO is inverted from Hi to Low, the transistor 91 of the positive feedback circuit 62 is turned on, and a drain voltage is generated. Since the drain of the transistor 91 is connected to the gate of the transistor 92, the transistor 92 is turned on. As the transistor 92 is turned on, the gate of the transistor 91 and the output end of the comparator 51 are connected to GND, and accordingly, the output signal VCO is rapidly lowered to GND. With this, the transistor 91 enters a more intensive on-state, and, at the same time, the transistor 92 enters a more intensive on-state.

Figure 5:
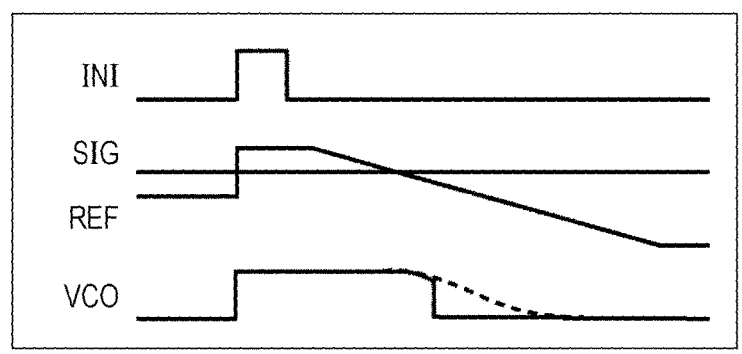
FIG. 5 is a diagram showing input/output signals of the comparator.

FIG. 5 is a diagram showing signals that are input to the comparator 51, and signals that are output from the comparator 51.

If the positive feedback circuit 62 is not provided in the comparator 51, the output signal VCO is slowly inverted as indicated by a dashed line in FIG. 5, and therefore, it takes time to detect the output inversion.

As the positive feedback circuit 62 is provided, on the other hand, the output signal VCO is rapidly lowered to GND as described above and as indicated by a solid line in FIG. 5, and the transition speed of the output signal VCO is increased. As a result, the determination speed of the comparator 51 can be increased.

In the positive feedback circuit 62, once turned on, the transistors 91 and 92 are not returned to the original state. As shown in FIG. 5, the transistor 93 is turned on with an initialization signal INI in the first stage of the comparing operation, so that the positive feedback circuit 62 is put into the initialization state.

The functions of the current limiting unit 63 are now described.

If the transistor 86 as the current limiting unit 63 is not provided, the very large current that flows from the transistor 84 of the differential amplifier circuit 61 to the transistor 92 of the positive feedback circuit 62 and increases the speed of the output signal VCO remains flowing.

On the other hand, as the transistor 86 is inserted as the current limiting unit 63 between the transistors 82 and 84 in the differential amplifier circuit 61, the very large current that flows from the transistor 84 of the differential amplifier circuit 61 to the transistor 92 of the positive feedback circuit 62 is limited after the inversion of the output signal VCO. The size of the limited current is determined by the current flowing in the transistors 83 and 84 of the current mirror of the differential amplifier circuit 61. The current flowing in the transistors 83 and 84 of the current mirror is determined by the input bias current Vb of the transistor 85 as the constant current source, and thus becomes a current IB flowing in the transistor 85.

If the reference signal REF is first larger than the pixel signal SIG in an operation of the comparator 51, the current IB limited by the input bias current Vb flows. When the reference signal REF and the pixel signal SIG become equal, a very large current momentarily flows in the comparator 51, and the speed of inversion of the output signal VCO is increased. After the output signal VCO is inverted, the current IB limited by the input bias current Vb and its mirror current IB flow in the comparator 51. As the current limiting unit 63 is provided, the current flowing in the comparator 51 is restricted to twice the initial current IB after comparison, so that power consumption is restrained.

That is, with the comparator 51 provided in the pixel 21 of the solid-state imaging device 1, power consumption can be reduced while the determination speed of the comparator 51 is increased.

<3. First Embodiment of the ADC>

Figure 6:
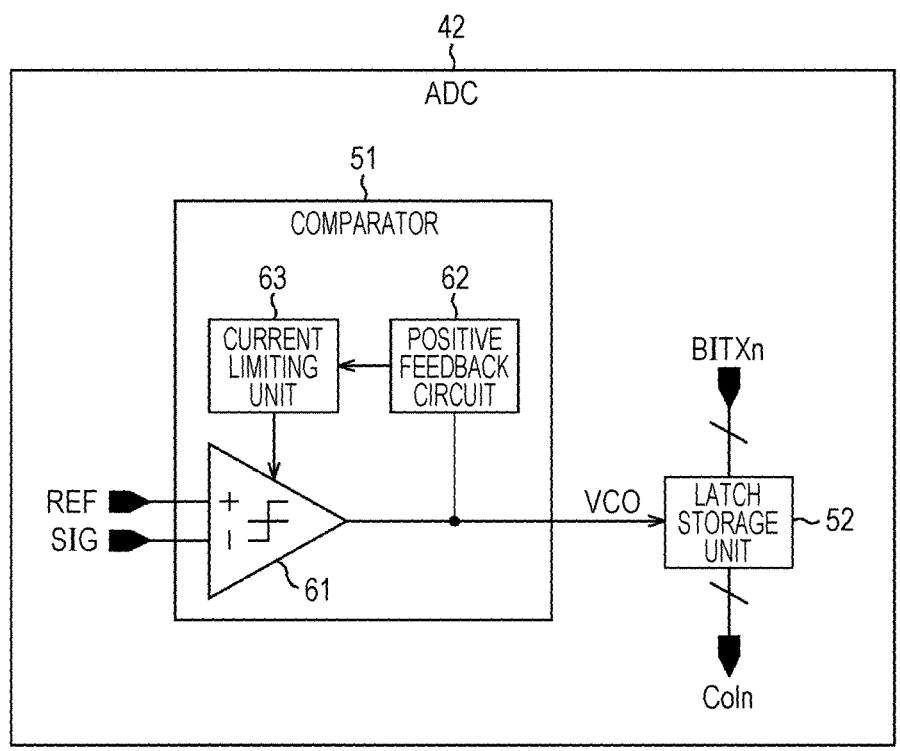
FIG. 6 is a block diagram showing a first embodiment of the ADC.

FIG. 6 is a block diagram showing a first embodiment of the ADC 42, and shows an example structure of the entire ADC 42 in which the latch storage unit 52 is added to the specific structure of the comparator 51 shown in FIG. 3.

Figure 7:
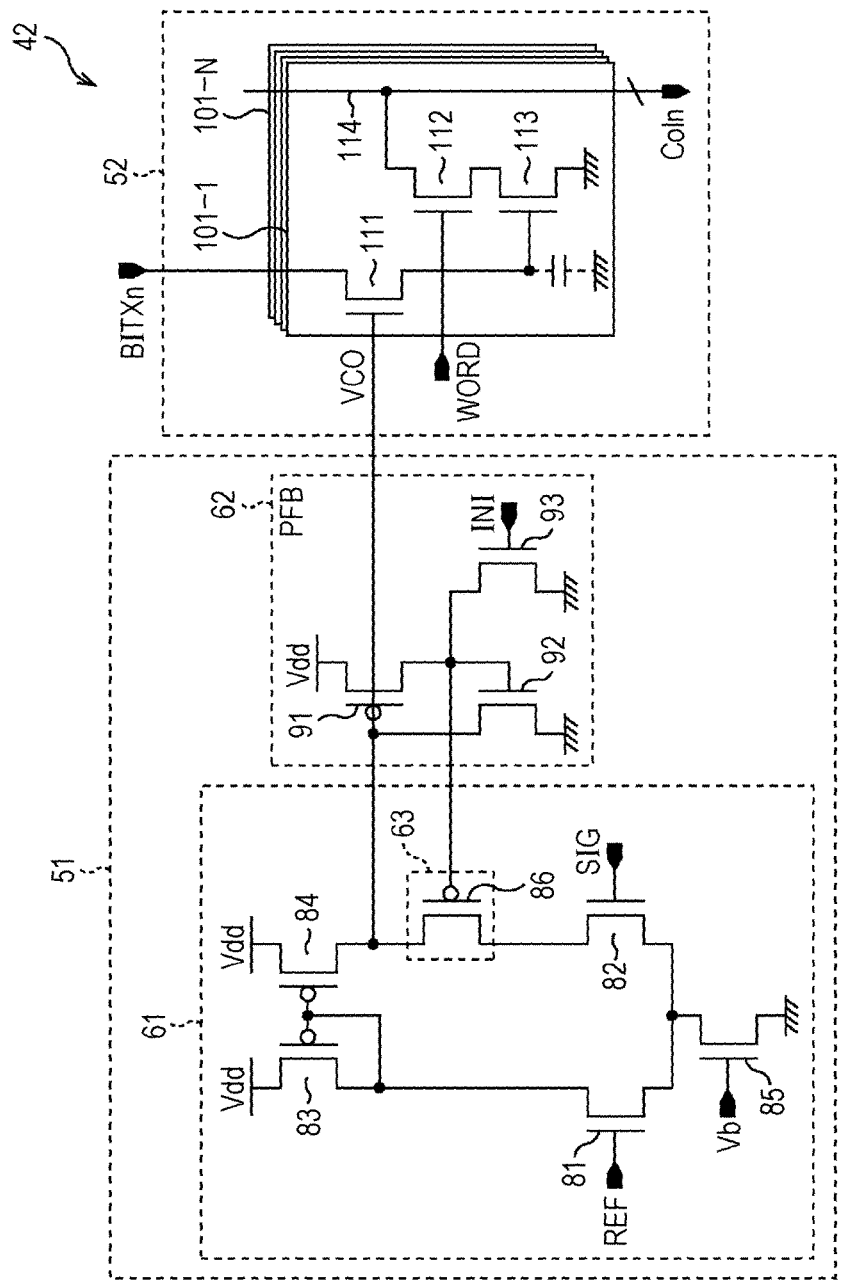
FIG. 7 is a circuit diagram of the first embodiment of the ADC.

FIG. 7 is a circuit diagram of the entire ADC 42 in which the circuit structure of the latch storage unit 52 is added to the circuit diagram of the comparator 51 shown in FIG. 4.

Figure 8:
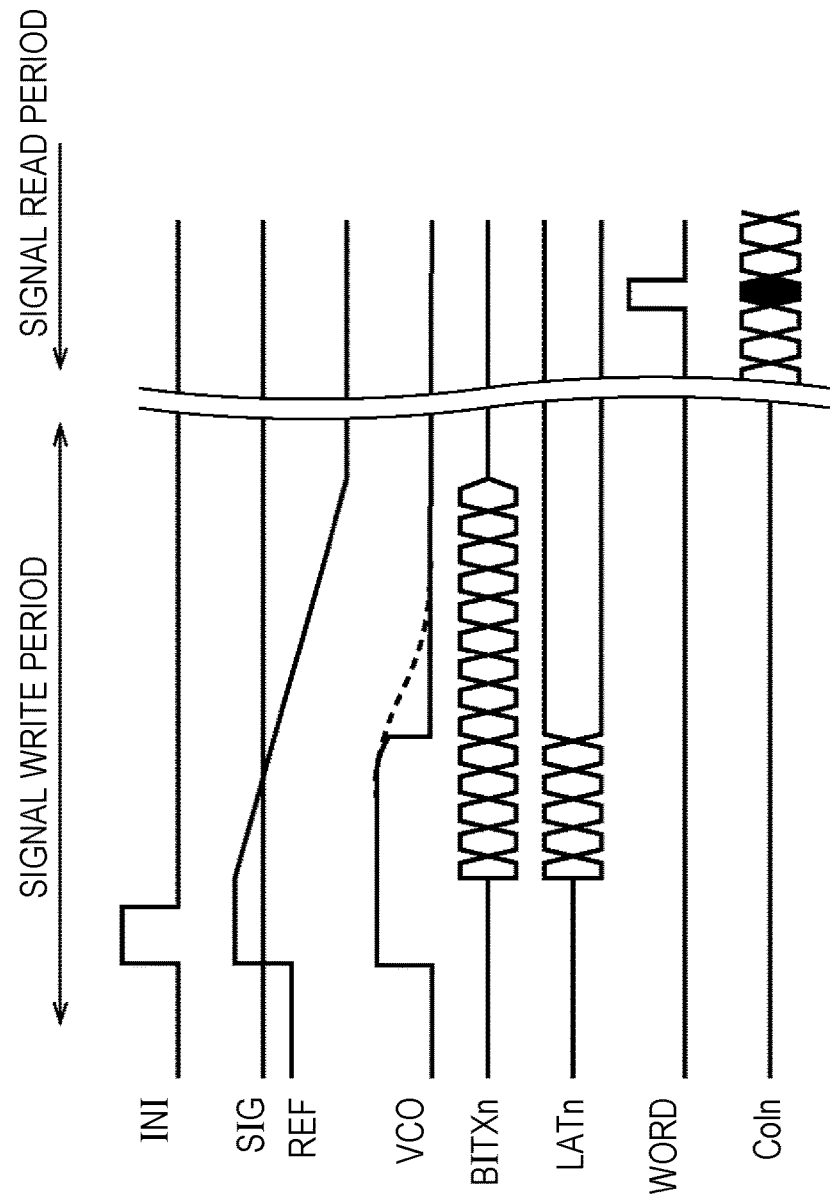
FIG. 8 is a diagram for explaining operation and control of the entire ADC 42.

FIG. 8 shows the signals indicating operation and control of the entire ADC 42, including signals indicating operation and control of the latch storage unit 52 as well as the input/output signals of the comparator 51 shown in FIG. 5.

In the description of FIG. 6 and the later drawings, the components corresponding to the components already described are denoted by the same reference numerals as those used for the already described components, and explanation of them will be skipped as appropriate.

In the latch storage unit 52, N latch circuits (data storage units) 101-1 through 101-N are provided for the N bits corresponding to the number of AD conversion bits, as shown in the circuit diagram in FIG. 7. In the description below, the N latch circuits 101-1 through 101-N will be written simply as the latch circuits 101, unless there is a need to distinguish them from one another.

An output signal VCO of the comparator 51 is input to the gates of transistors 111 of the N latch circuits 101-1 through 101-N.

A code input signal (a code value) BITXn of 0 or 1 indicating the current time is input to the drain of the transistor 111 of the latch circuit 101-$n$ of the nth bit. The code input signal BITXn is a bit signal such as a gray code. The latch circuit 101-$n$ stores data LATn at the time when the output signal VCO of the comparator 51 input to the gate of the transistor 111 is inverted.

A read control signal WORD is input to the gate of a transistor 112 of the latch circuit 101-$n$ of the nth bit. When the time to read the latch circuit 101-$n$ of the nth bit comes, the control signal WORD becomes Hi as shown in FIG. 8, and a latch signal (a code output signal) Coln of the nth bit is output from a latch signal output line 114.

As the latch storage unit 52 has the above described structure, the ADC 42 can operate as an integral AD converter.

In the above described example, the output signal VCO is driven with a one-time slope signal (reference signal REF), and is input simultaneously to the N latch circuits 101-1 through 101-N of the N bits, which perform processing in parallel. However, a slope signal may be input to one latch circuit 101 N times, so that N bits can be subjected to AD conversion. In this case, the code input signal BITXn is a different signal every time.

<Example Case where the Code Input Signal BITXn is a Multilevel Signal>

Although the code input signal BITXn is a binary signal (voltage) of 0 or 1 in the above described example, the code input signal BITXn may be a multilevel signal with three or more levels.

Figure 9:
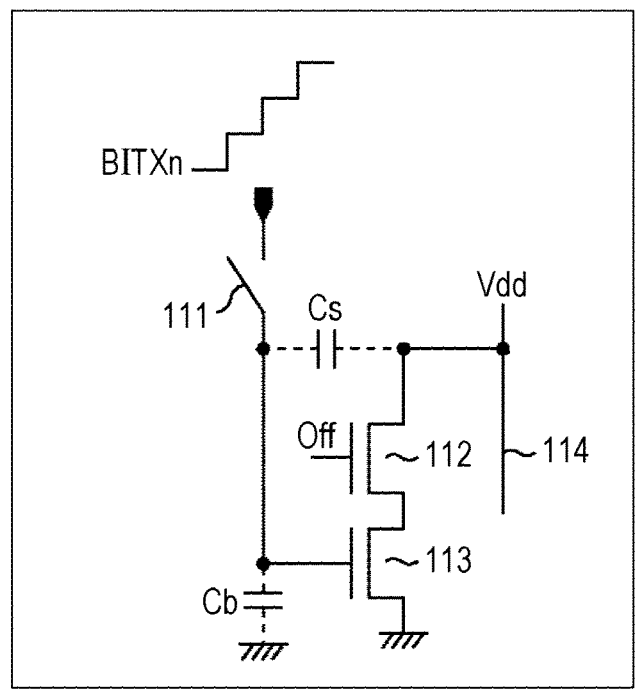
FIG. 9 is a diagram for explaining a case where a code input signal is a multilevel signal.
Figure 10:
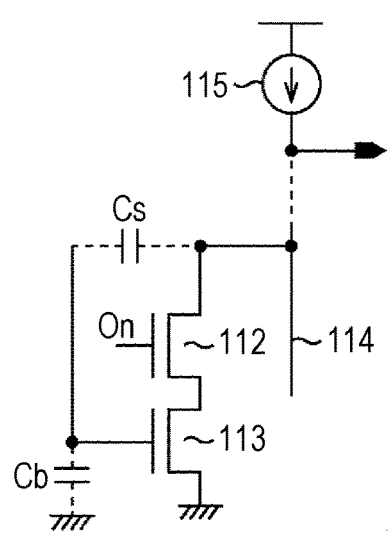
FIG. 10 is a diagram for explaining a case where a code input signal is a multilevel signal.

FIG. 9 is a circuit diagram showing a state where the latch circuit 101-$n$ stores data, which is a state after the output signal VCO is inverted. FIG. 10 is a circuit diagram of the latch circuit 101-$n$ in a state where the control signal WORD is Hi, and stored data is being read. Here, an example where the power supply voltage Vdd is supplied to the latch signal output line 114 in the initial state, and a four-level signal is input as the code input signal BITXn as shown in FIG. 9 is described.

Where Vin represents the gate voltage of a transistor 113 in the data storing state shown in FIG. 9, the amount Q of the total charge stored in parasitic capacitances Cs and Cb generated in the latch circuit 101 can be expressed as $Q=Vi*Cb+(Vi-Vdd)*Cs$.

Figure 11:
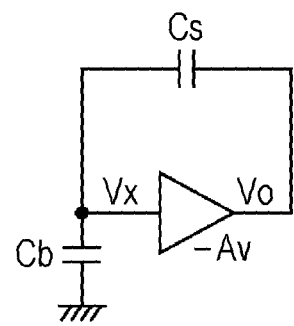
FIG. 11 is a diagram for explaining a case where a code input signal is a multilevel signal.

When the control signal WORD is Hi, and the stored data is being read, the latch circuit 101 is connected to the current source 115 via the latch signal output line 114 as shown in FIG. 10, and the latch circuit 101 operates as an operational amplifier and subjects the gate of the transistor 113 to feedback as shown in FIG. 11.

Where Vx represents the gate voltage of the transistor 113, Vo represents the signal (voltage) output from the latch signal output line 114, and Av represents the gain in the state where the latch circuit 101 operates as an operational amplifier, the amount Q of the total charge stored in the parasitic capacitances Cs and Cb can be expressed as $Q=Vx*Cb+(Vx-Vo)*Cs$, and the output voltage Vo can be expressed as $Vo=-Av*Vx$.

Figure 12:
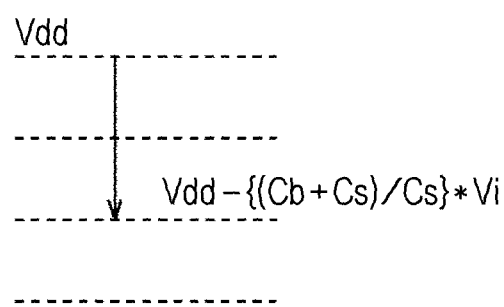
FIG. 12 is a diagram for explaining a case where a code input signal is a multilevel signal.

When Vo is calculated according to the relational expressions, $Q=Vx*Cb+(Vx-Vo)*Cs$ and $Vo=-Av*Vx$, Vo can be expressed as $Vo=\{Cs*Vdd-(Cs+Cb)*Vi\}/\{(Cb+Cs)/Av+Cs\}$. If the gain Av is infinite, Vo is expressed as $Vo=Vdd-\{(Cb+Cs)/Cs\}*Vi$, and accordingly, the output voltage Vo becomes a four-level value corresponding to an input voltage Vin based on the initial voltage Vdd, as shown in FIG. 12.

As the code input signal BITXn to be input to each latch circuit 101 is a multilevel signal as described above, the total number of latch circuits 101 can be reduced, and the circuit area of the ADC 42 can be reduced.

<4. Second Embodiment of the ADC>

Figure 13:
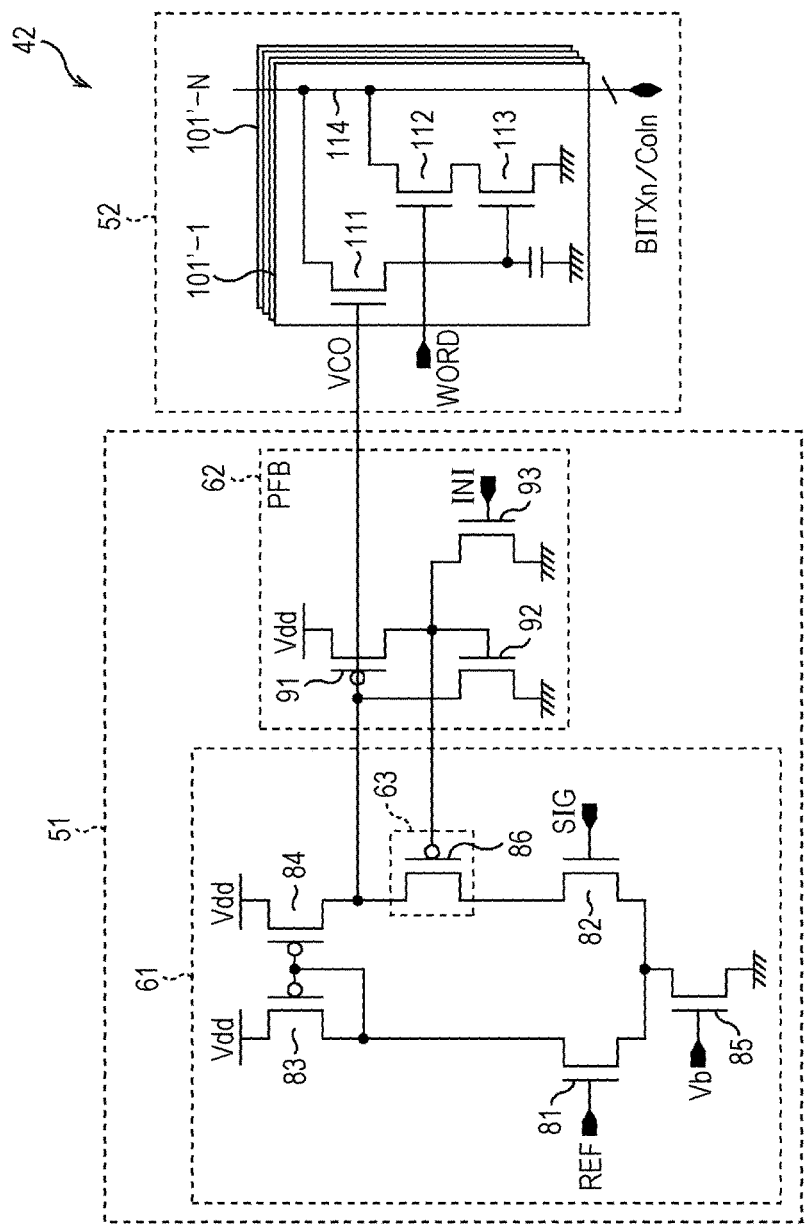
FIG. 13 is a circuit diagram showing a second embodiment of the ADC.

FIG. 13 is a circuit diagram showing a second embodiment of the ADC 42.

In the second embodiment of the ADC 42 shown in FIG. 13, the latch circuits 101-1 through 101-N in the latch storage unit 52 are changed to latch circuits 101'-1 through 101'-N, and the other aspects are the same as those of the first embodiment.

In each latch circuit 101 of the first embodiment, the input line for inputting the code input signal BITXn and the output line for outputting the latch signal Coln are provided independently of each other. In each latch circuit 101' of the second embodiment, on the other hand, the input line and the output line are integrated.

That is, the drain of the transistor 111 to which the output signal VCO is input is connected to the latch signal output line 114 to which the drain of the transistor 112 having the control signal WORD to be input thereto is also connected.

Figure 14:
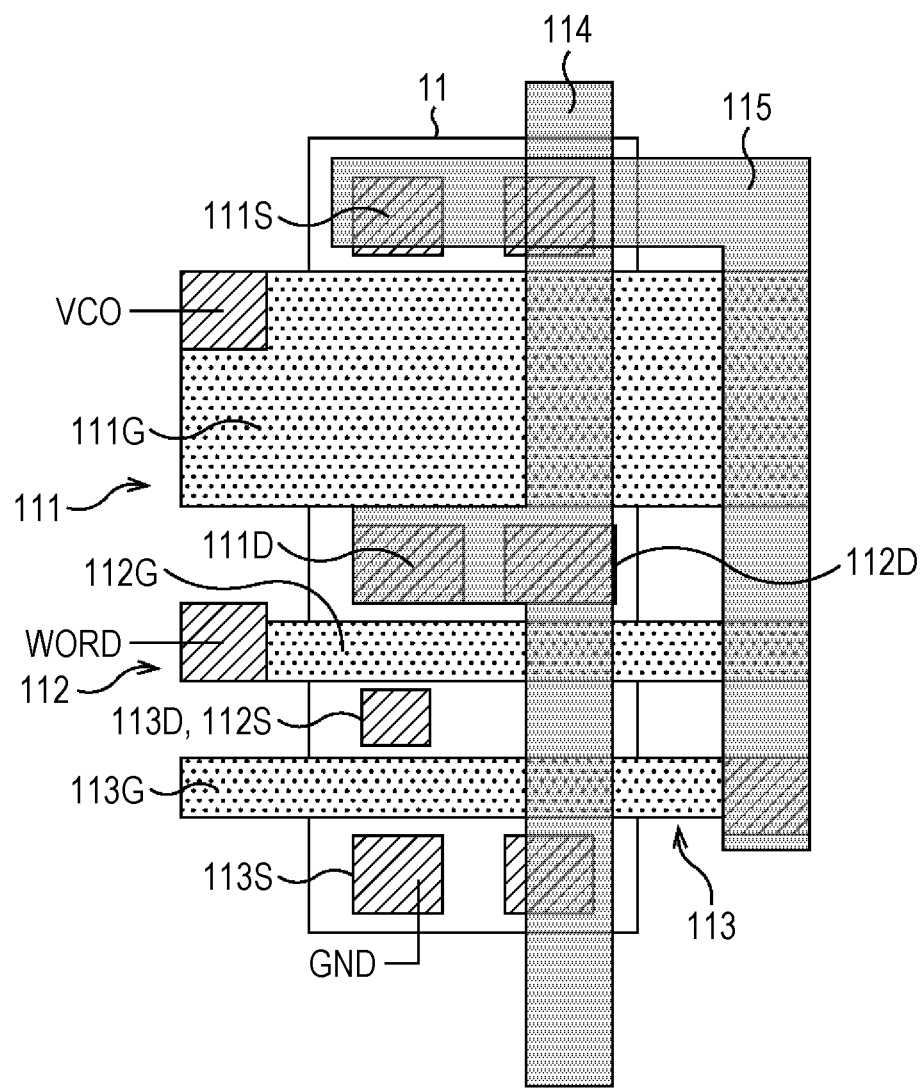
FIG. 14 is a diagram showing an example layout of the latch circuit of the ADC according to the second embodiment.

FIG. 14 is a diagram showing an example layout in a case where each latch circuit 101' of the second embodiment is formed on the semiconductor substrate 11.

FIG. 14 shows the gate 111G, the source 111S, and the drain 111D of the transistor 111, the gate 112G, the source 112S, and the drain 112D of the transistor 112, and the gate 113G, the source 113S, and the drain 113D of the transistor 113.

As shown in FIG. 14, the drain 111D of the transistor 111 and the drain 112D of the transistor 112 are both connected to the latch signal output line 114. The source 111S of the transistor 111 and the gain 113G of the transistor 113 are connected by an interconnecting line 116.

The drain region and the source region formed in the semiconductor substrate 11 are formed with a diffusion layer (impurity regions).

As described above, the drain 111D of the transistor 111 and the drain 112D of the transistor 112 are integrated and connected to the single latch signal output line 114. Consequently, the number of interconnecting lines can be reduced, and the parasitic capacitance between adjacent components can be reduced. Thus, the load is reduced, and a high-speed operation and an area reduction can be realized.

<5. Third Embodiment of the ADC>

Figure 15:
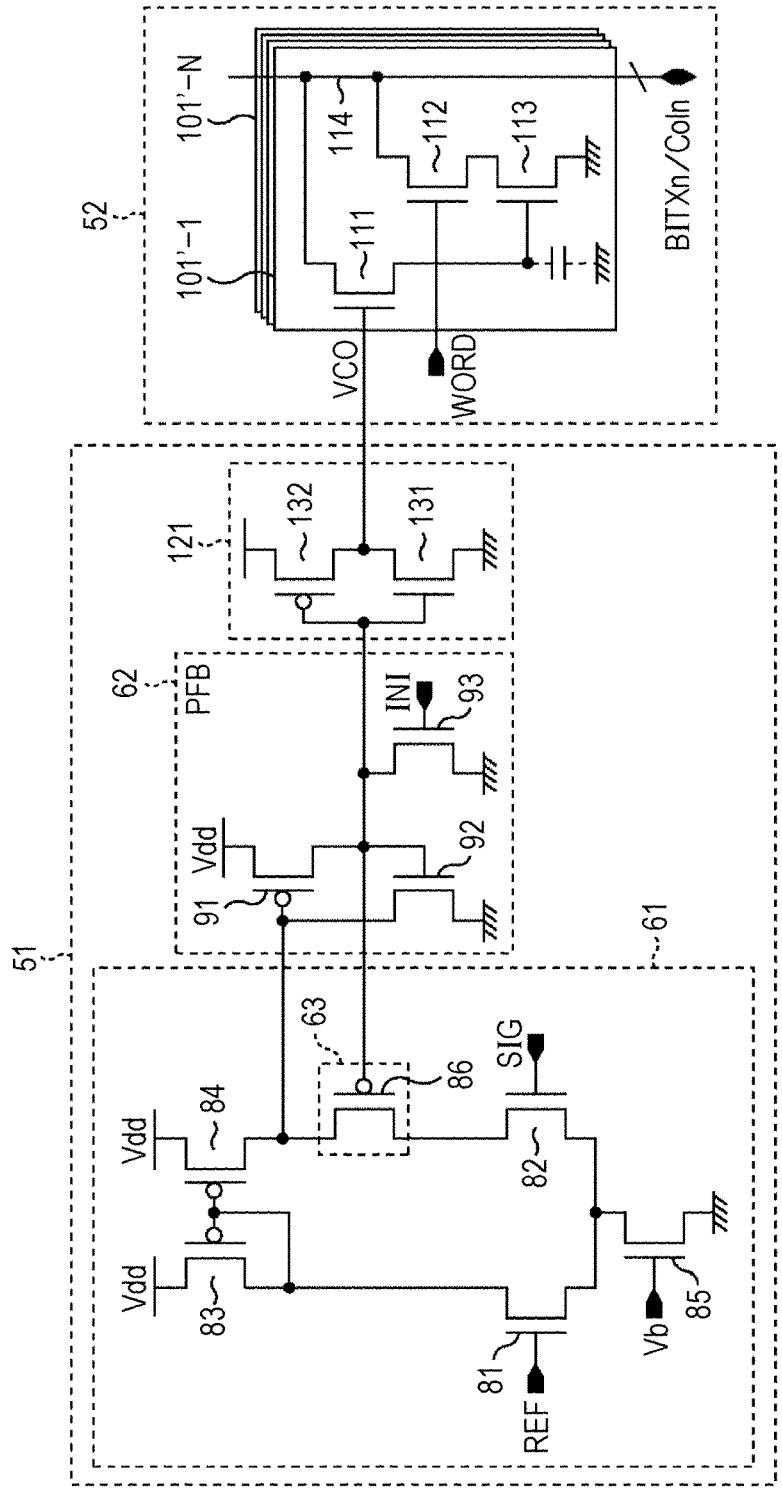
FIG. 15 is a circuit diagram showing a third embodiment of the ADC.

FIG. 15 is a circuit diagram showing a third embodiment of the ADC 42.

The third embodiment of the ADC 42 differs from the second embodiment shown in FIG. 13 in that an inverter 121 formed with an NMOS transistor 131 and a PMOS transistor 132 is further provided in a stage after the positive feedback circuit 62 in the comparator 51.

Since the output signal VCO of the comparator 51 is a signal inverted by the inverter 121, the input of the inverter 121 is connected not to the gate of the transistor 91 of the positive feedback circuit 62 but to the drain of the transistor 91. That is, in the third embodiment, a signal obtained by inverting the output signal VCO of the positive feedback circuit 62 of the second embodiment is the input signal of the inverter 121.

Since the code input signal BITXn to be written into the latch circuit 101' is a signal that transits at high speed, the code input signal BITXn sways the output of the comparator 51 via the parasitic capacitance between the gate and the drain of the transistor 111, if the transistor 111 of the latch circuit 101' and the transistor 91 of the positive feedback circuit 62 are connected directly to each other.

In view of this, the inverter 121 is interposed as shown in FIG. 15, so that the influence of the code input signal BITXn can be reduced.

<6. Fourth Embodiment of the ADC>

Figure 16:
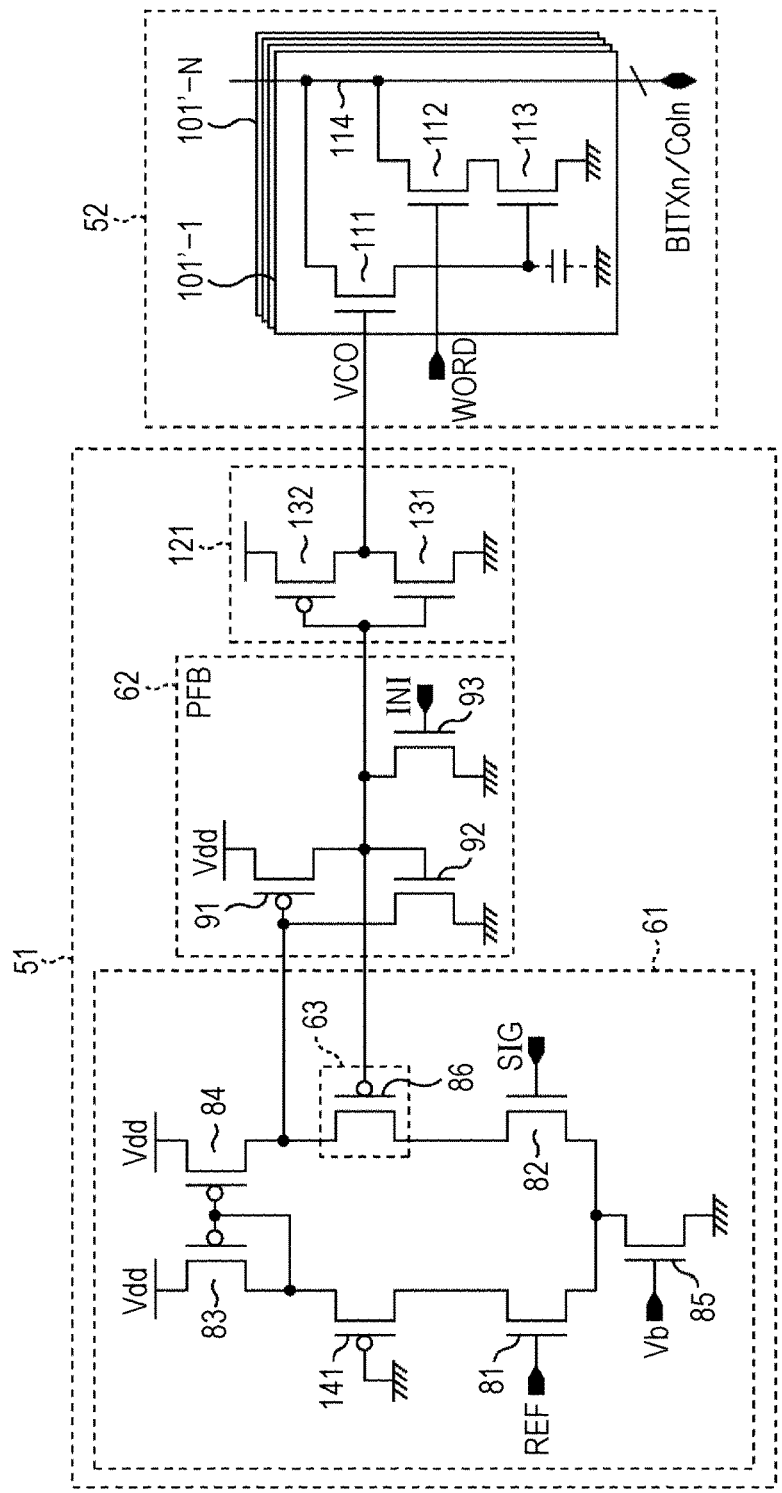
FIG. 16 is a circuit diagram showing a fourth embodiment of the ADC.

FIG. 16 is a circuit diagram showing a fourth embodiment of the ADC 42.

In the fourth embodiment of the ADC 42, a transistor 141 of the same type (PMOS) as the transistor 86 forming the current limiting unit 63 is further provided in a position symmetrical to the transistor 86 forming the current limiting unit 63, or between the drain of the transistor 81 to which the reference signal REF is input and the drain of the transistor 83 of the current mirror in the differential amplifier circuit 61 in the comparator 51. The gate of the transistor 141 is connected to GND.

In the first through third embodiments described above, the transistor 86 exists only at one side (right side) in the differential amplifier circuit 61, and therefore, the characteristics might differ between the right side and the left side. In view of this, the transistor 141 of the same type (PMOS) as the transistor 86 serving as the current limiting unit 63 is provided as a dummy transistor, so that generation of any difference in characteristics can be prevented.

<7. Fifth Embodiment of the ADC>

Figure 17:
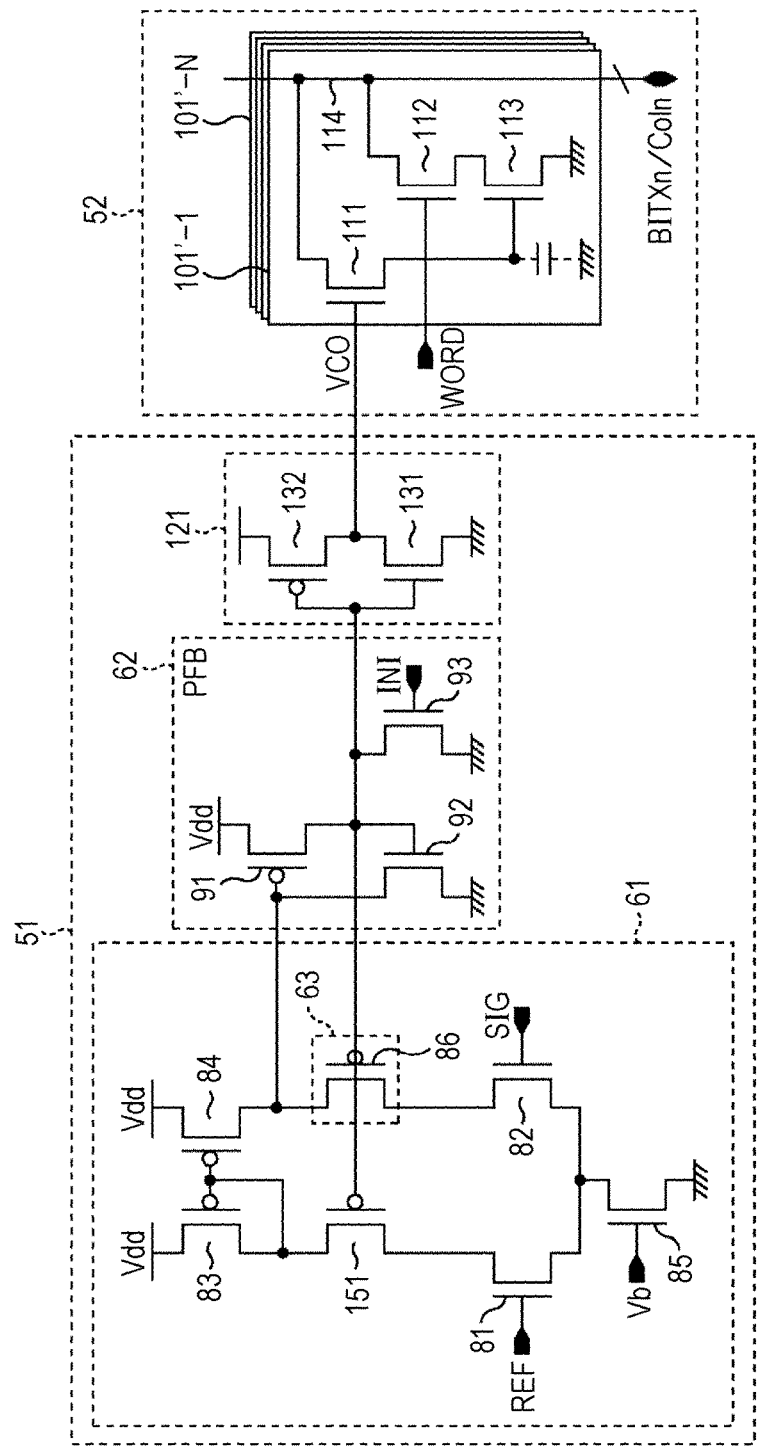
FIG. 17 is a circuit diagram showing a fifth embodiment of the ADC.

FIG. 17 is a circuit diagram showing a fifth embodiment of the ADC 42.

In the fifth embodiment of the ADC 42, a transistor 151 of the same type (PMOS) as the transistor 86 as the current limiting unit 63 is provided as a dummy transistor in a position symmetrical to the transistor 86 forming the current limiting unit 63 in the differential amplifier circuit 61 in the comparator 51, as in the fourth embodiment.

The transistor 151 of the fifth embodiment differs from the transistor 141 of the fourth embodiment in that the gate of the transistor 151 is connected to the connecting point to which the gate of the transistor 86 as the current limiting unit 63 is also connected, and is controlled in the same manner as the transistor 86. Consequently, not only the circuit structure but also the operation of the transistor 151 can be the same as the transistor 86.

<Comparator Off Control at a Time of Signal Reading>

The operation of the ADC 42 is divided into a signal write period during which the reference signal REF is compared with the pixel signal SIG, and the data LATn at a time when the reference signal REF and the pixel signal SIG become equal to each other is written into the latch storage unit 52 based on the code input signal BITXn, and a signal read period during which the data LATn stored in the latch storage unit 52 is output as the latch signal Coln, as shown in FIG. 8.

After inversion of the output signal VCO, a current that is twice the initial current IB flows in the comparator 51 as described above. However, this current is unnecessary during the signal read period.

When the signal write period ends and the signal read period starts, the voltage of the reference signal REF to be supplied to the gate of the transistor 81 of the comparator 51 can be controlled to drop to the level at which the transistor 81 is turned off (the level being the standby voltage $V_{stb}$ described later with reference to FIG. 19). Consequently, the current flowing in the left side of the differential amplifier circuit 61 becomes zero, and the current flowing in the right side that reflects the current in the left side also becomes zero. As a result, any stationary current does not flow in the transistor 92 of the positive feedback circuit 62. Thus, except for leakage, the current consumed during the signal read period can be made zero, and power consumption can be further reduced.

<Specific Example Structures of Pixel Units>

<8. First Embodiment of the Pixel Unit>

Figure 18:
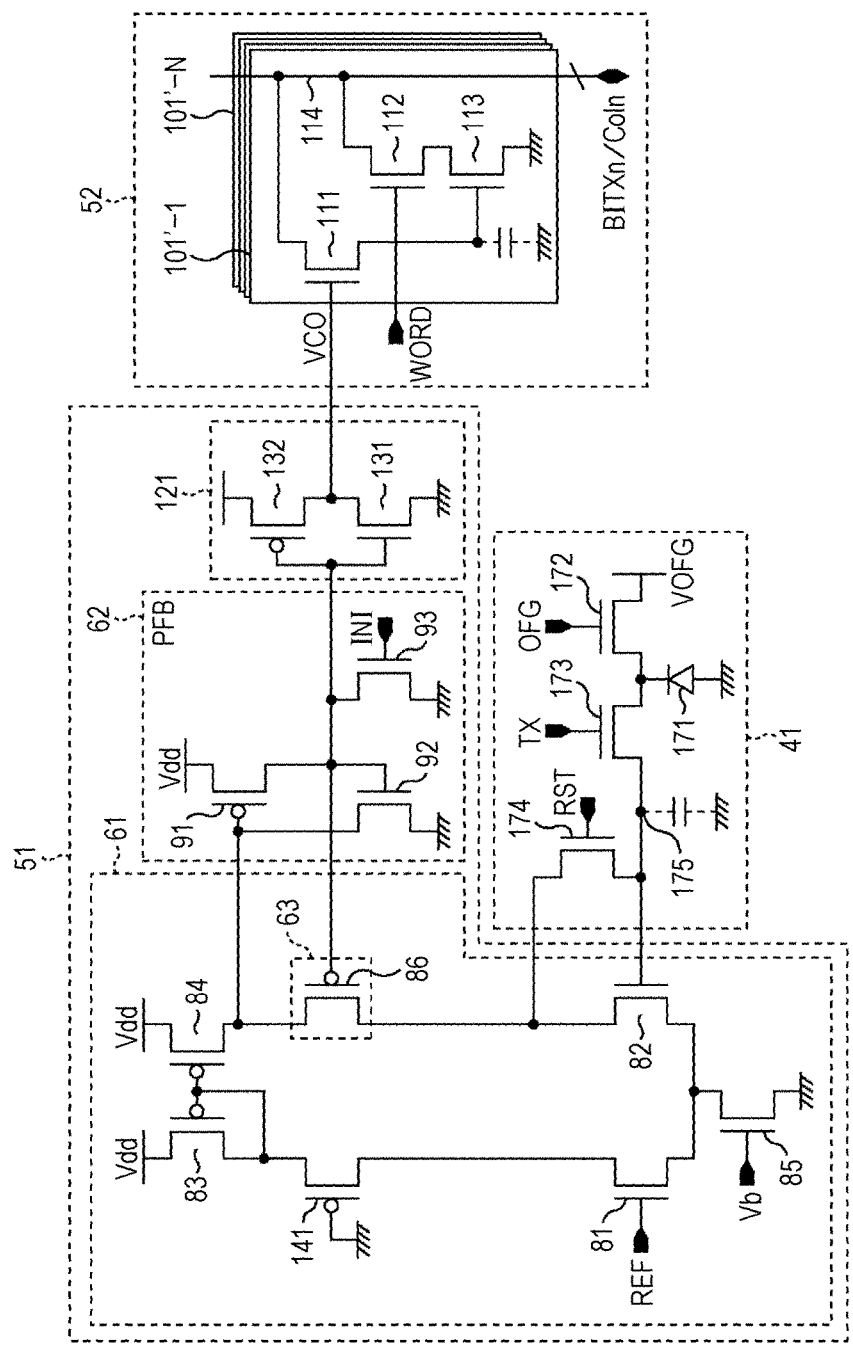
FIG. 18 is a circuit diagram showing a first embodiment of a pixel.

FIG. 18 is a circuit diagram showing a first embodiment of the pixel 21, in which the details of the pixel circuit 41 is added to the circuit of the ADC 42 according to the fifth embodiment shown in FIG. 16.

The circuit structure of the comparator 51 is the circuit structure shown in FIG. 16, but may be some other circuit structure.

The pixel circuit 41 includes a photodiode (PD) 171 as a photoelectric conversion unit, a discharge transistor 172, a transfer transistor 173, a reset transistor 174, and an FD (floating diffusion layer) 175.

The discharge transistor 172 is used when the exposure period is adjusted. Specifically, the discharge transistor 172 is turned on when the exposure period is to be started at a desired time. Consequently, the charge stored in the photodiode 171 so far is discharged. Therefore, the exposure period starts after the discharge transistor 172 is turned off.

The transfer transistor 173 transfers the charge generated at the photodiode 171, to the FD 175. The reset transistor 174 resets the charge held in the FD 175. The FD 175 is connected to the gate of the transistor 82 of the differential amplifier circuit 61. With this, the transistor 82 of the differential amplifier circuit 61 also functions as an amplification transistor of the pixel circuit 41.

The source of the reset transistor 174 is connected to the gate of the transistor 82 of the differential amplifier circuit 61 and the FD 175, and the drain of the reset transistor 174 is connected to the drain of the transistor 82. In this structure, there is no fixed reset voltage for resetting the charge in the FD 175. This is because a reset voltage for resetting the FD 175 can be arbitrarily set with the reference signal REF by controlling the circuit state of the differential amplifier circuit 61.

<Pixel Unit Timing Chart>

Figure 19:
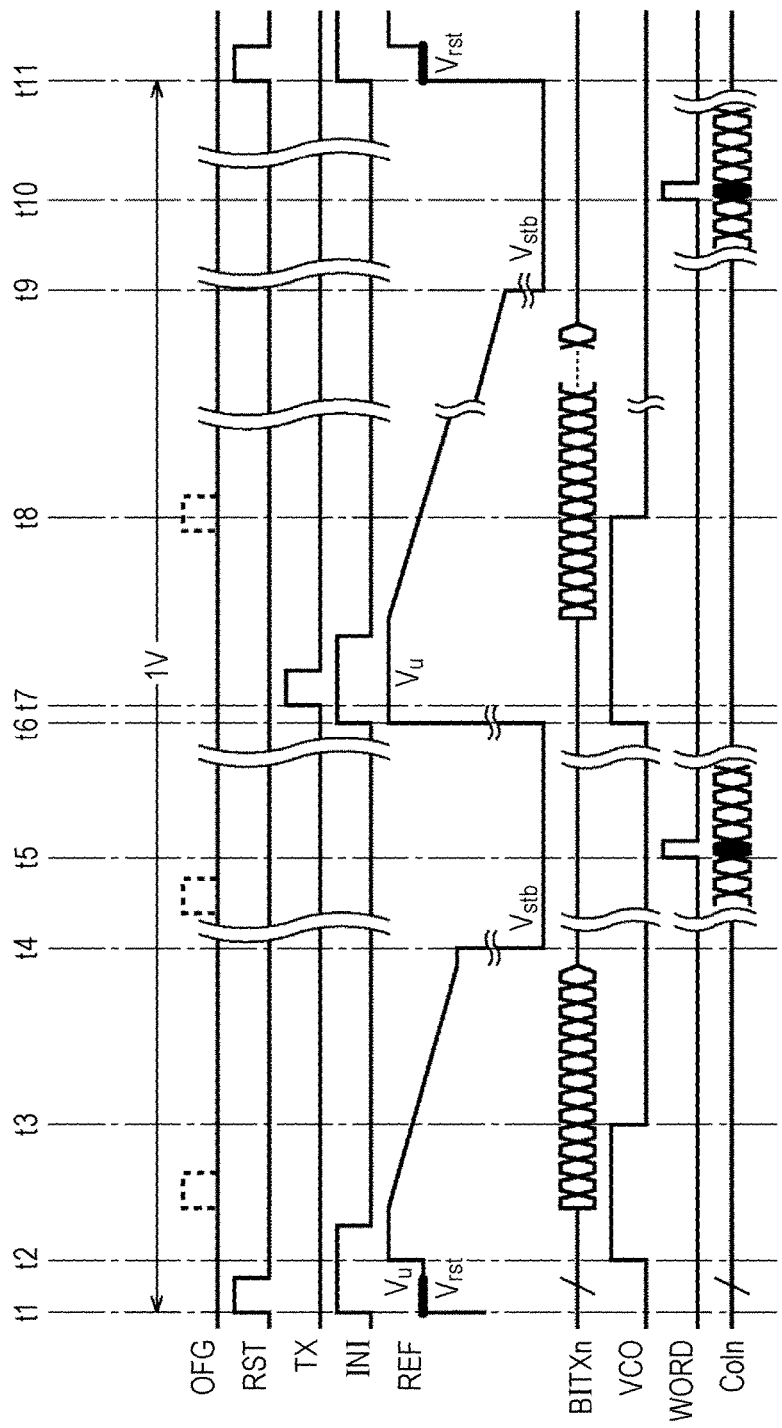
FIG. 19 is a timing chart for explaining operation of the pixel according to the first embodiment.

Referring now to the timing chart in FIG. 19, the operation of the pixel 21 shown in FIG. 18 is described.

First, at time t1, the reference signal REF is changed from a standby voltage $V_{stb}$ to a reset voltage $V_{rst}$ for resetting the charge in the FD 175, and the reset transistor 174 is turned on, so that the charge in the FD 175 is reset. At time t1, the initialization signal INI to be supplied to the gate of the transistor 93 of the positive feedback circuit 62 is set at Hi, so that the positive feedback circuit 62 is put into an initial state.

At time t2, the reference signal REF is boosted to a predetermined voltage $V_u$, and comparison between the reference signal REF and the pixel signal SIG is started. At this point of time, the reference signal REF is larger than the pixel signal SIG, and therefore, the output signal VCO is Hi.

At time t3 when the reference signal REF and the pixel signal SIG are determined to be equal, the output signal VCO is inverted (to Low). As the output signal VCO is inverted, the speed of inversion of the output signal VCO is increased by the positive feedback circuit 62, as described above. The latch circuit 101'-n (n being 1 to N) of the latch storage unit 52 stores the data LATn at the time when the output signal VCO is inverted.

At time t4 when the signal write period ends and the signal read period starts, the voltage of the reference signal REF to be supplied to the gate of the transistor 81 of the comparator 51 is lowered to the level (standby voltage $V_{stb}$) at which the transistor 81 is turned off. With this, the current to be consumed by the comparator 51 during the signal read period is reduced.

At time t5, the control signal WORD switches to Hi, and the latch signal Coln of the nth bit (n being 1 to N) is output from the latch signal output line 114. The data obtained at this point is P-phase data at the reset level at the time of the correlated double sampling (CDS) process.

At time t6, the reference signal REF is boosted to the predetermined voltage $V_u$, and the initialization signal INI to be supplied to the gate of the transistor 93 is set at Hi, so that the positive feedback circuit 62 is again put into the initial state.

At time t7, the transfer transistor 173 of the pixel circuit 41 is turned on, and the charge generated at the photodiode 171 is transferred to the FD 175.

After the initialization signal INI is returned to Low, comparison between the reference signal REF and the pixel signal SIG is started. At this point of time, the reference signal REF is larger than the pixel signal SIG, and therefore, the output signal VCO is Hi.

At time t8 when the reference signal REF and the pixel signal SIG are determined to be equal, the output signal VCO is inverted (to Low). As the output signal VCO is inverted, the speed of inversion of the output signal VCO is increased by the positive feedback circuit 62. The latch circuit 101'-n (n being 1 to N) of the latch storage unit 52 stores the data LATn at the time when the output signal VCO is inverted.

At time t9 when the signal write period ends and the signal read period starts, the voltage of the reference signal REF to be supplied to the gate of the transistor 81 of the comparator 51 is lowered to the level (standby voltage $V_{stb}$) at which the transistor 81 is turned off. With this, the current to be consumed by the comparator 51 during the signal read period is reduced.

At time t10, the control signal WORD switches to Hi, and the latch signal Coln of the nth bit (n being 1 to N) is output from the latch signal output line 114. The data obtained at this point is D-phase data at the signal level at the time of the correlated double sampling (CDS) process. At time t11, the state is the same as the above described state at time t1, and the next 1V (one vertical scan period) is driven.

In the above described driving of the pixel 21, P-phase data (at the reset level) is first obtained and read, and D-phase data (at the signal level) is then obtained and read.

Through the above described operation, the respective pixels 21 of the pixel array unit 22 of the solid-state imaging device 1 are reset at the same time, and a global shutter operation can be performed to expose all the pixels at the same time. As all the pixels can be simultaneously exposed and read, there is no need to prepare the holding unit that is normally provided in each pixel to hold charge until the charge is read. Also, in the structure of each pixel 21, there is no need to provide a select transistor or the like that selects a pixel to output the pixel signal SIG and is necessary in a solid-state imaging device of a parallel column reading type.

In the driving of the pixel 21 described above with reference to FIG. 19, the discharge transistor 172 is controlled to be constantly off. However, at desired times, a discharge signal OFG may be set at Hi to turn on the discharge transistor 172. After that, the discharge transistor 172 may be turned off, to set desired exposure periods, as indicated by dashed lines in FIG. 19.

<9. Second Embodiment of the Pixel Unit>

Figure 20:
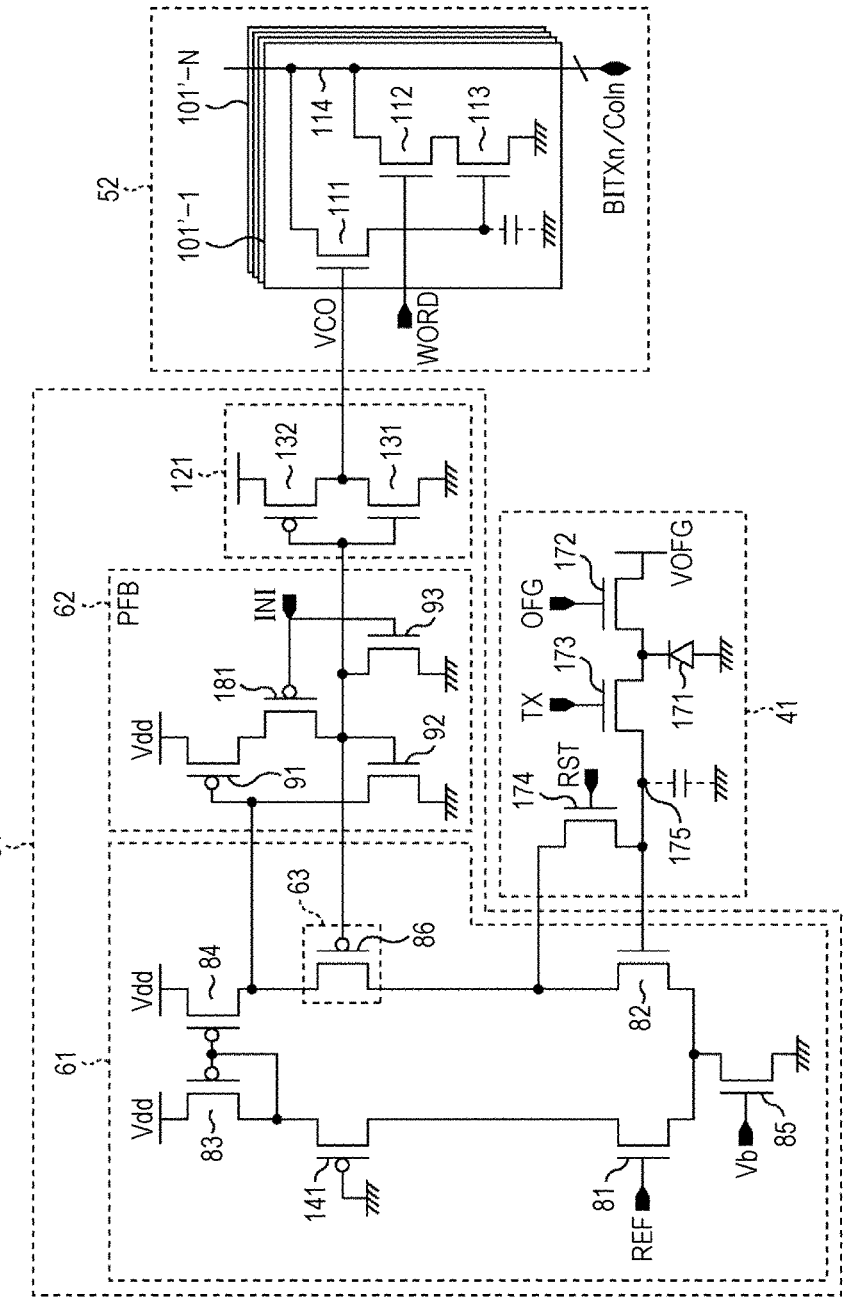
FIG. 20 is a circuit diagram showing a second embodiment of a pixel.

FIG. 20 is a circuit diagram showing a second embodiment of the pixel 21.

In the second embodiment of the pixel 21, a PMOS transistor 181 is further provided between the transistors 91 and 92 in the positive feedback circuit 62. The source of the PMOS transistor 181 is connected to the drain of the transistor 91, and the drain of the PMOS transistor 181 is connected to the drain of the transistor 92. The initialization signal INI is input to the gate of the PMOS transistor 181.

In the circuit structure of the pixel 21 according to the first embodiment shown in FIG. 18, at time t1, the voltage of the reference signal REF is set at the reset voltage $V_{rst}$, and the reset voltage $V_{rst}$ is also input to the gain of the transistor 91 of the positive feedback circuit 62 while the charge in the FD 175 of the pixel circuit 41 is being reset. At this point of time, in the positive feedback circuit 62, a feedthrough current continues to flow from the power supply voltage Vdd to GND. To avoid such a state in the pixel 21 according to the second embodiment shown in FIG. 20, the PMOS transistor 181 that is controlled by the initialization signal INI like the transistor 93 is further provided between the transistors 91 and 92 in the positive feedback circuit 62. With this structure, the PMOS transistor 181 is off while the transistor 93 remains on due to the initialization signal INI at Hi. Thus, the current flowing from the transistor 91 of the positive feedback circuit 62 to the transistor 93 can be cut off. The driving of the pixel 21 according to the second embodiment shown in FIG. 20 is the same as that shown in FIG. 19.

<10. Third Embodiment of the Pixel Unit>

Figure 21:
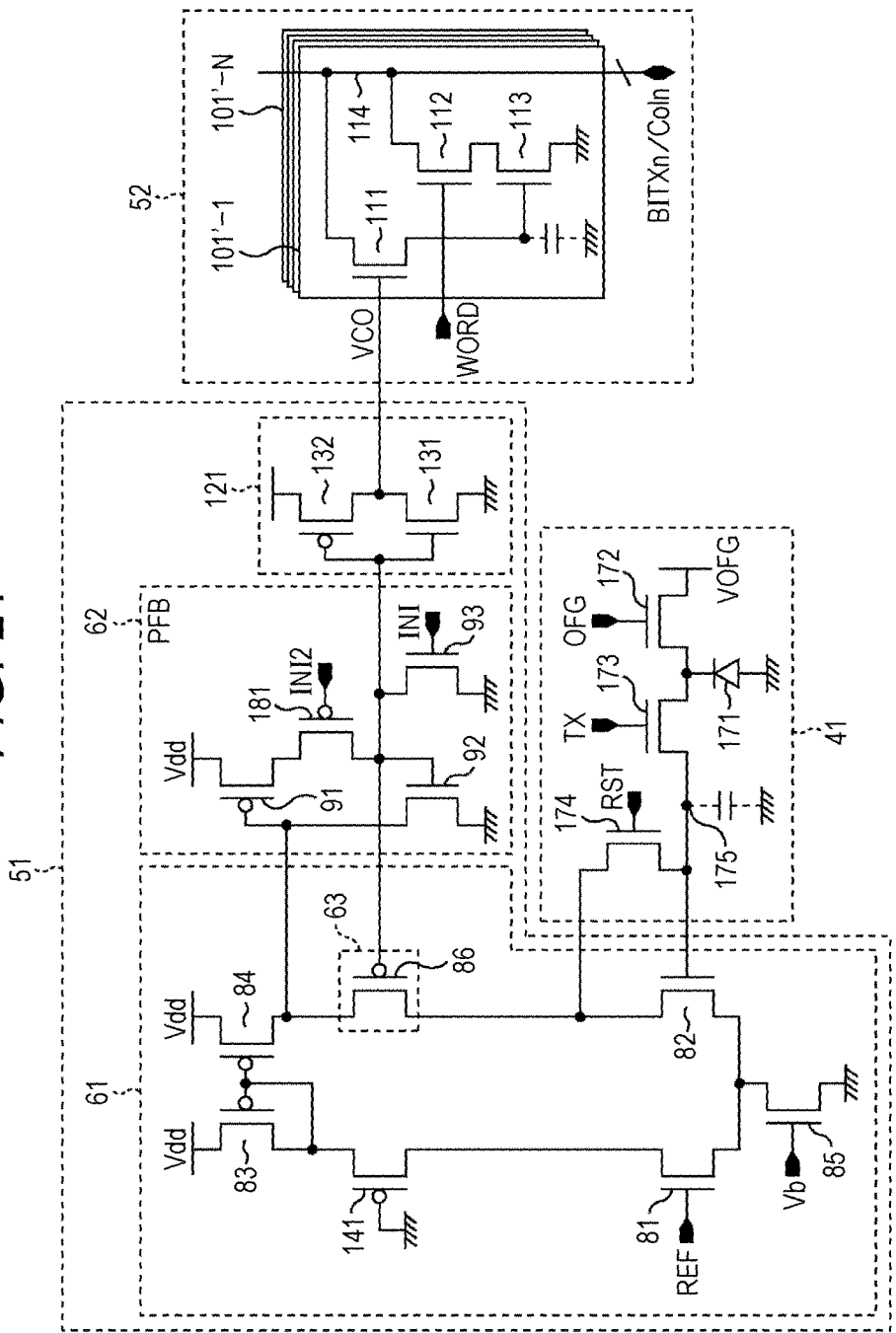
FIG. 21 is a circuit diagram showing a third embodiment of a pixel.

FIG. 21 is a circuit diagram showing a third embodiment of the pixel 21.

The third embodiment of the pixel 21 shown in FIG. 21 is another example circuit structure that prevents a state where a feedthrough current continues to flow in the positive feedback circuit 62 when the charge in the FD 175 is being reset.

In the circuit of the pixel 21 according to the second embodiment shown in FIG. 20, the same initialization signal INI is input to the transistor 93 and the PMOS transistor 181. Therefore, as soon as the initialization signal INI switches to Low, the charge stored in the source of the PMOS transistor 181 becomes an injection, and partially pressurizes the node of the transistor 86 forming the current limiting unit 63. At this point of time, an incorrect operation might be caused depending on the amount of the injection. To prevent the incorrect operation, an initialization signal INI2 is input to the PMOS transistor 181 independently of the initialization signal INI that is input to the transistor 93 in the third embodiment.

Figure 22:
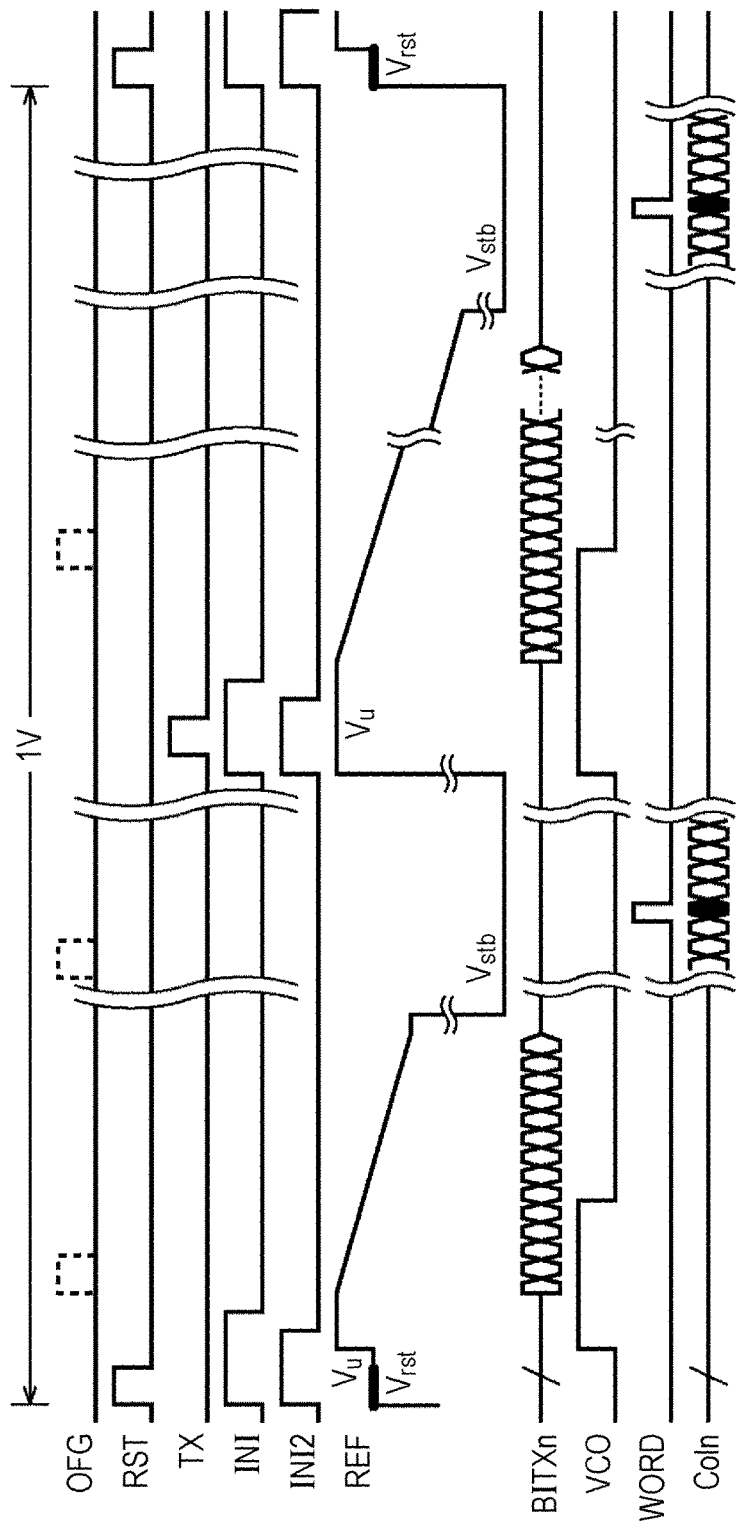
FIG. 22 is a timing chart for explaining operation of the pixel according to the third embodiment.

FIG. 22 is a timing chart showing operation of the pixel 21 according to the third embodiment.

As shown in FIG. 22, the initialization signal INI and the initialization signal INI2 are switched to Hi at the same time, but are switched to Low at different times from each other. Specifically, control is performed so that the initialization signal INI is switched to Low after the initialization signal INI2 is switched to Low. The other aspects of the operation are the same as those of the first embodiment described above with reference to FIG. 19.

<11. Fourth Embodiment of the Pixel Unit>

Figure 23:
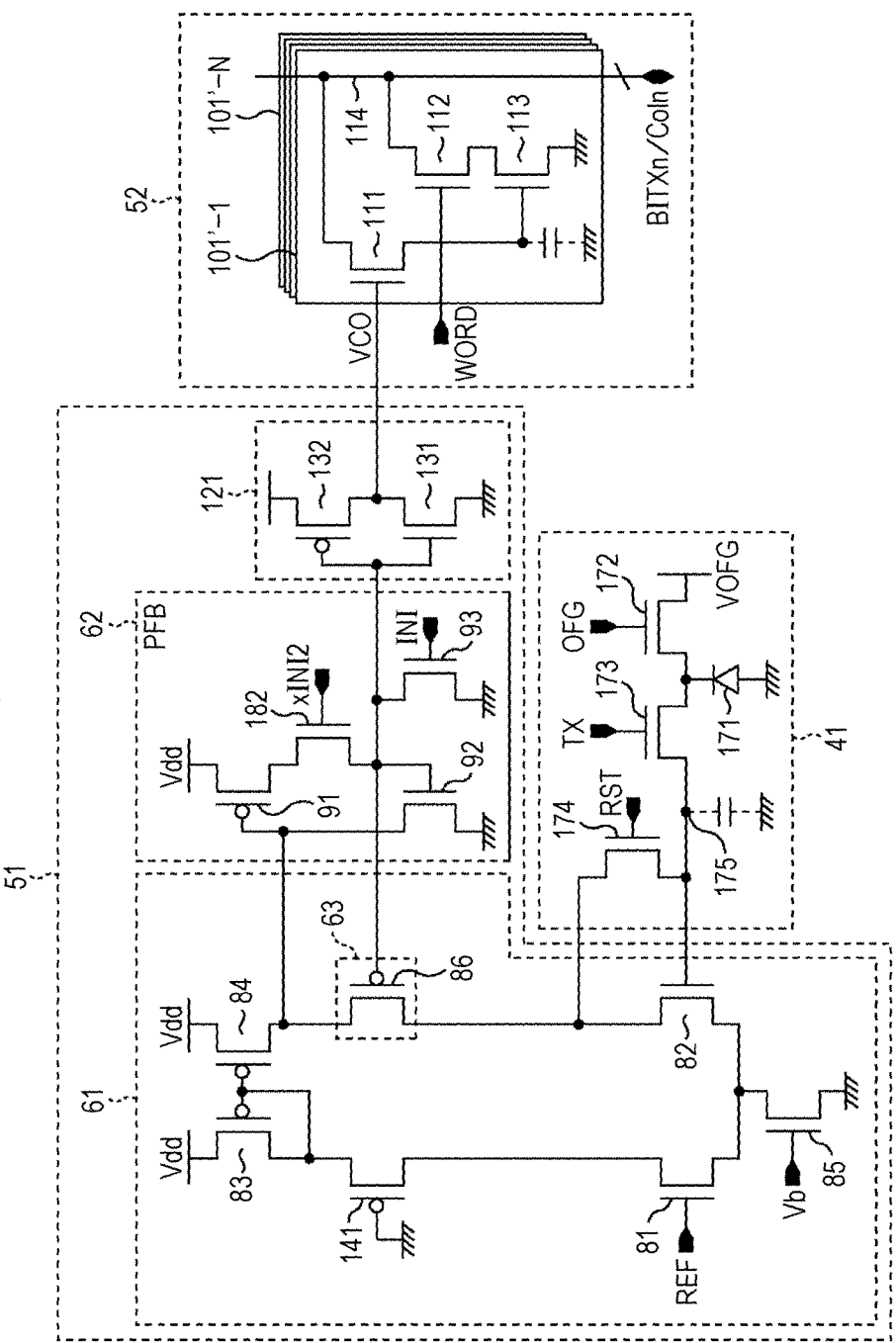
FIG. 23 is a circuit diagram showing a fourth embodiment of a pixel.

FIG. 23 is a circuit diagram showing a fourth embodiment of the pixel 21.

The fourth embodiment of the pixel 21 shown in FIG. 23 is yet another example circuit structure that prevents a state where a feedthrough current continues to flow in the positive feedback circuit 62 when the charge in the FD 175 is being reset.

In the fourth embodiment, an NMOS transistor 182 is provided, instead of the PMOS transistor 181 according to the third embodiment shown in FIG. 21. An initialization signal xINI2 that is an inverted signal of the initialization signal INI2 input to the PMOS transistor 181 according to the third embodiment is input to the gate of the NMOS transistor 182.

Figure 24:
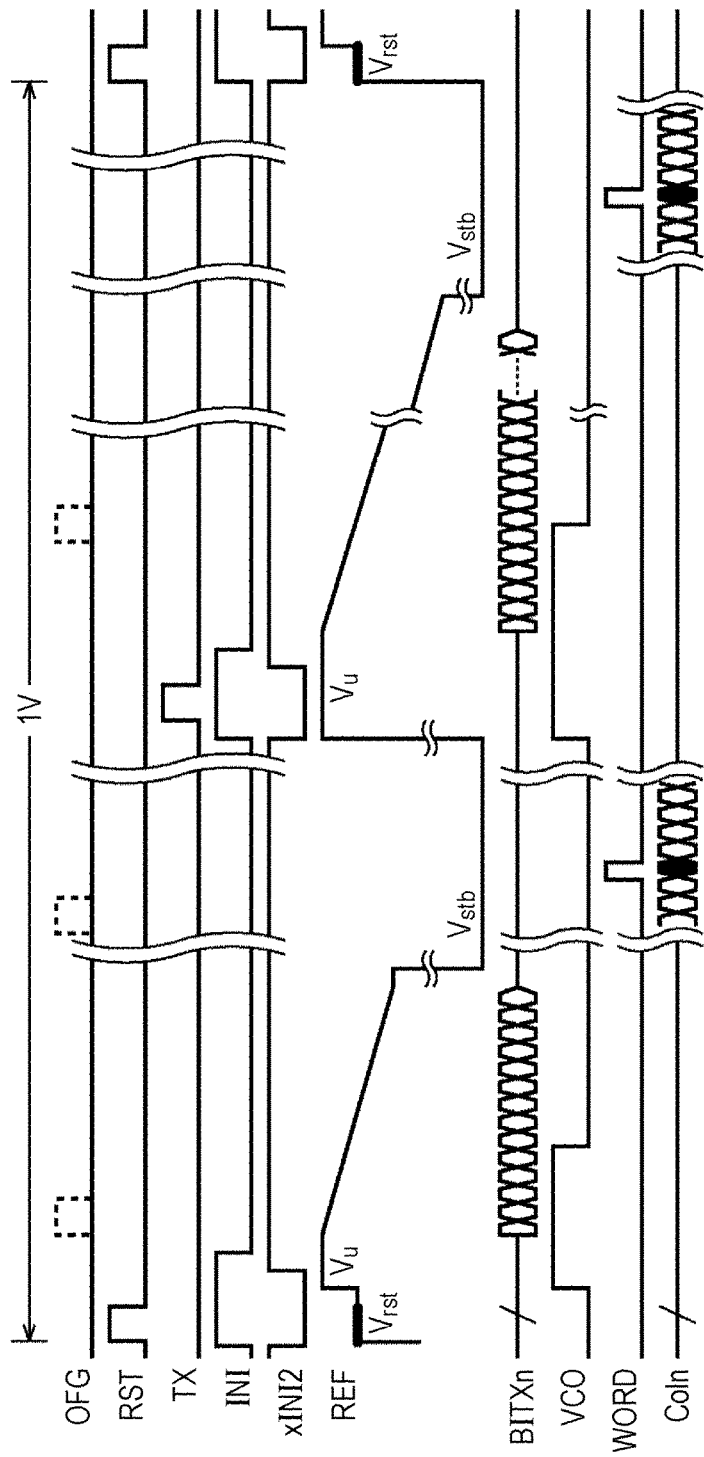
FIG. 24 is a timing chart for explaining operation of the pixel according to the fourth embodiment.

FIG. 24 is a timing chart showing operation of the pixel 21 according to the fourth embodiment.

The pixel 21 according to the fourth embodiment is driven in the same manner as the pixel 21 according to the third embodiment, except for being driven with the initialization signal xINI2, which is an inverted signal of the initialization signal INI2.

Between the two circuit structures of the third embodiment and the fourth embodiment, a suitable one should be selected depending on layout efficiency.

<12. First Embodiment of Pixel Sharing>

Although one ADC 42 is provided in one pixel 21 in the respective embodiments described so far, one ADC 42 may be shared among pixels 21.

Figure 25:
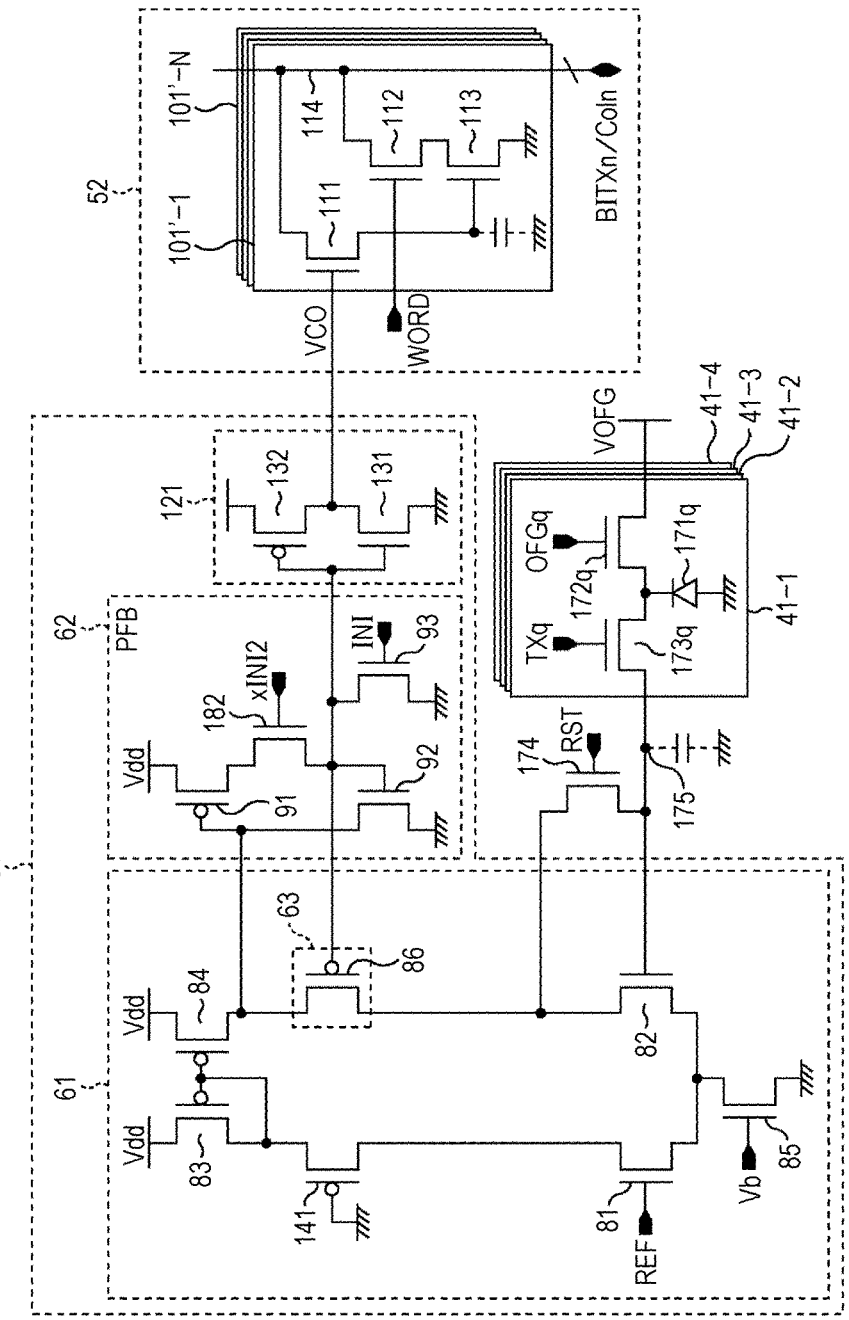
FIG. 25 is a circuit diagram showing a first embodiment of pixel sharing.

FIG. 25 is a circuit diagram showing a first embodiment of pixel sharing.

In the first embodiment of pixel sharing shown in FIG. 25, a pixel circuit 41-$q$ (q being one of 1 to 4) provided in each pixel 21 includes a photodiode 171$q$, a discharge transistor 172$q$, and a transfer transistor 173$q$, and the four pixel circuits 41-1 through 41-4 share one reset transistor 174, one FD 175, and one ADC 42.

The circuit structure of the comparator 51 is the circuit structure shown in FIG. 23, but may be some other circuit structure.

Figure 26:
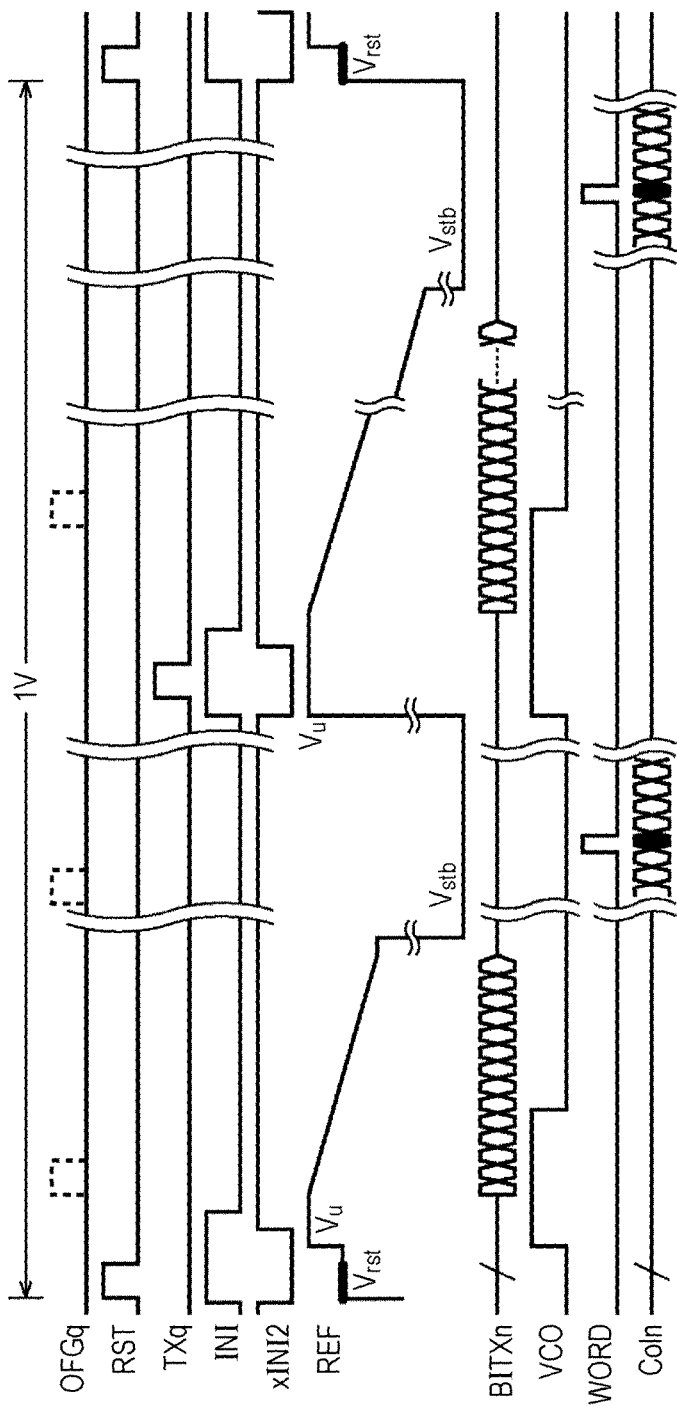
FIG. 26 is a timing chart for explaining operation of shared pixels according to the first embodiment.

FIG. 26 is a timing chart showing operation of a pixel 21 including a pixel circuit 41-$q$ (q being one of 1 to 4) in the case of the pixel sharing according to the first embodiment shown in FIG. 25.

The operation of the pixel 21 is the same as that shown in FIG. 24, except that the discharge signal OFG and a transfer signal TX are a discharge signal OFGq and a transfer signal TXq corresponding to the discharge transistor 172$q$ and the transfer transistor 173$q$ in the pixel circuit 41-$q$.

<13. Second Embodiment of Pixel Sharing>

Figure 27:
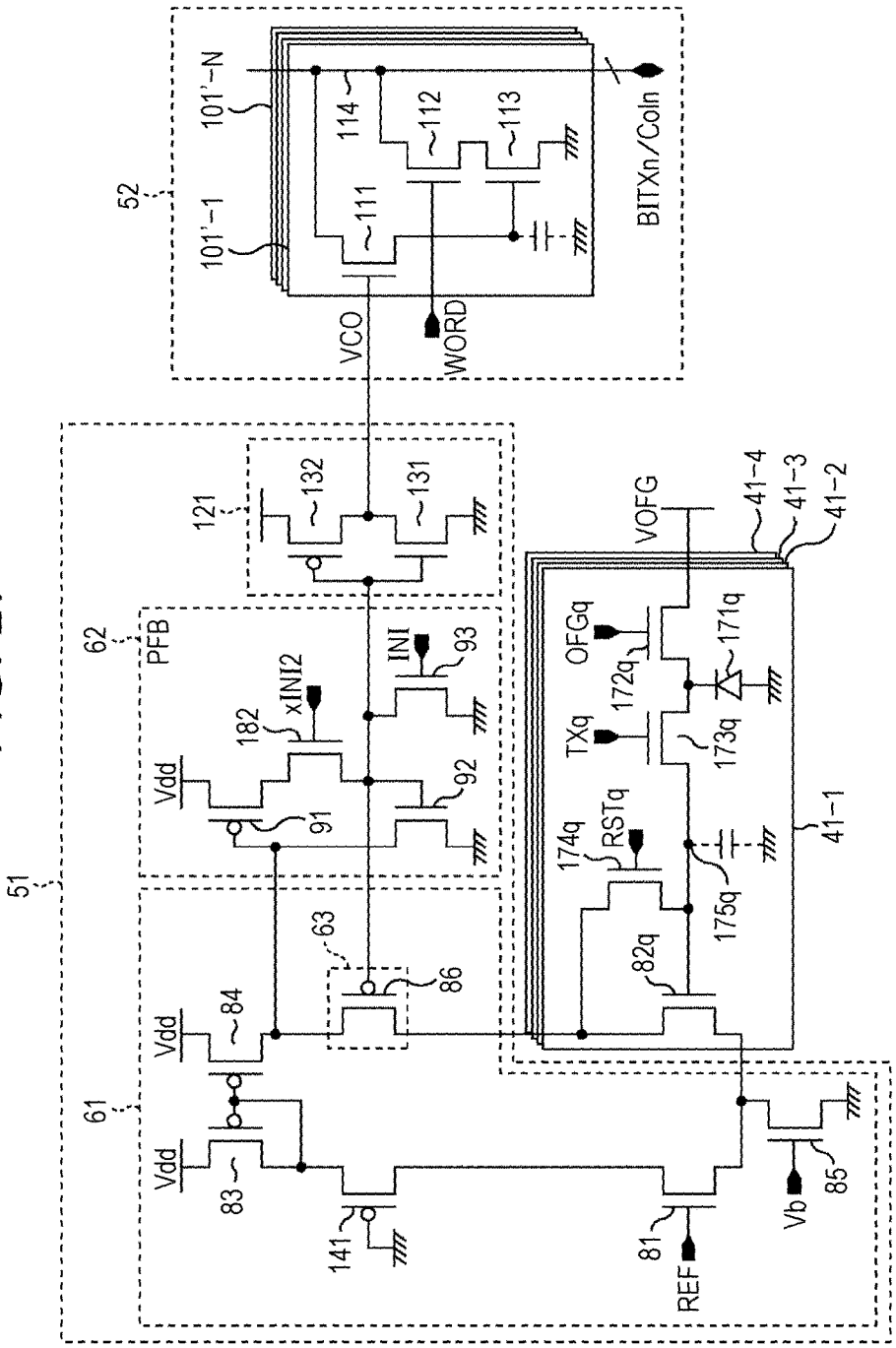
FIG. 27 is a circuit diagram showing a second embodiment of pixel sharing.

FIG. 27 is a circuit diagram showing a second embodiment of pixel sharing.

In the second embodiment of pixel sharing shown in FIG. 27, a pixel circuit 41-$q$ (q being one of 1 to 4) provided in each pixel 21 includes a photodiode 171$q$, a discharge transistor 172$q$, a transfer transistor 173$q$, a reset transistor 174$q$, an FD 175$q$, and a transistor 82$q$ of the differential amplifier circuit 61 that functions as an amplification transistor of the pixel circuit 41-$q$.

The four pixel circuits 41-1 through 41-4 share one ADC 42, except for the transistor 82$q$ of the differential amplifier circuit 61.

In the second embodiment of pixel sharing, the circuit structure of the comparator 51 is also the circuit structure shown in FIG. 23, but may be some other circuit structure.

Figure 28:
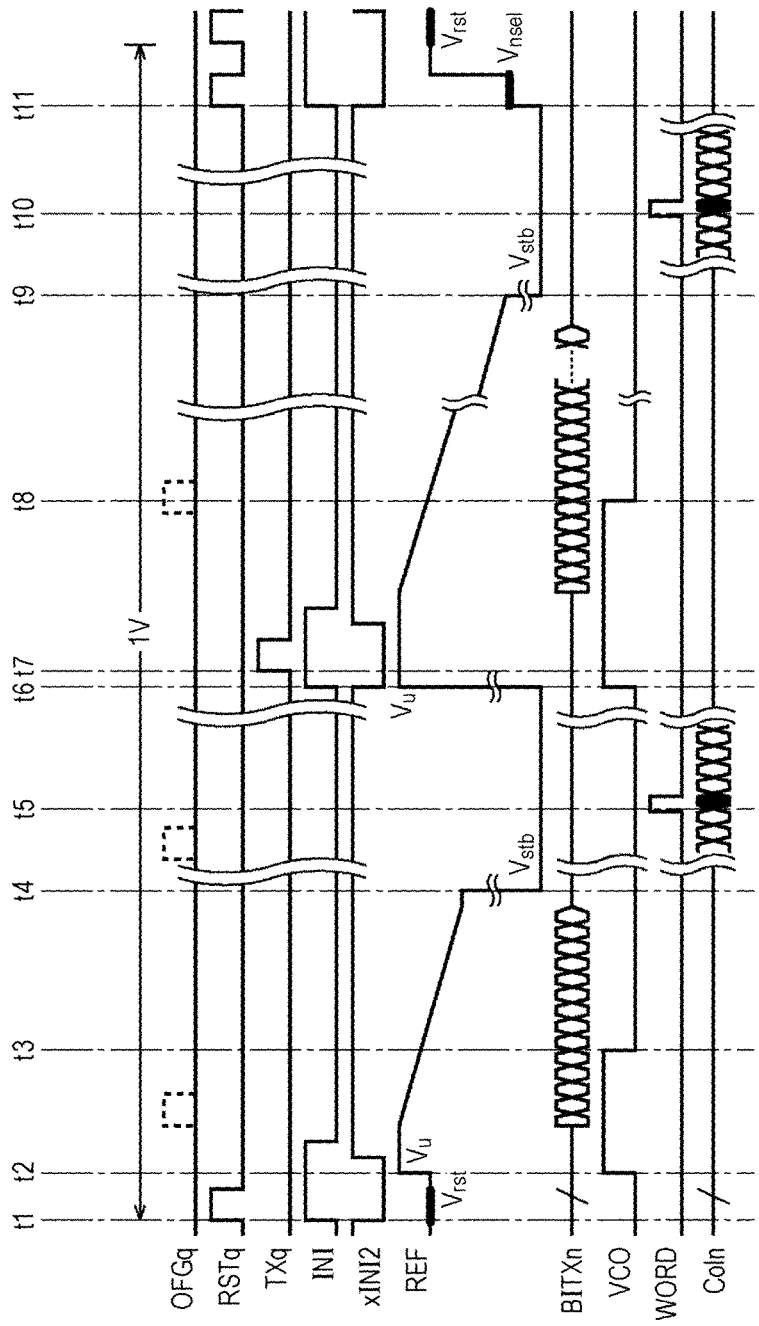
FIG. 28 is a timing chart for explaining operation of shared pixels according to the second embodiment.

FIG. 28 is a timing chart showing operation of a pixel 21 including a pixel circuit 41-$q$ in the case of the pixel sharing according to the second embodiment shown in FIG. 27.

In FIG. 28, the discharge signal OFG, the reset signal RST, and the transfer signal TX are the discharge signal OFGq, the reset signal RSTq, and the transfer signal TXq corresponding to the pixel circuit 41-$q$.

Also, in FIG. 28, the control signal WORD switches to Hi at time t10. At time t11 after the D-phase data in the pixel circuit 211-$q$ is read, the voltage of the reference signal REF is set at a voltage (a non-select voltage $V_{nsel}$) for making the pixel 21 including the pixel circuit 41-$q$ non-selected, and the reset signal RSTq of the reset transistor 174$q$ is switched to Hi. With this, the FD 175$q$ is set at the non-select voltage $V_{nsel}$.

The non-select voltage $V_{nsel}$ corresponds to the off-state of the select transistor, is a potential at which the pixel circuits 41-$q$ not outputting the pixel signal SIG are turned off, and is a voltage at which charge does not flow back to the photodiode 171$q$ via the transfer transistor 173$q$.

The pixel circuit 41-$q$ outputting the pixel signal SIG is selected by setting the voltage of the reference signal REF at the reset voltage $V_{rst}$ and the voltage of the FD 175 at the reset voltage $V_{rst}$ at time t1.

That is, in the pixel sharing according to the second embodiment, one of the four pixel circuits 41 is selected by setting the reset voltage $V_{rst}$ at time t1. After the pixel signal SIG is output, the voltage of the FD 175 is set at the non-select voltage $V_{nsel}$ at time t11, so that the selected pixel circuit 41 is made non-selected. Where the reset voltage $V_{rst}$ is 2 V, for example, the non-select voltage $V_{nsel}$ may be approximately 0.6 V.

As described above, in the circuit structure for the pixel sharing according to the second embodiment, the voltage of the FD 175 can be arbitrarily set with the reference signal REF. By taking advantage of this aspect, it is possible to select each pixel circuit 211, without any select transistor.

In the circuit structure for the pixel sharing according to the second embodiment, the four pixels sharing the ADC 42 are called first through fourth pixels, for example. In that case, the solid-state imaging device 1 performs "P-phase data reading (P), charge transfer to the FD (transfer), and D-phase data reading (D)"="P, transfer, D". For the first through fourth pixels in this order, the solid-state imaging device 1 performs "P, transfer, D, P, transfer, D, P, transfer, D, P, transfer, D".

<Pixel-Sharing Read Sequence>

In the pixel sharing according to the first or second embodiment, the pixel signals SIG of the four shared pixels (four pixels 21) are read in a predetermined sequence as described above. Depending on the read sequence, a color artifact might be caused.

Figure 29:
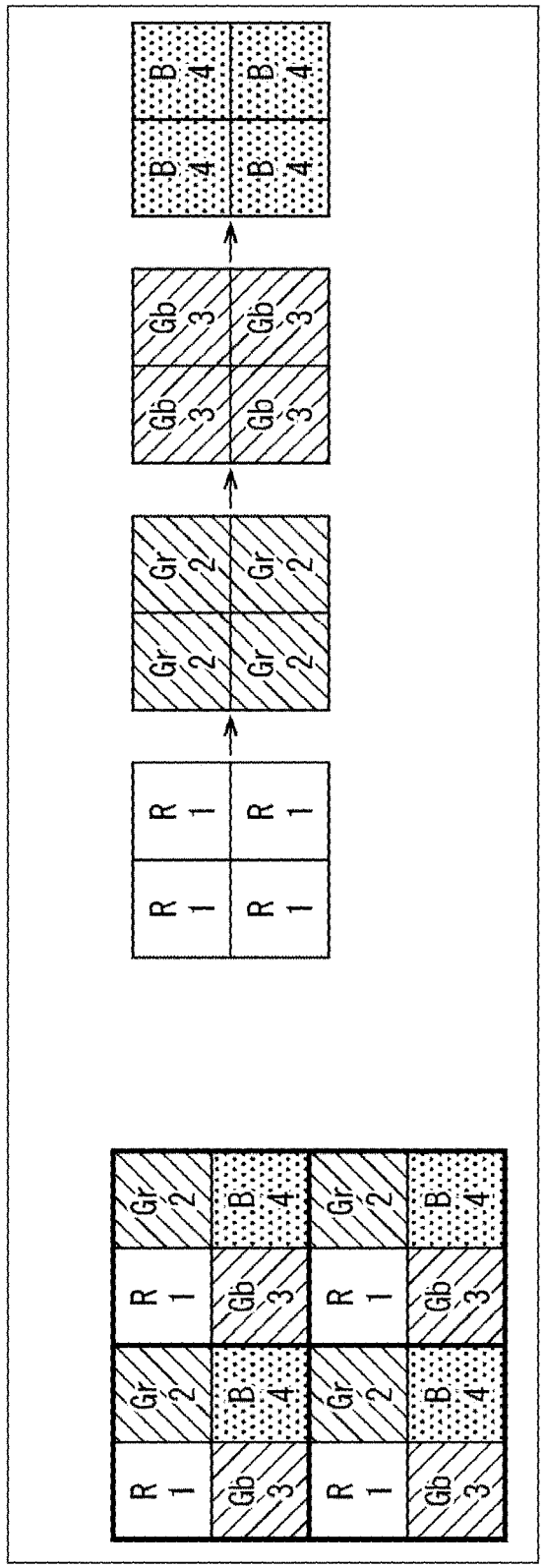
FIG. 29 is a diagram for explaining a read sequence of shared pixels.

FIG. 29 shows a pixel read sequence that might cause a color artifact in a case where each sharing unit is formed with four pixels, and color filters are arranged in a Bayer array. In FIG. 29, the numbers written in the pixels indicate the order of reading.

As shown in FIG. 29, in a case where the R pixel, the Gr pixel, the Gb pixel, and the B pixel are read in this order among the four pixels of each sharing unit, the exposure periods for the four pixels in each sharing unit differ from one another. In a case where white flash light enters the imaging area, the obtained pixel signals do not represent white. Depending on the timing, the respective colors might be emphasized, or the complementary colors of the pixels not subjected to flash light might appear.

Figure 30:
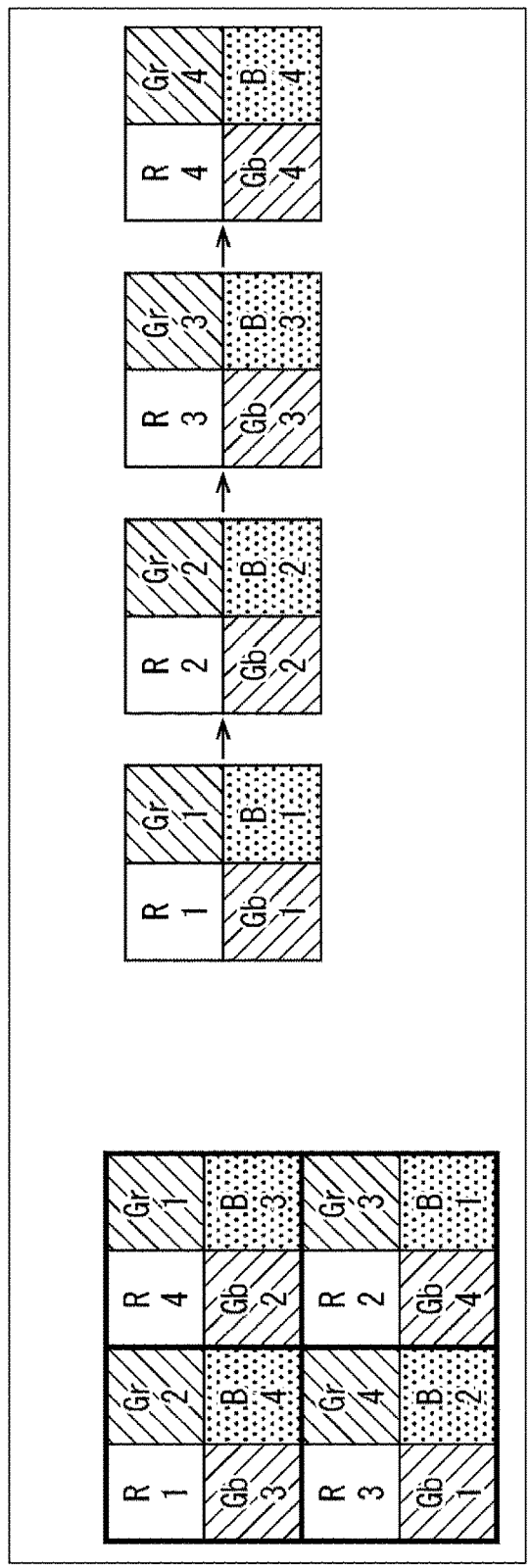
FIG. 30 is a diagram for explaining a read sequence of shared pixels.

In view of this, the signals of the four pixels in each sharing unit are read in the read sequence shown in FIG. 30, so that color artifacts can be prevented. In FIG. 30, among 16 pixels formed with four 2×2 sharing units, the pixel signals SIG are read so that the combination of the colors of the pixels to be simultaneously read represents white (or an R pixel, a Gr pixel, a Gb pixel, and a B pixel). With this read sequence, even if white flash light enters the imaging area, the same amount of signals enter the pixels having the same exposure time, and thus, color artifacts can be prevented.

Figure 31:
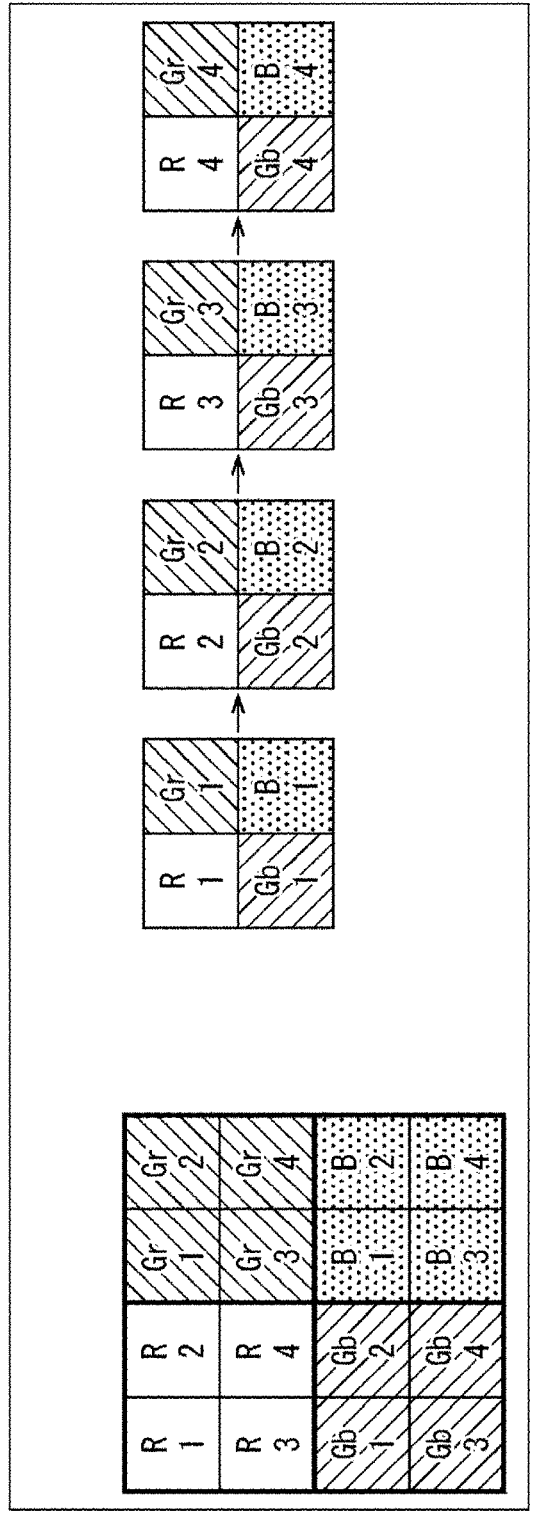
FIG. 31 is a diagram for explaining a shared pixel read sequence.

Alternatively, while the read pixel control remains the same as that shown in FIG. 29, the color array may be modified as shown in FIG. 31. In FIG. 31, the four pixels of a sharing unit are color filters of the same color, and color filters are arranged so that 16 pixels formed with four 2×2 sharing units form a Bayer array. The read sequence is controlled so that the pixels in the same positions in the respective sharing units are read at the same time. In this case, among the 16 pixels formed with the four 2×2 sharing units, the combination of the colors of the pixels to be simultaneously read represents white. Even if white flash light enters the imaging area, the same amount of signals enter the pixels having the same exposure time, and thus, color artifacts can be prevented.

In a structure in which the ADC 42 is shared among four pixels as described above, if one captured image is formed by combining pixel signals obtained through four separate read operations, the exposure periods of the four pixels in each sharing unit differ from one another. If one captured image is formed only with pixels that are simultaneously read, a global shutter image that is ¼ in pixel number and ¼ in spatial resolution but is four times higher in speed is obtained. Alternatively, four global shutter images that are ¼ in pixel number, are ¼ in spatial resolution, and are in a one-pixel-shifted relationship are obtained through four separate read operations.

<14. Third Embodiment of Pixel Sharing>

In the circuit structure for the pixel sharing according to the second embodiment, reading is performed in the sequence of "P, transfer, D, P, transfer, D, P, transfer, D, P, transfer, D" for the first through fourth pixels in this order. As a result, the exposure periods of the four pixels in each sharing unit differ from one another, and a global shutter operation cannot be realized.

Figure 32:
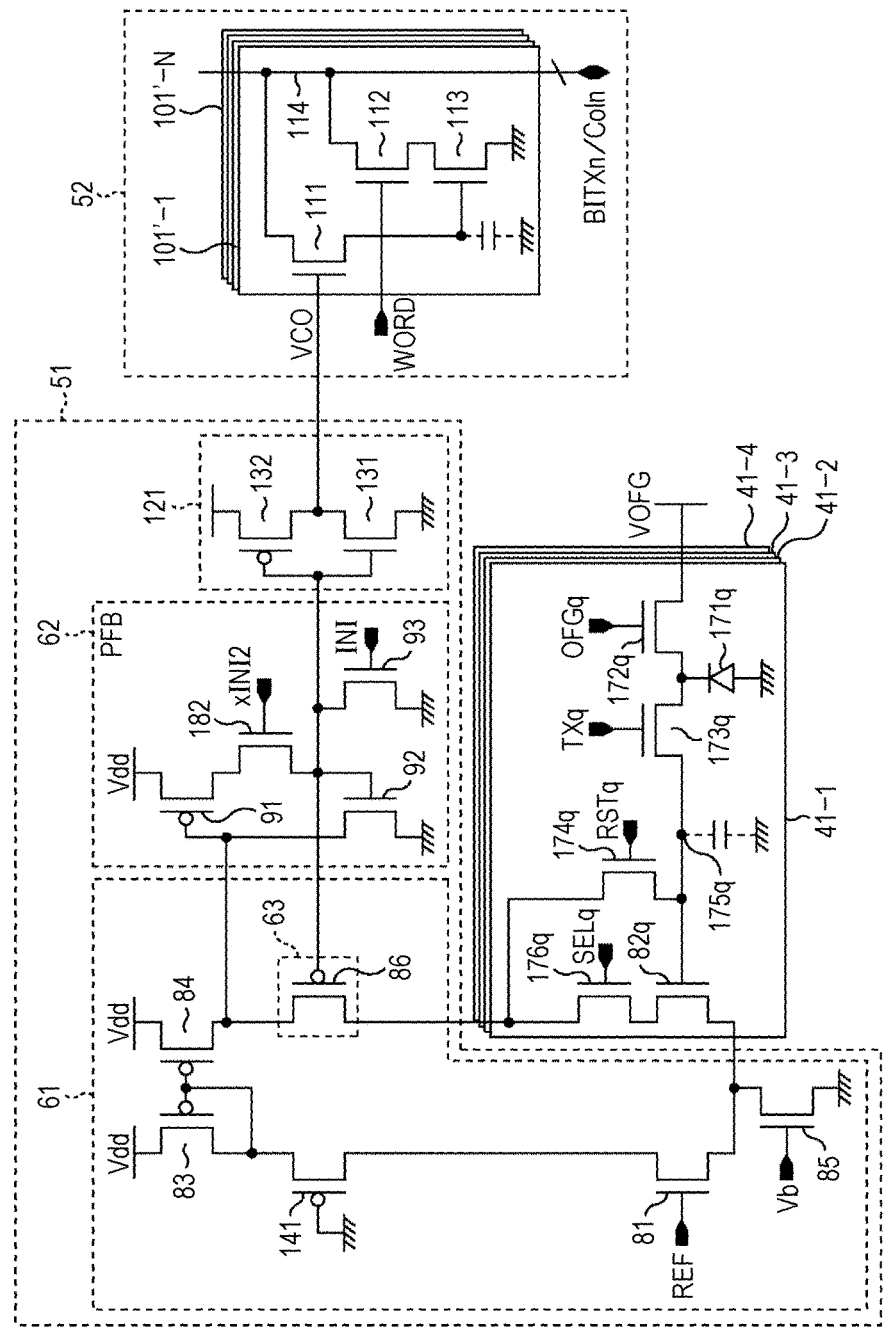
FIG. 32 is a circuit diagram showing a third embodiment of pixel sharing.

In view of this, the circuit structure shown in FIG. 32 is designed so that a global shutter operation can be performed while the ADC 42 is shared among four pixels.

FIG. 32 is a circuit diagram showing a third embodiment of pixel sharing.

The circuit structure for the pixel sharing according to the third embodiment shown in FIG. 32 differs from the circuit structure for the pixel sharing according to the second embodiment shown in FIG. 27, in that the pixel circuit 41-$q$ provided in each pixel 21 further includes a select transistor 176$q$ in the third embodiment.

Figure 33:
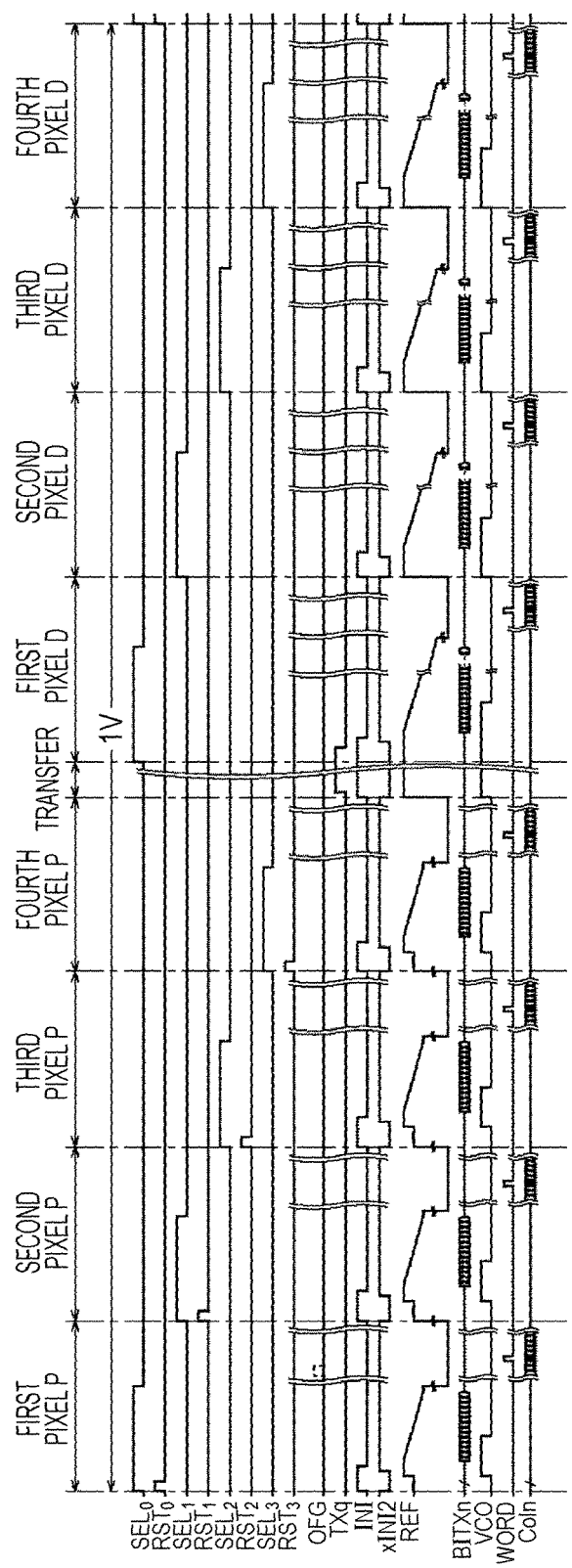
FIG. 33 is a timing chart for explaining operation of shared pixels according to the third embodiment.

FIG. 33 is a timing chart showing operation of the four pixels sharing the ADC 42 in the case of the pixel sharing according to the third embodiment shown in FIG. 32.

In the pixel sharing according to the third embodiment, the solid-state imaging device 1 performs drive control in the sequence of "P, P, P, P, transfer, D, D, D, D", as shown in FIG. 33. Specifically, after reading the P-phase data of the first through fourth pixels in this order in each sharing unit, the solid-state imaging device 1 collectively transfers the charge stored in all the pixels to the FD 175$q$, and then reads the D-phase data of the first through fourth pixels in this order in each sharing unit.

The exposure time of each pixel 21 is determined by the falling of the transfer signal TXq or the falling of the discharge signal OFGq, and thus, the same exposure time can be set for all the pixels. That is, a global shutter operation can be realized.

However, all the pixels are simultaneously subjected to exposure and transfer. Therefore, the voltages of the FDs 175$q$ of all the shared pixels become the reset voltage $V_{rst}$, and it is not possible to set the voltage of the FD 175$q$ of one of the shared pixels at the non-select voltage $V_{nsel}$ as in the second embodiment. To counter this, the newly-added select transistor 176$q$ is used to limit signal outputs from the comparator 51.

<15. Fourth Embodiment of Pixel Sharing>

Figure 34:
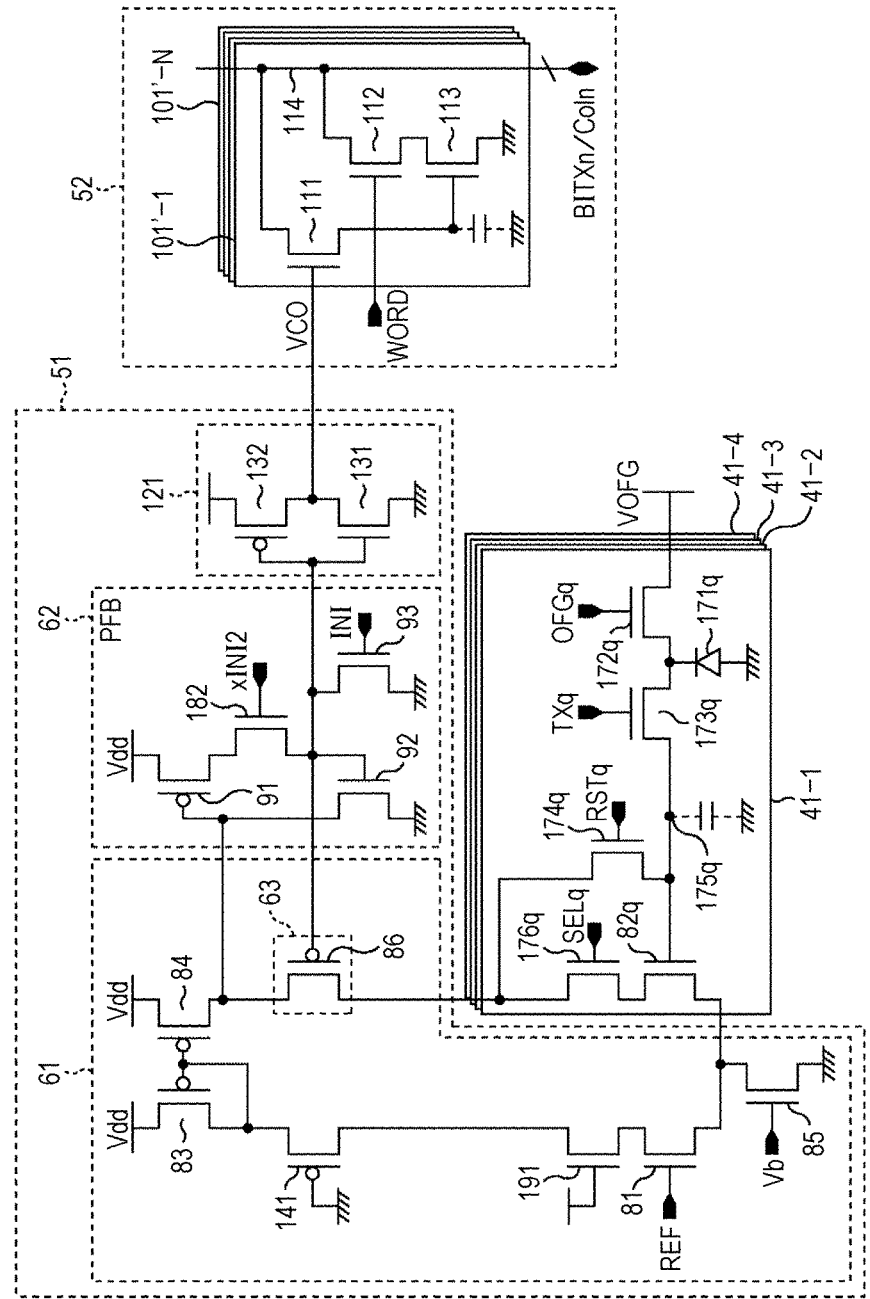
FIG. 34 is a circuit diagram showing a fourth embodiment of pixel sharing.

FIG. 34 is a circuit diagram showing a fourth embodiment of pixel sharing.

The circuit structure for the pixel sharing according to the fourth embodiment shown in FIG. 34 differs from the circuit structure for the pixel sharing according to the third embodiment shown in FIG. 32, in that a transistor 191 of the same type (NMOS) as the select transistor 176$q$ is further provided in a position symmetrical to the select transistor 176$q$, or between the drain of the transistor 141 and the drain of the transistor 81 to which the reference signal REF is input, in the differential amplifier circuit 61. The gate of the transistor 191 is connected to a predetermined voltage.

In the circuit structure for the pixel sharing according to the third embodiment shown in FIG. 32, the select transistor 176$q$ is added only to one side (right side) of the differential amplifier circuit 61, and therefore, a difference in characteristics might be generated between the right side and the left side. In view of this, the transistor 191 of the same type (NMOS) as the select transistor 176$q$ is provided as a dummy transistor, so that generation of any difference in characteristics can be prevented.

The method of driving the shared pixels according to the fourth embodiment is the same as the method according to the third embodiment described above with reference to FIG. 33.

<Vertical Division Control>

In a circuit structure according to the present disclosure, an input signal (or the reference signal REF) of the transistor 81 controlled by the reference signal REF in the differential amplifier circuit 61 is made equal to or lower than the threshold voltage of the transistor 81 so that the transistor 85 as the constant current source is turned off and does not operate.

In other words, the voltage of the reference signal REF is lowered to GND, for example, so that the pixel 21 can be put into a resting state. In this situation, the pixel array unit 22 is divided into a predetermined number of areas, as shown in FIG. 35, and the voltage of the reference signal REF is controlled in each of the areas so that the driving area can be changed.

Figure 35:
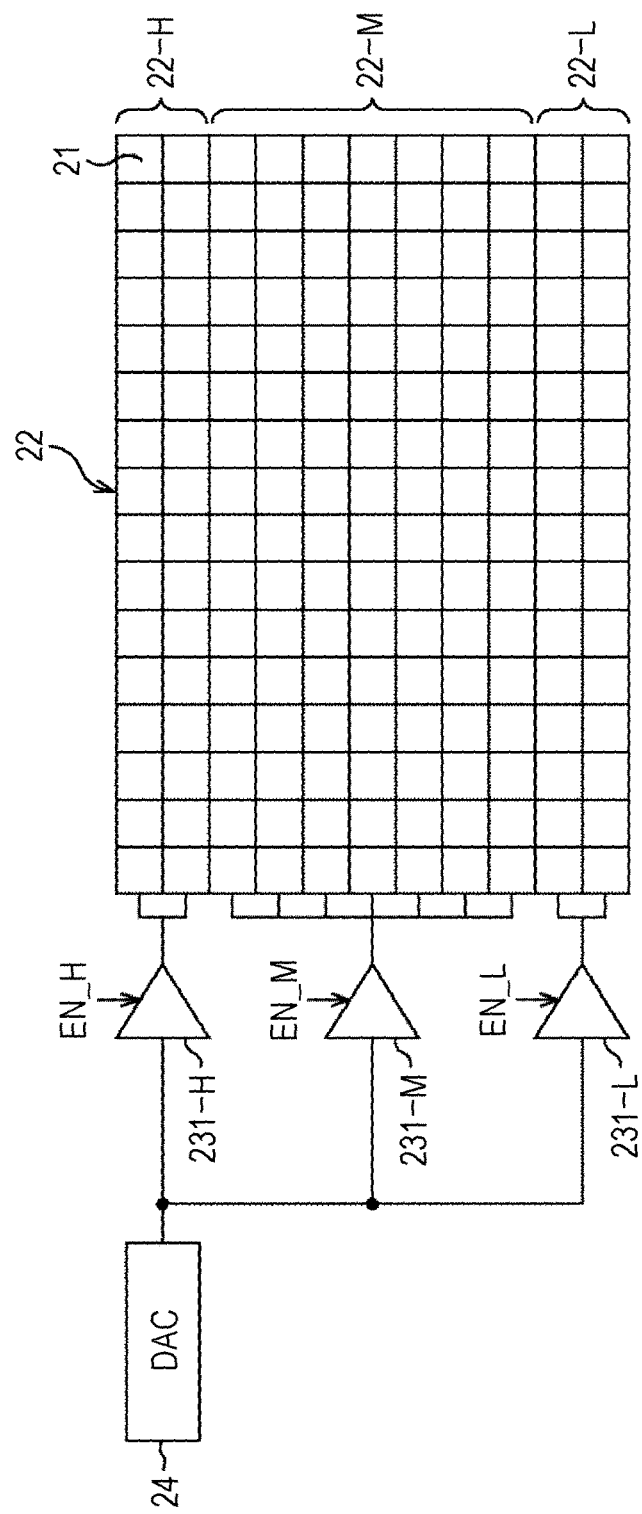
FIG. 35 is a diagram for explaining vertical division control.

For example, the pixel array unit 22 is vertically divided into three pixel array units 22-H, 22-M, and 22-L, and, in the stage after the DAC 24, output buffers 231-H, 231-M, and 231-L corresponding to the pixel array units 22-H, 22-M, and 22-L are provided, as shown in FIG. 35. Outputs from the output buffers 231-H and 231-L are lowered to GND, for example, so that the solid-state imaging device 1 puts the upper pixel array unit 22-H and the lower pixel array unit 22-L into a resting state, and drives only the pixel array unit 22-M in the middle. With this, only the necessary area can be driven, and power consumption can be reduced.

Although the pixel array unit 22 is vertically divided into three in the example shown in FIG. 35, the pixel array unit 22 is not necessarily divided into three, but may be divided into two, or may be divided into four or more. Also, the dividing direction may be the horizontal direction. Output buffers 231 may be provided in the vertical direction, and the initialization signal INI is controlled to be constantly on in the horizontal direction. In this manner, the pixel array unit may be divided into tile-like areas, and desired areas may be put into a resting state.

<16. Structure with Multiple Substrates 1>

In the above description, the solid-state imaging device 1 is formed on the single semiconductor substrate 11. However, the solid-state imaging device 1 may be formed by dividing circuits between semiconductor substrates 11.

Figure 36:
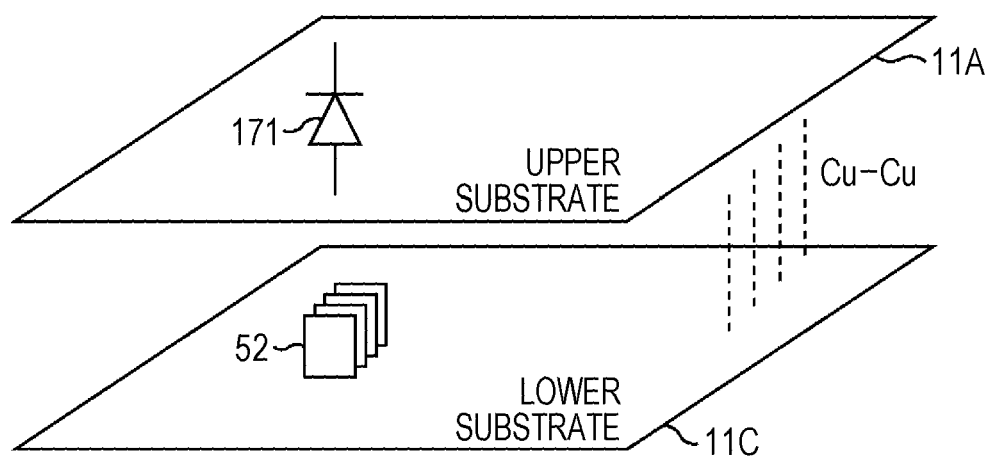
FIG. 36 is a diagram for explaining an example structure using two semiconductor substrates.

FIG. 36 is a conceptual diagram of the solid-state imaging device 1 formed by stacking the two semiconductor substrates 11 of an upper substrate 11A and a lower substrate 11C.

At least the pixel circuit 41 including the photodiode 171 is formed on the upper substrate 11A. At least the latch storage unit 52 including one or more latch circuits 101 is formed on the lower substrate 11C. The upper substrate 11A and the lower substrate 11C are joined by a metal bond such as Cu—Cu.

<Example Structure with Two Substrates 1-1>

Figure 37:
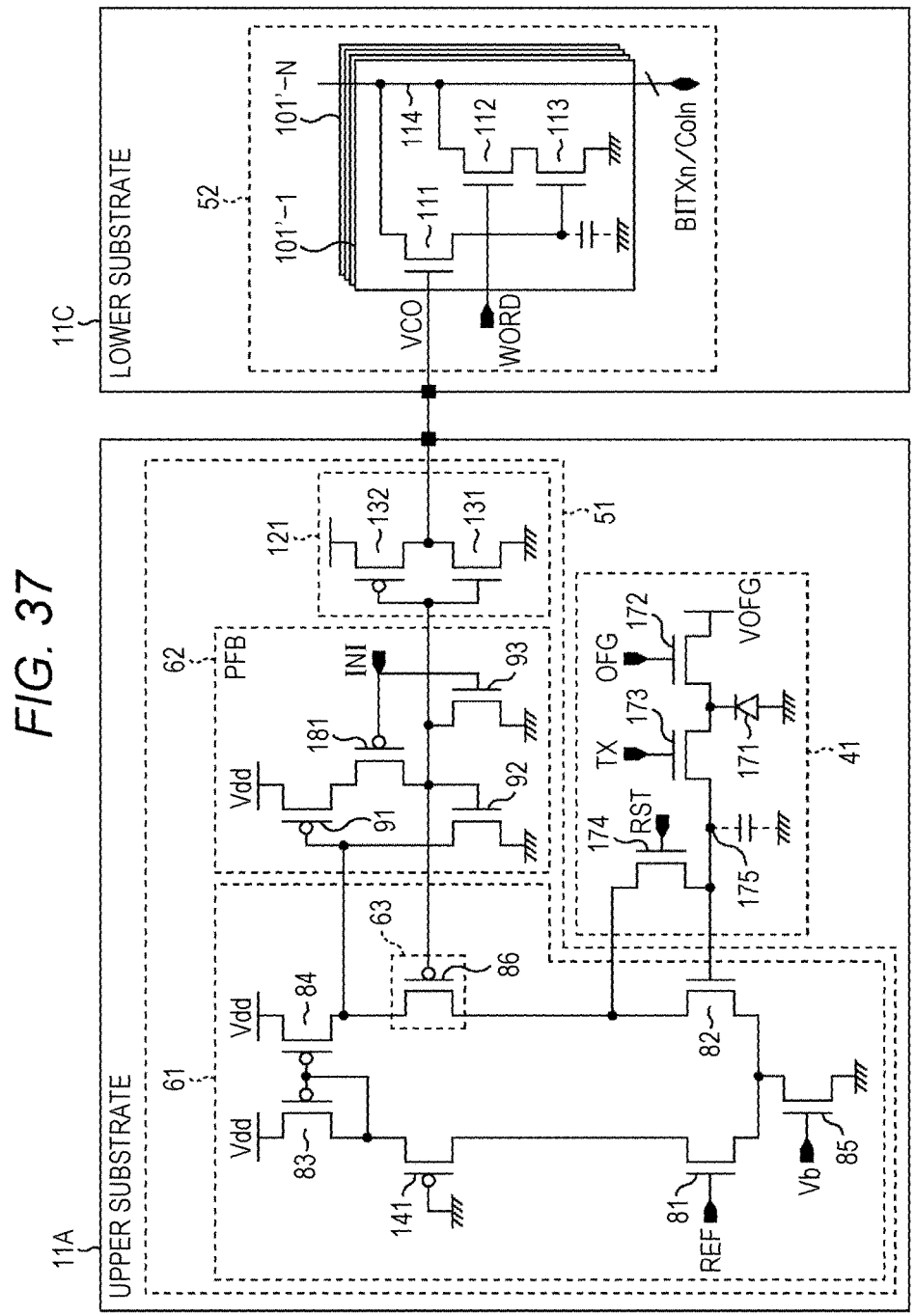
FIG. 37 is a diagram for explaining an example structure using two semiconductor substrates.

FIG. 37 shows a first example of a circuit structure formed on the upper substrate 11A and the lower substrate 11C.

The pixel circuit 41 and the circuit of the comparator 51 of the ADC 42 are formed on the upper substrate 11A. The circuit of the latch storage unit 52 of the ADC 42 is formed on the lower substrate 11C.

The circuit structure in FIG. 37 is a circuit structure representing the second embodiment of the pixel 21 shown in FIG. 20, but may be a circuit structure according to any other embodiment.

<Example Structure with Two Substrates 1-2>

Figure 38:
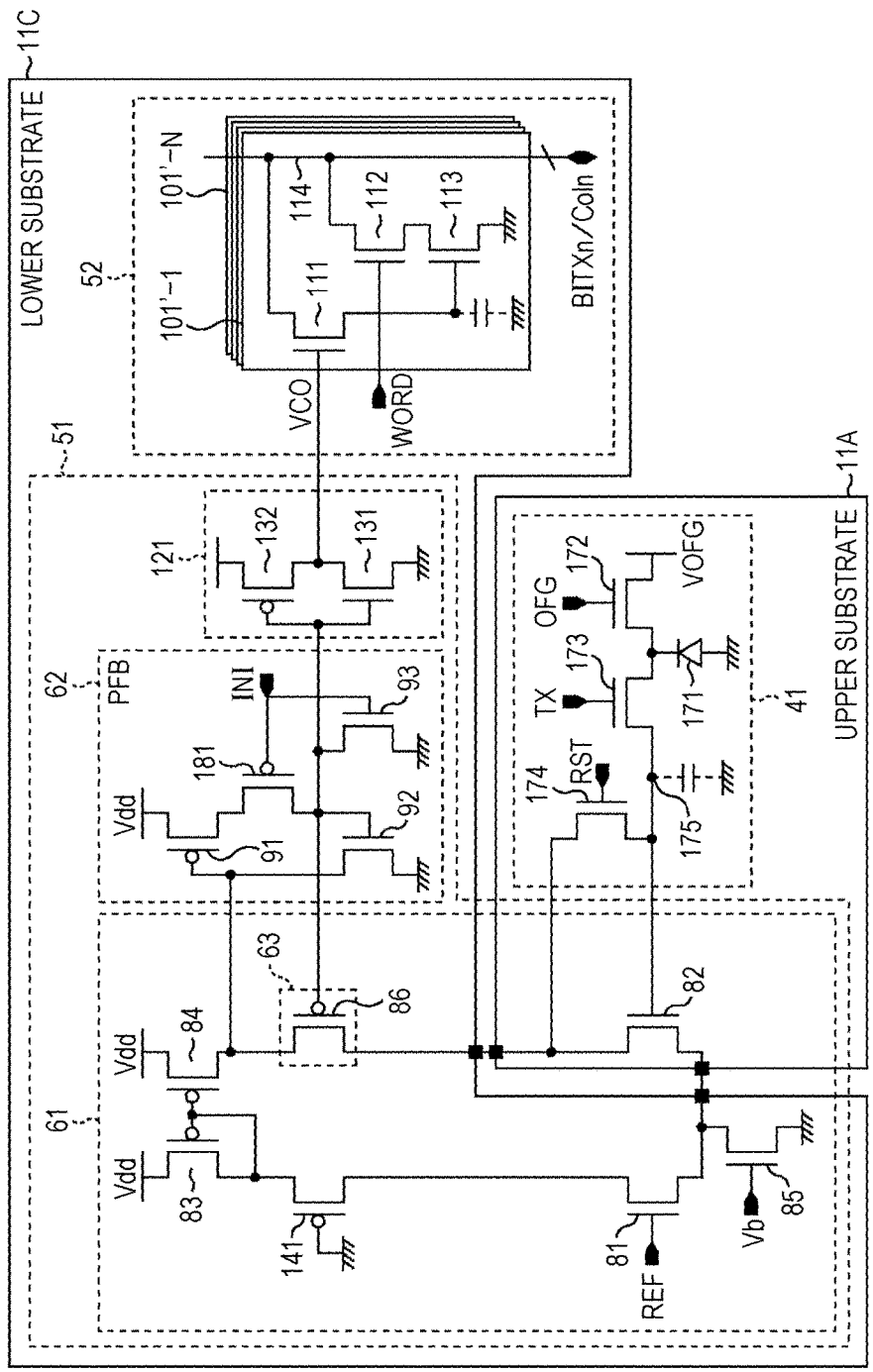
FIG. 38 is a diagram for explaining an example structure using two semiconductor substrates.

FIG. 38 shows a second example of a circuit structure formed on the upper substrate 11A and the lower substrate 11C.

The pixel circuit 41 and the circuit of the transistor 82 of the differential amplifier circuit 61 of the ADC 42 are formed on the upper substrate 11A. The circuit of the ADC 42, except for the transistor 82, is formed on the lower substrate 11C.

To maximize the aperture ratio of the pixel 21, the upper substrate 11A is made as similar as possible to the pixel circuit 41, as shown in FIG. 38. If there is a parasitic capacitance, the conversion efficiency of the FD 175 becomes lower. To counter this, the transistor 82 of the differential amplifier circuit 61 as well as the pixel circuit 41 is formed on the upper substrate 11A, as shown in FIG. 38.

In view of this, the divided circuit structure shown in FIG. 38 has a layout that prioritizes the sensitivity of the light receiving unit (photodiode 171).

<Example Structure with Two Substrates 1-3>

Figure 39:
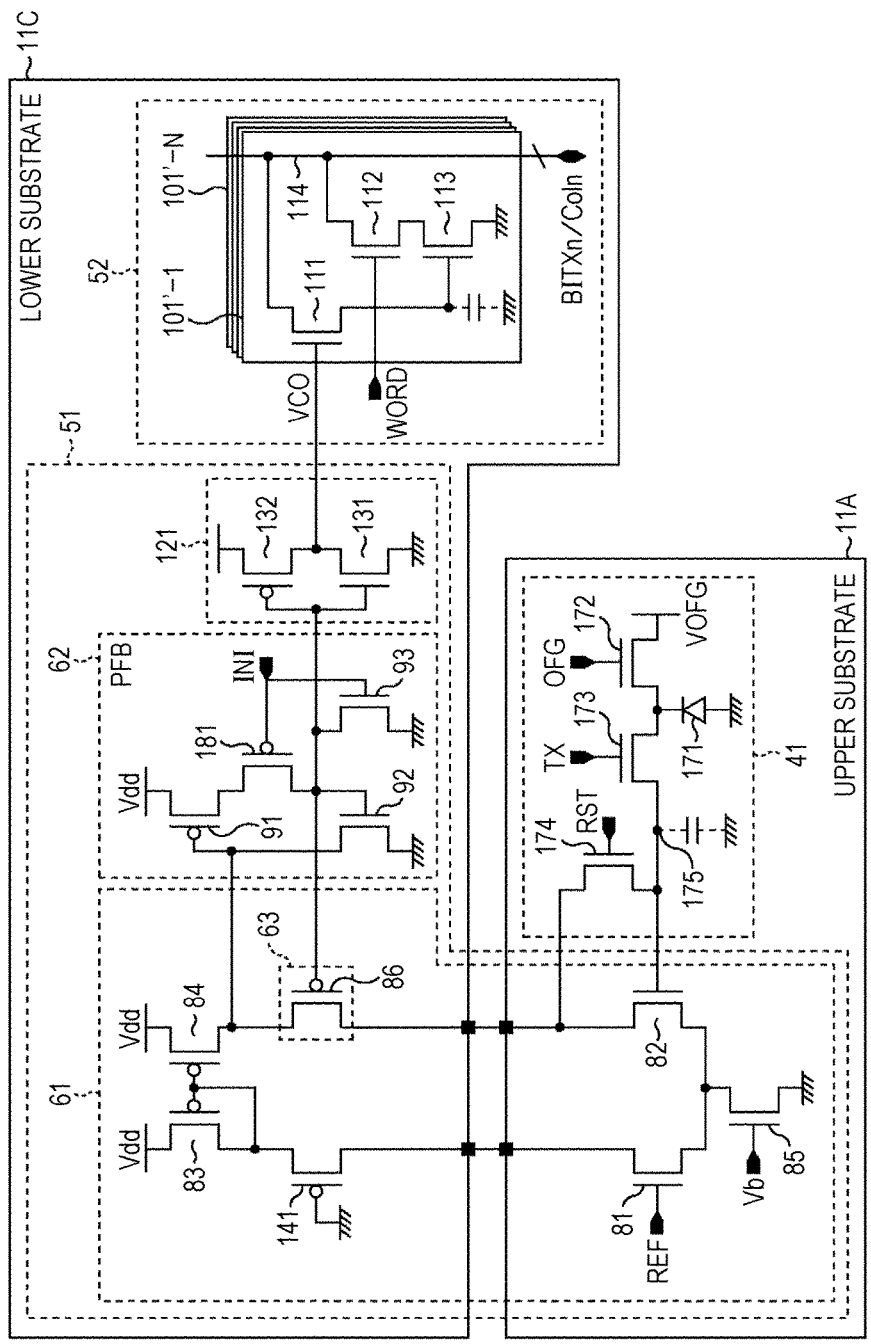
FIG. 39 is a diagram for explaining an example structure using two semiconductor substrates.

FIG. 39 shows a third example of a circuit structure formed on the upper substrate 11A and the lower substrate 11C.

The pixel circuit 41 and the circuit of the transistors 81, 82, and 85 of the differential amplifier circuit 61 of the ADC 42 are formed on the upper substrate 11A. The circuit of the ADC 42, except for the transistors 81, 82, and 85, is formed on the lower substrate 11C.

In the second circuit structure shown in FIG. 38, only the transistor 82 of the transistors 81 and 82 forming a differential pair in the differential amplifier circuit 61 is placed on the upper substrate 11A, and the transistor 81 is placed on the lower substrate 11C. As a result, a difference in characteristics might be caused. To avoid this in the third circuit structure, the transistors 81 and 85 of the differential amplifier circuit 61 are also formed on the upper substrate 11A.

In view of this, the divided circuit structure shown in FIG. 39 has a layout that minimizes the difference in characteristics.

<17. Structure with Multiple Substrates 2>

FIGS. 36 through 39 show examples in which the solid-state imaging device 1 is formed with two semiconductor substrates 11. However, the solid-state imaging device 1 can also be formed with three semiconductor substrates 11.

Figure 40:
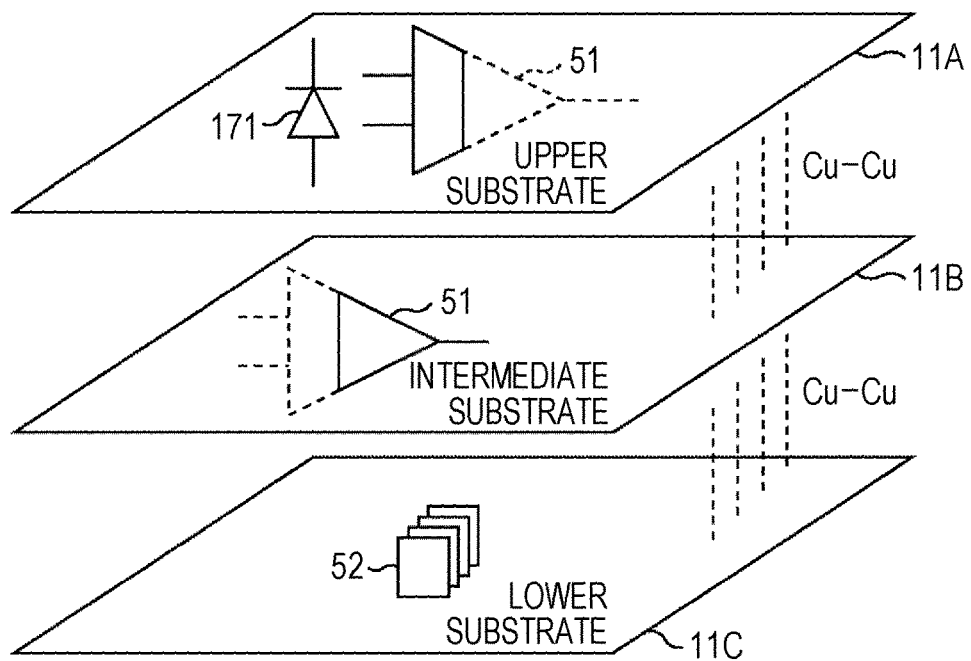
FIG. 40 is a diagram for explaining an example structure using three semiconductor substrates.

FIG. 40 is a conceptual diagram of the solid-state imaging device 1 formed by stacking the three semiconductor substrates 11 of an upper substrate 11A, an intermediate substrate 11B, and a lower substrate 11C.

At least the pixel circuit 41 including the photodiode 171 and part of the circuit of the comparator 51 are formed on the upper substrate 11A. At least the latch storage unit 52 including one or more latch circuits 101 is formed on the lower substrate 11C. The remaining circuit of the comparator 51 not placed on the upper substrate 11A is formed on the intermediate substrate 11B. The upper substrate 11A and the intermediate substrate 11B, and the intermediate substrate 11B and the lower substrate 11C are joined by metal bonds such as Cu—Cu.

Figure 41:
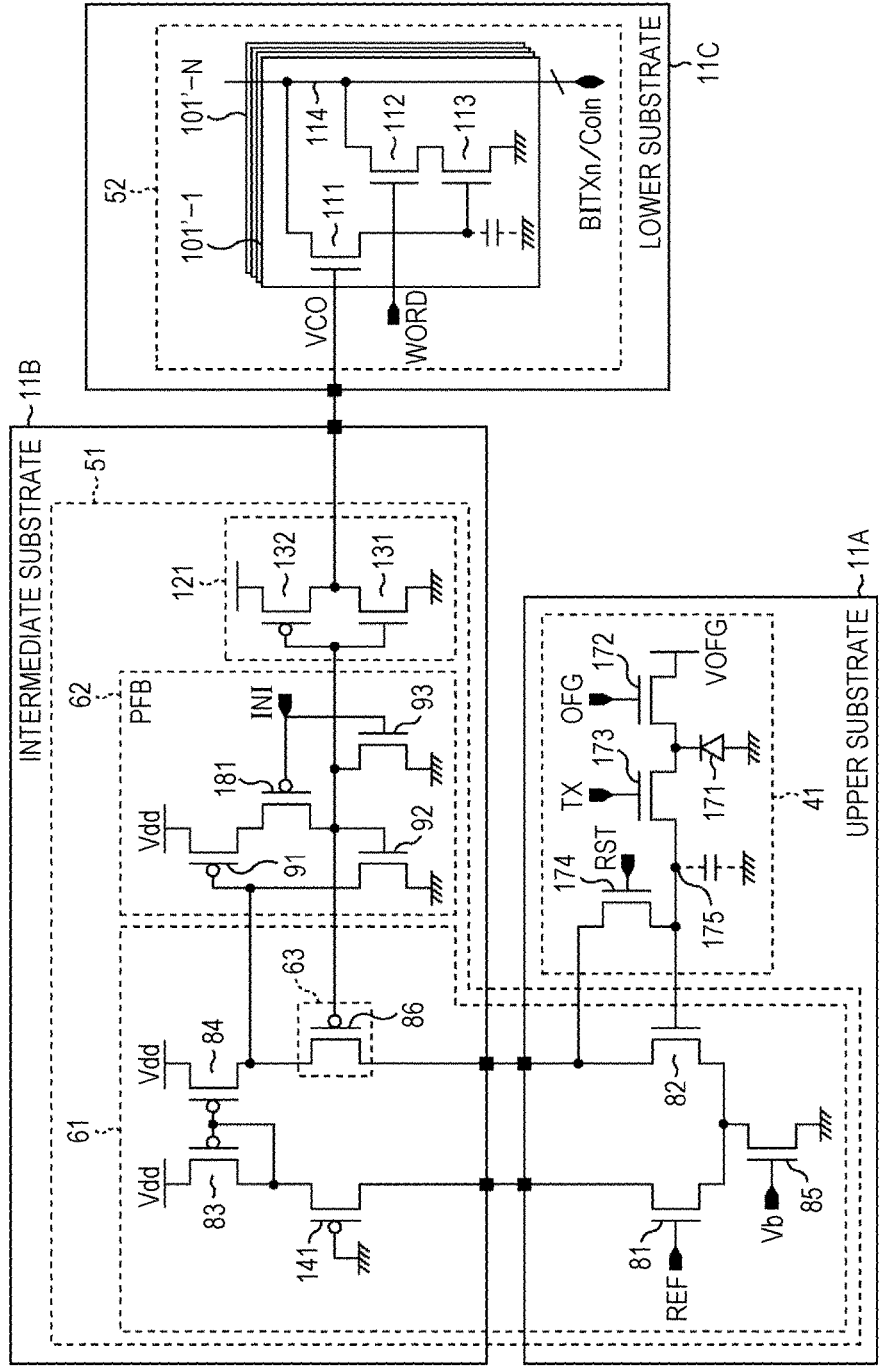
FIG. 41 is a diagram for explaining an example structure using three semiconductor substrates.

FIG. 41 shows an example of a circuit layout on the respective semiconductor substrates 11 in a case where the solid-state imaging device 1 is formed with the three semiconductor substrates 11.

In the example shown in FIG. 41, the circuit placed on the upper substrate 11A is the circuit of the upper substrate 11A shown in FIG. 39 that minimizes the difference in characteristics. The remaining circuit of the comparator 51 is placed on the intermediate substrate 11B, and the latch storage unit 52 is placed on the lower substrate 11C.

Figure 42:
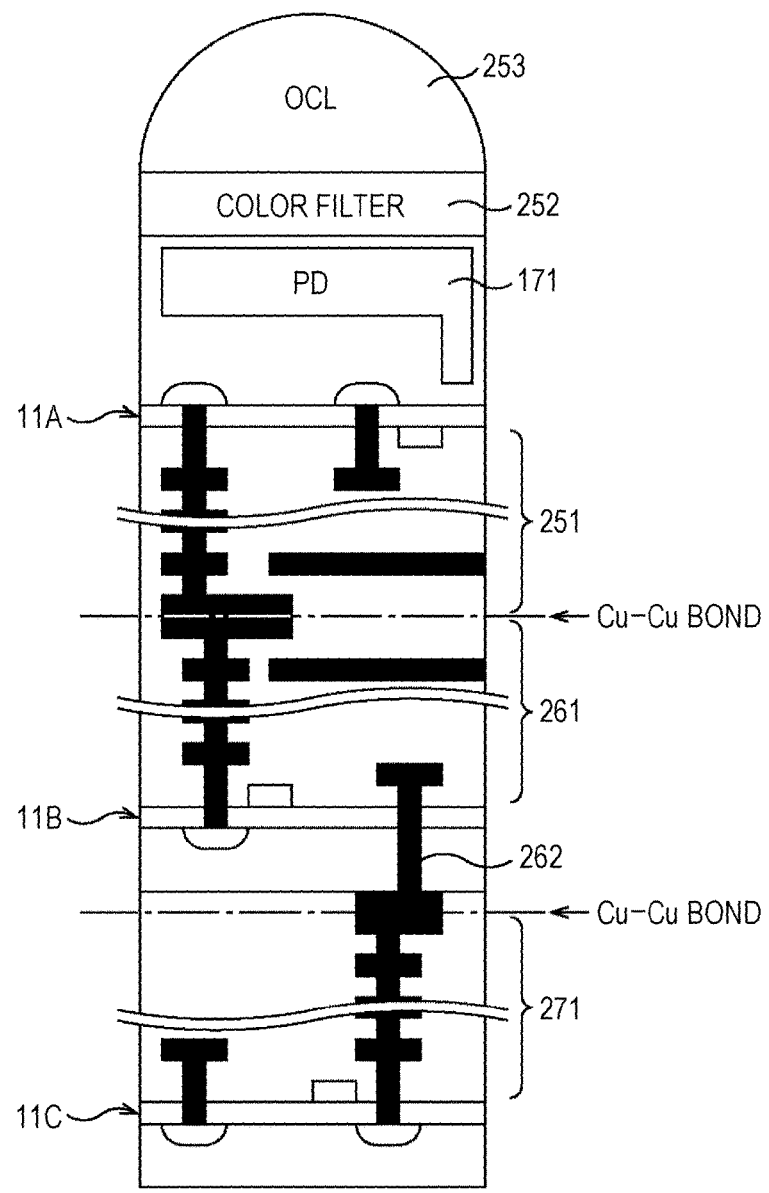
FIG. 42 is a diagram for explaining an example structure using three semiconductor substrates.

FIG. 42 is a schematic cross-sectional view in a case where the solid-state imaging device 1 is formed with the three semiconductor substrates 11.

The upper substrate 11A is of a back-illuminated type, having the photodiode 171, a color filter 252, an on-chip lens (OCL) 253, and the like formed on the back surface on the opposite side from the front surface on which an interconnect layer 251 is formed.

The interconnect layer 251 of the upper substrate 11A is joined to an interconnect layer 261 on the front surface side of the intermediate substrate 11B by a Cu—Cu bond.

The intermediate substrate 11B and the lower substrate 11C are joined by a Cu—Cu bond between an interconnect layer 271 formed on the front surface side of the lower substrate 11C and a connecting line 263 of the intermediate substrate 11B. The connecting line 263 of the intermediate substrate 11B is connected to the interconnect layer 261 on the front surface side of the intermediate substrate 11B by a through electrode 262.

In the example shown in FIG. 42, the interconnect layer 261 on the front surface side of the intermediate substrate 11B is joined to and faces the interconnect layer 251 of the upper substrate 11A. However, the intermediate substrate 11B may be reversed so that the interconnect layer 261 of the intermediate substrate 11B is joined to and faces the interconnect layer 271 of the lower substrate 11C.

<18. Structure with Multiple Substrates 3>

Figure 43:
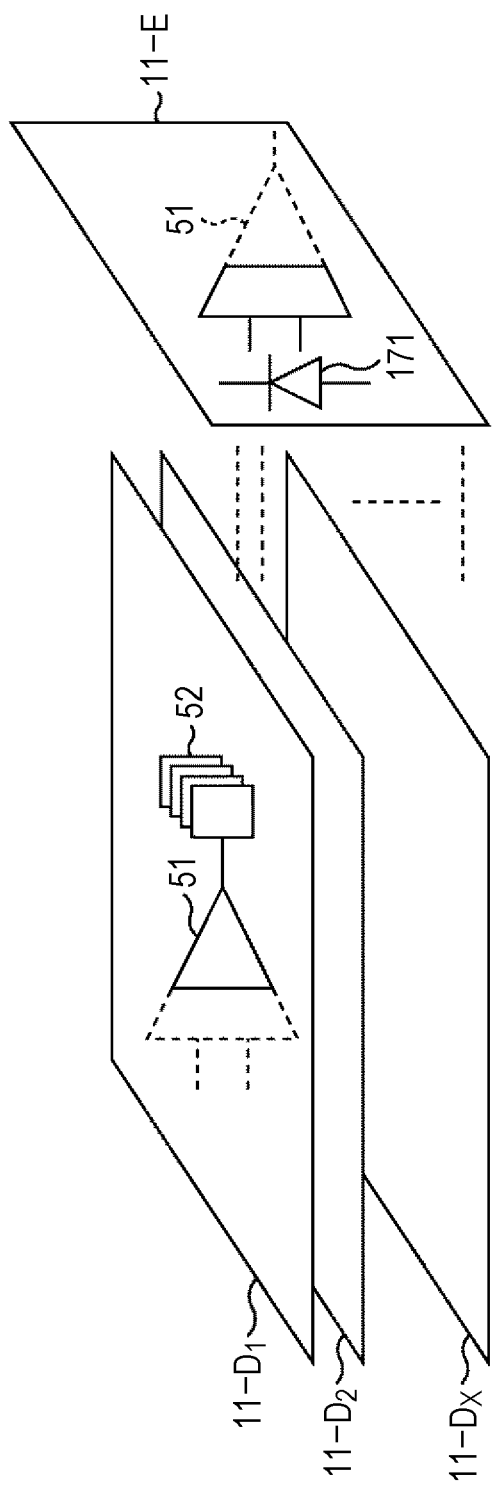
FIG. 43 is a diagram for explaining an example structure using a side substrate.

FIG. 43 is another conceptual diagram of the solid-state imaging device 1 formed with semiconductor substrates 11.

As shown in FIG. 43, the solid-state imaging device 1 is formed by bonding a semiconductor substrate 11-E (hereinafter referred to as the side substrate 11-E) to the sidewalls of semiconductor substrates $11\text{-}D_1$ through $11\text{-}D_x$ (hereinafter referred to as the stacked substrates $11\text{-}D_1$ through $11\text{-}D_x$, x>1).

Figure 44:
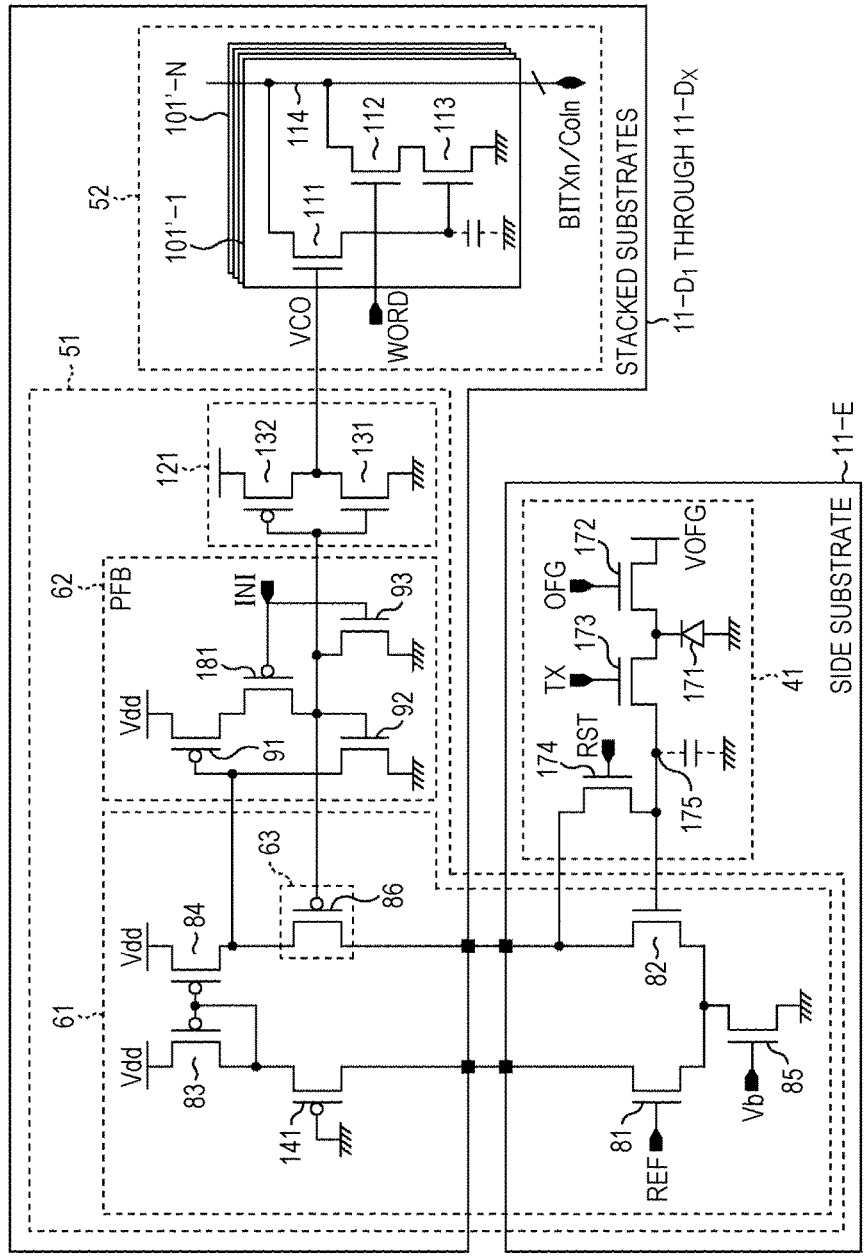
FIG. 44 is a diagram for explaining an example structure using a side substrate.

FIG. 44 shows an example of a circuit layout on the respective semiconductor substrates 11 in a case where the solid-state imaging device 1 is formed as shown in FIG. 43.

As shown in FIG. 44, the pixel circuit 41 and the circuit of the transistors 81, 82, and 85 of the differential amplifier circuit 61 of the ADC 42 are formed on the side substrate 11-E.

The circuit of the ADC 42, except for the transistors 81, 82, and 85, is appropriately divided among the stacked substrates $11\text{-}D_1$ through $11\text{-}D_x$.

In the substrate structure shown in FIG. 43, the light receiving unit (photodiode 171) is formed on the side substrate 11-E, and accordingly, the area restriction that limits the circuit area to approximately the same as the area (region) of the pixel 21 is eliminated from the stacked substrates $11\text{-}D_1$ through $11\text{-}D_x$. Thus, instead of the latch circuits 101, a count-up/down counter circuit that is capable of a CDS process, and a signal processor circuit for improving characteristics, such as a correction processor circuit, can be formed on the stacked substrates $11\text{-}D_1$ through $11\text{-}D_x$.

The stacked substrates $11\text{-}D_1$ through $11\text{-}D_x$ are manufactured as substrates having the same characteristics through the same process. When the stacked substrates $11\text{-}D_1$ through $11\text{-}D_x$ are stacked, IDs for identification are assigned to the respective stacked substrates 11-D. For example, predetermined IDs are written into nonvolatile memories formed in the stacked substrates 11-D during the process of test assembling, so that the IDs for identifying the respective stacked substrates 11-D are assigned. When the solid-state imaging device 1 is driven and controlled, control is performed by referring to the IDs assigned to the respective stacked substrates 11-D, so that collision of control is avoided.

Figure 45:
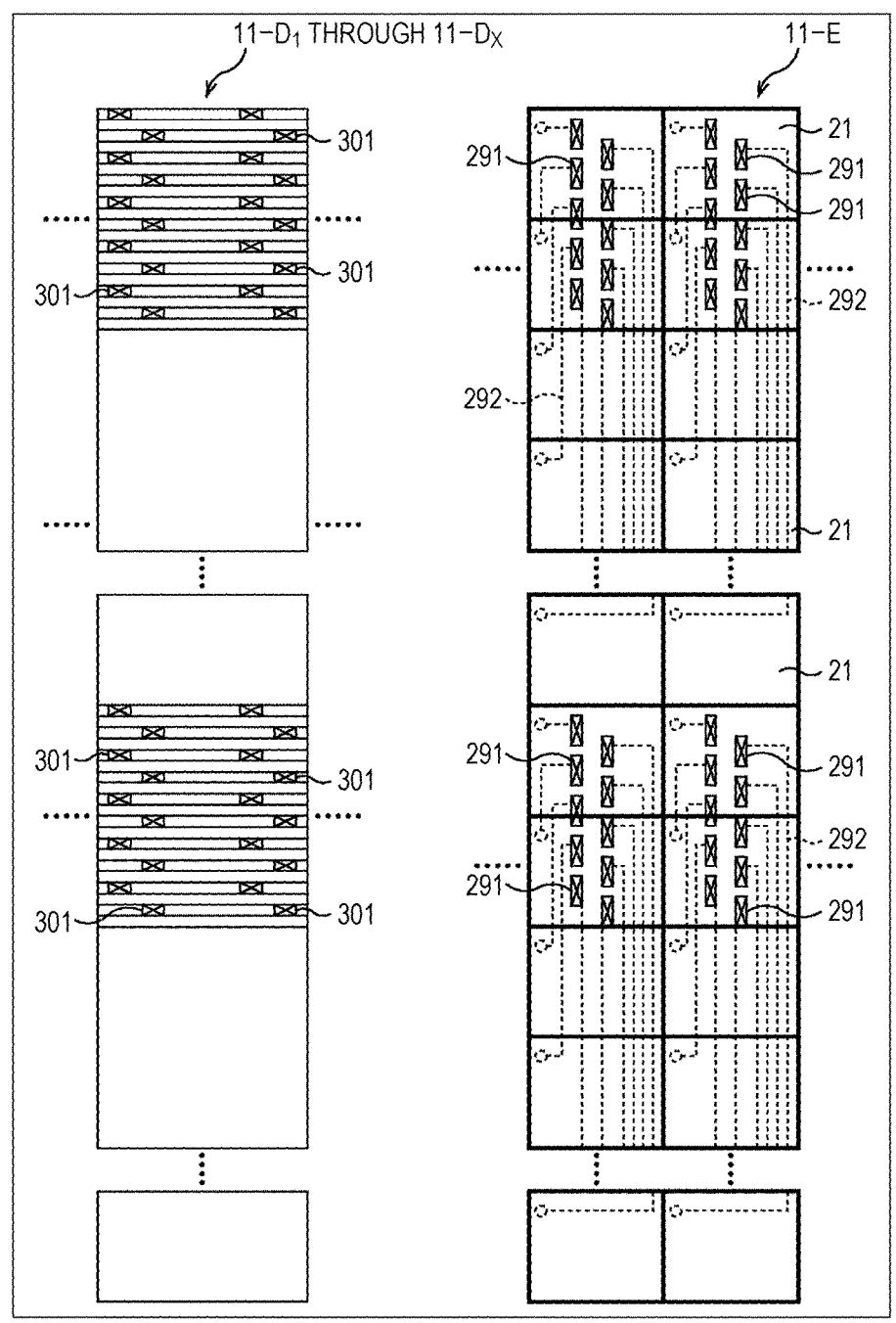
FIG. 45 is a diagram for explaining an example structure using a side substrate.

FIG. 45 is a cross-sectional view of the joint surfaces of the stacked substrates $11\text{-}D_1$ through $11\text{-}D_x$ and the side substrate 11-E.

The pixel signals SIG generated at the photodiodes 171 of the respective pixels 21 of the side substrate 11-E are drawn to connecting units 291 gathered in a predetermined region on the joint surface of the side substrate 11-E by interconnecting lines 292.

On the joint surfaces of the stacked substrates $11\text{-}D_1$ through $11\text{-}D_x$, connecting units 301 are also formed in the positions corresponding to the respective connecting units 291 on the joint surface of the side substrate 11-E.

The connecting units 291 of the side substrate 11-E and the connecting units 301 of the stacked substrates $11\text{-}D_1$ through $11\text{-}D_x$, in the corresponding positions are connected by Cu—Cu bonds, for example.

As for the shapes of the connecting units 291 and the connecting units 301, the connecting units 291 or the connecting units 301 are vertically long, and the others are horizontally long, so as to allow some margin for error.

As described above with reference to FIGS. 36 through 45, the solid-state imaging device 1 is formed by stacking semiconductor substrates 11. With this, the area occupied in the horizontal direction can be moved in the vertical direction, and the degree of freedom in interconnecting becomes higher. In the semiconductor substrate 11 on which the photodiodes 171 are placed, a large light receiving area can be secured in each photodiode 171, and accordingly, photosensitivity can be increased.

<19. Fifth Embodiment of the Pixel Unit>
<Simultaneously Output of P-Phase Data and D-Phase Data>

Figure 46:
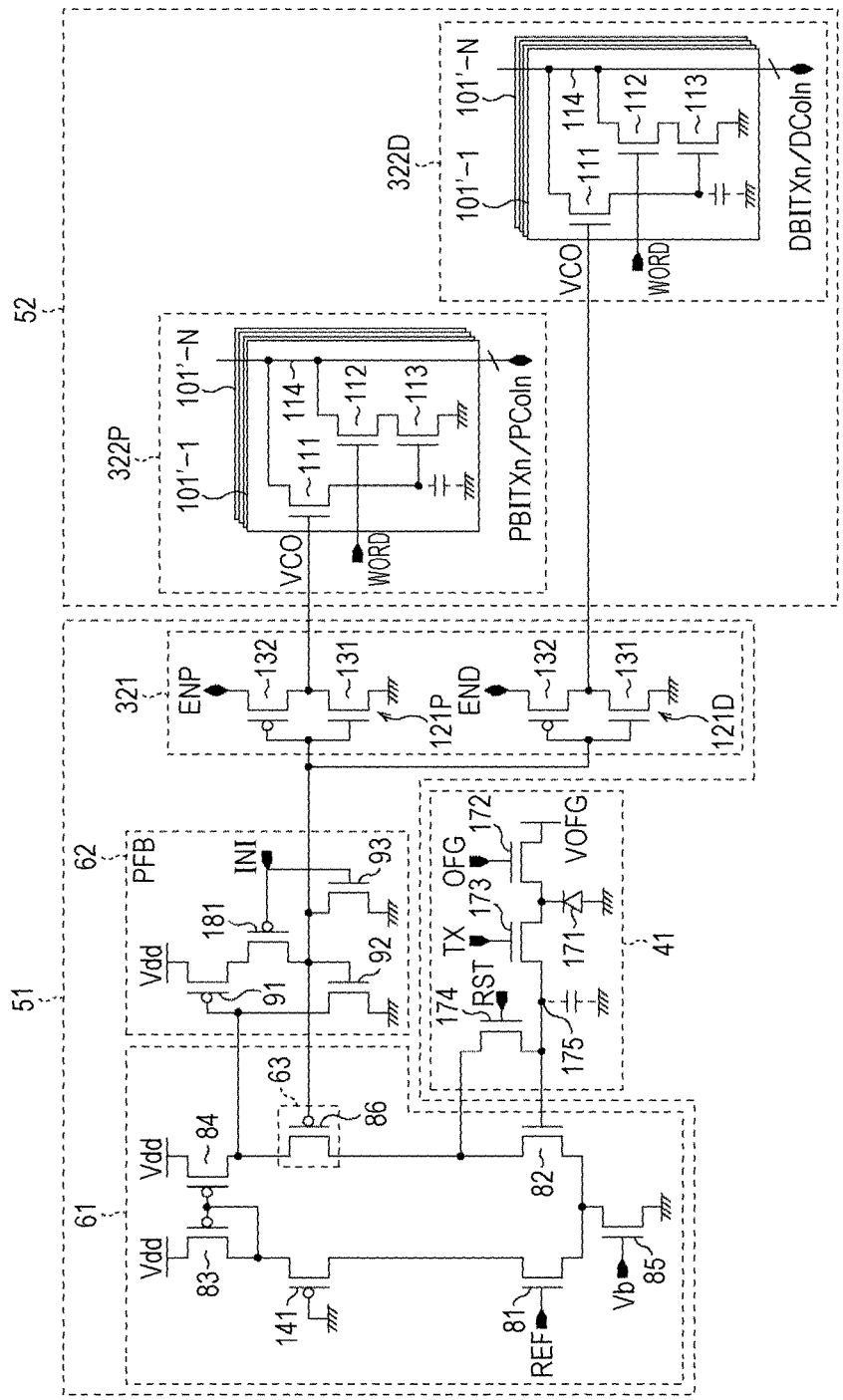
FIG. 46 is a circuit diagram showing a fifth embodiment of a pixel.

FIG. 46 is a circuit diagram showing a fifth embodiment of the pixel 21.

In each of the above described embodiments, P-phase data and D-phase data are output in order. However, the pixel 21 according to the fifth embodiment shown in FIG. 46 is designed to simultaneously output P-phase data and D-phase data.

The differences between the structure of the pixel 21 according to the fifth embodiment shown in FIG. 46 and the structure of the pixel 21 according to the second embodiment shown in FIG. 20 are now described.

In the comparator 51 shown in FIG. 46, a multiplexer 321 is provided in the stage after the positive feedback circuit 62, and the multiplexer 321 includes an inverter 121P for P-phase data and an inverter 121D for D-phase data. Here, a control signal ENP is supplied to the source of the PMOS transistor 132 of the inverter 121P for P-phase data, and a control signal END is supplied to the source of the PMOS transistor 132 of the inverter 121D for D-phase data.

The latch storage unit 52 also includes a P-phase latch unit 322P for P-phase data and a D-phase latch unit 322D for D-phase data. Both the P-phase latch unit 322P for P-phase data and the D-phase latch unit 322D for D-phase data are formed with latch circuits 101'-1 through 101'-N.

The inverter 121P for P-phase data outputs an output signal VCOP for P-phase data to the P-phase latch unit 322P, and the latch circuit 101-*n* of the P-phase latch unit 322P outputs a latch signal PColn based on a code input signal PBITXn that is input thereto.

The inverter 121D for D-phase data outputs an output signal VCOD for D-phase data to the D-phase latch unit 322D, and the latch circuit 101-*n* of the D-phase latch unit 322D outputs a latch signal DColn based on a code input signal DBITXn that is input thereto.

P-phase data and D-phase data can be simultaneously output with any structure in which the P-phase latch unit 322P for P-phase data and the D-phase latch unit 322D for D-phase data are prepared, and the multiplexer 321 is provided as the input for the latch units, as described above. To increase area efficiency, the voltages to be supplied to the sources of the inverter 121P for P-phase data and the inverter 121D for D-phase data are preferably controlled as described above.

In a case where P-phase data and D-phase data can be simultaneously output, the memory for storing P-phase data is unnecessary in the circuit in the later stage as the output destination.

<Pixel Unit Timing Chart>

Figure 47:
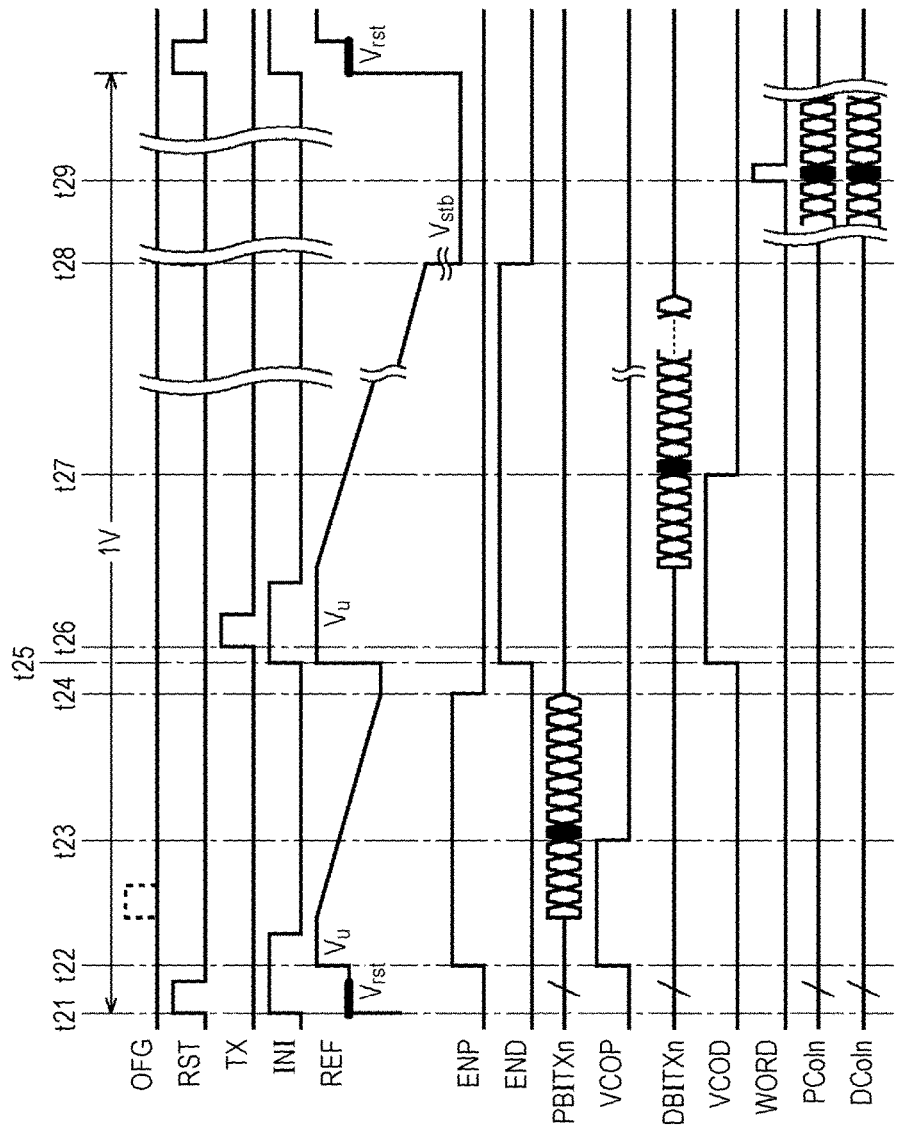
FIG. 47 is a timing chart for explaining operation of the pixel according to the fifth embodiment.

Referring now to the timing chart in FIG. 47, operation of the pixel 21 that simultaneously outputs P-phase data and D-phase data as shown in FIG. 46 is described.

First, at time t21, the reference signal REF is set the reset voltage $V_{rst}$ for resetting the charge in the FD 175, and the reset transistor 174 is turned on, so that the charge in the FD 175 is reset. At time t21, the initialization signal INI to be supplied to the gate of the transistor 93 of the positive feedback circuit 62 is set at Hi, so that the positive feedback circuit 62 is put into the initial state.

At time t22, the reference signal REF is boosted to a predetermined voltage $V_u$. Also, the control signal ENP to be supplied to the source of the PMOS transistor 132 of the inverter 121P for P-phase data is switched to Hi, and the inverter 121P for P-phase data outputs the output signal VCOP in accordance with the result of comparison between the reference signal REF and the pixel signal SIG. At this point of time, the reference signal REF is larger than the pixel signal SIG, and therefore, the output signal VCOP is Hi.

At time t23 when the reference signal REF and the pixel signal SIG are determined to be equal, the output signal VCOP is inverted (to Low). As the output signal VCOP is inverted, the speed of inversion of the output signal VCOP is increased by the positive feedback circuit 62. The latch circuit 101'-*n* (n being 1 to N) of the P-phase latch unit 322P for P-phase data stores the data PLATn at the time when the output signal VCO is inverted. That is, the latch circuits 101' of all the pixels in the pixel array unit 22 store the data PLATn.

At time t24, the control signal ENP to be supplied to the source of the PMOS transistor 132 of the inverter 121P for P-phase data is switched to Low, and the output of the inverter 121P for P-phase data is turned off.

At time t25, the reference signal REF is again boosted to the predetermined voltage Va. Also, the control signal END to be supplied to the source of the PMOS transistor 132 of the inverter 121D for D-phase data is switched to Hi, and the inverter 121D for D-phase data outputs the output signal VCOD in accordance with the result of comparison between the reference signal REF and the pixel signal SIG. At this point of time, the reference signal REF is larger than the pixel signal SIG, and therefore, the output signal VCOD is Hi.

At time t25, the initialization signal INI to be supplied to the gate of the transistor 93 of the positive feedback circuit 62 is set at Hi, so that the positive feedback circuit 62 is put back into the initial state.

At time t26, the transfer transistor 173 of the pixel circuit 41 is turned on, and the charge generated at the photodiode 171 is transferred to the FD 175.

At time t27 when the reference signal REF and the pixel signal SIG are determined to be equal, the output signal VCOD is inverted (to Low). As the output signal VCOD is inverted, the speed of inversion of the output signal VCOD is increased by the positive feedback circuit 62. The latch circuit 101'-*n* (n being 1 to N) of the D-phase latch unit 322D for D-phase data stores the data DLATn at the time when the output signal VCO is inverted. That is, the latch circuits 101' of all the pixels in the pixel array unit 22 store the data DLATn.

At time t28, the control signal END to be supplied to the source of the PMOS transistor 132 of the inverter 121D for D-phase data is switched to Low, and the output of the inverter 121D for D-phase data is turned off.

At time t28, the signal write period ends, and the signal read period then starts. Therefore, at time t28, the voltage of the reference signal REF to be supplied to the gate of the transistor 81 of the comparator 51 is lowered to the level (standby voltage $V_{stb}$) at which the transistor 81 is turned off. With this, the current to be consumed by the comparator 51 during the signal read period is reduced.

At time t29, the control signal WORD is switched to Hi, the data PLATn held in the P-phase latch unit 322P for P-phase data is output as the latch signal PColn (n being 1 to N), and the data DLATn held in the D-phase latch unit 322D for D-phase data is output as the latch signal DColn (n being 1 to N). That is, P-phase data and D-phase data are simultaneously output.

Through this operation, not only are the effects of the solid-state imaging device 1 according to each of the above described embodiments achieved, but P-phase data and D-phase data can also be simultaneously output.

<Example Structure in Which Pixel Sensitivity Is Variable>

The area of a pixel 21 according to the present disclosure is determined by the comparator 51 provided in the pixel 21, and therefore, the area of the pixel 21 might become larger than that in a conventional CMOS image sensor in which any comparator 51 is not provided. In a case where the area of each pixel 21 is large, and the quantity of signal charge is large, the conversion efficiency of each pixel 21 needs to be lowered. If the conversion efficiency is made too low, the sensitivity in a low illuminance condition becomes poorer, and the S/N becomes lower.

To counter this, a structure capable of adjusting the capacitance of the FD 175 may be employed so that the conversion efficiency of each pixel 21 can be changed as necessary.

Figure 48:
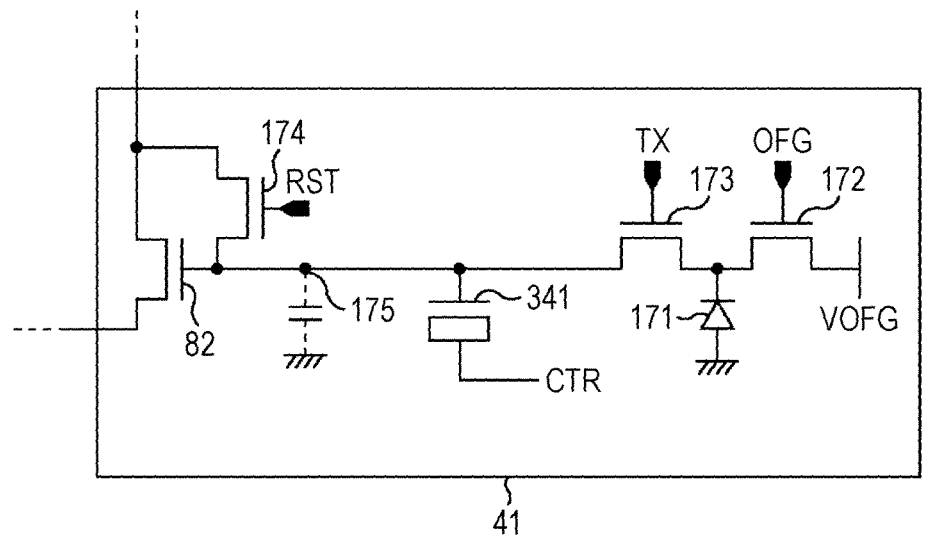
FIG. 48 is a circuit diagram showing a first example structure in which pixel sensitivity is variable.

FIG. 48 is a circuit diagram showing a first example structure of the pixel circuit 41 that enables the capacitance of the FD 175 to vary.

In FIG. 48, an NMOS transistor 341 is further provided between the transfer transistor 173 and the FD 175. The gate of the NMOS transistor 341 is connected to the drain of the transfer transistor 173 and one end of the FD 175, and a control signal CTR is supplied to the source and the drain of the NMOS transistor 341.

Figure 49:
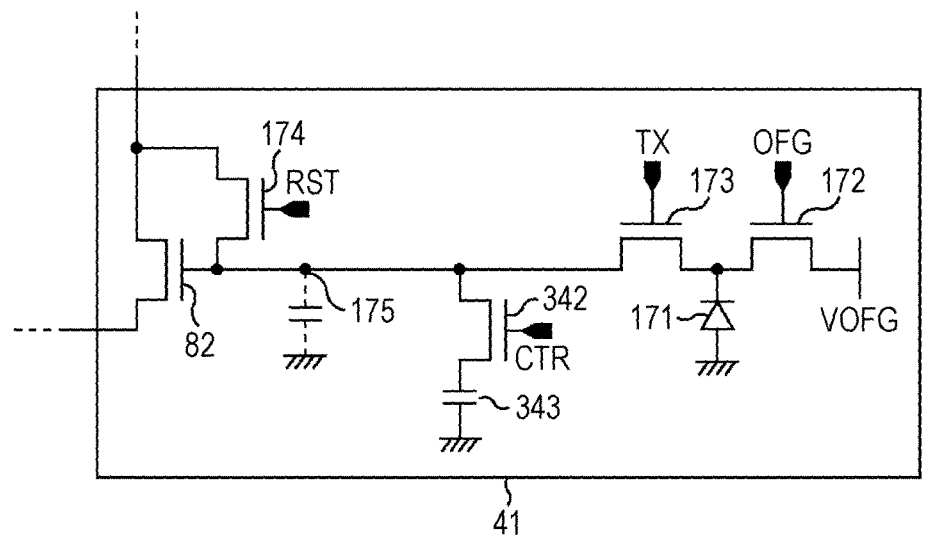
FIG. 49 is a circuit diagram showing a second example structure in which pixel sensitivity is variable.

FIG. 49 is a circuit diagram showing a second example structure of the pixel circuit 41 that enables the capacitance of the FD 175 to vary.

In FIG. 49, an NMOS transistor 342 and a capacitor 343 are further provided between the transfer transistor 173 and the FD 175. One end of the capacitor 343 is connected to GND, and the other end is connected to the source of the NMOS transistor 342. The drain of the NMOS transistor 342 is connected to the drain of the transfer transistor 173 and one end of the FD 175, and a control signal CTR is supplied to the gate of the NMOS transistor 342.

In either of the structures shown in FIGS. 48 and 49, the capacitance of the FD 175 can be made to vary in accordance with the voltage (Hi or Low) of the control signal CTR, and saturation in a high illuminance condition can be prevented.

<Slope Inclination Change Control on the Reference Signal REF>

With the structure of a pixel 21 according to the present disclosure, the solid-state imaging device 1 reads P-phase data and D-phase data individually, and accordingly, can obtain individual digital data prior to the CDS process.

Figure 50:
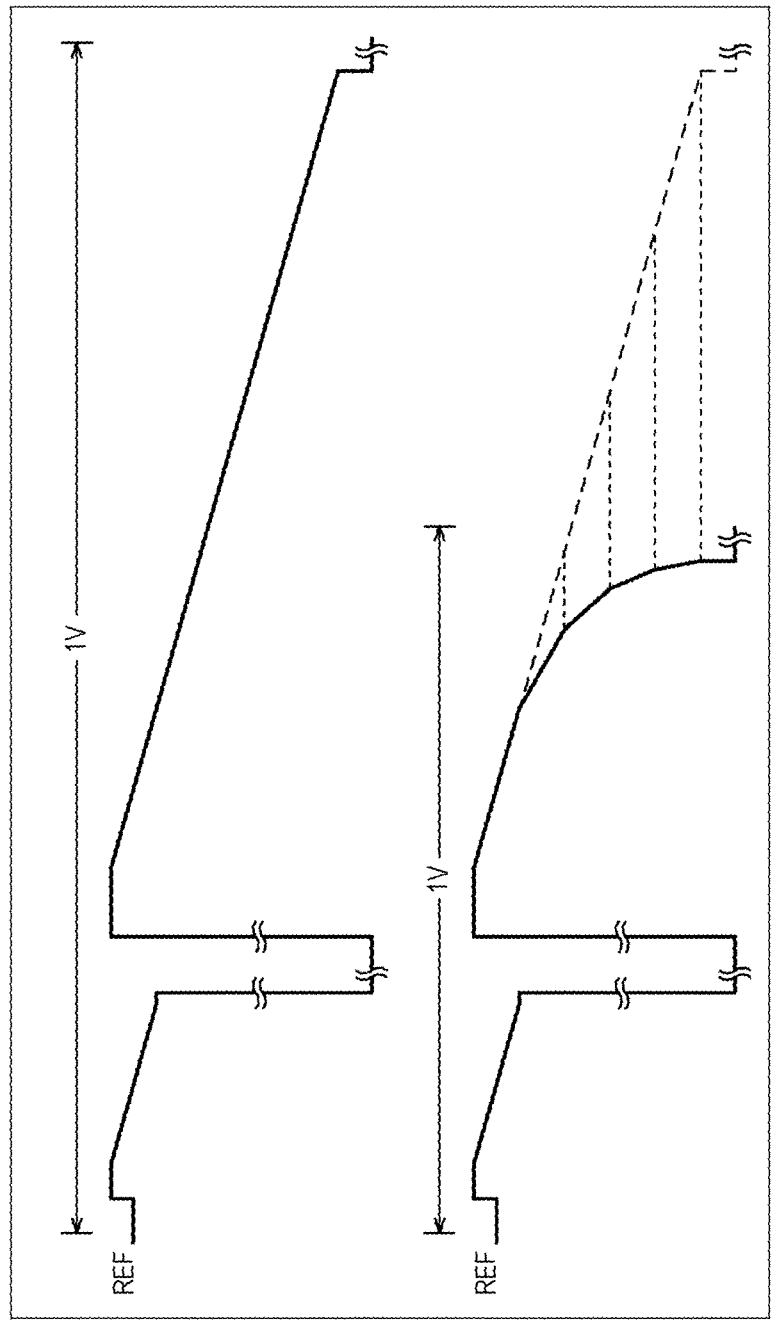
FIG. 50 is a diagram for explaining control to change the slope inclination.

The DAC 24 of the solid-state imaging device 1 can change the slope inclination (voltage change rate) of the reference signal REF at least once in 1 V, as shown in FIG. 50.

The upper half of FIG. 50 shows an example case where the slope inclination of the reference signal REF is not changed, and the lower half of FIG. 50 shows an example case where the slope inclination of the reference signal REF is changed four times in a D-phase data acquisition period. As is apparent from FIG. 50, in the case where the slope inclination of the reference signal REF is changed, the time of 1 V is shortened, and the speed of the AD conversion process can be increased accordingly.

A high-illuminance signal is inherently affected by shot noise, and, by virtue of gamma processing in a later stage, low resolution does not stand out. In view of this, influence of changes in the slope inclination is small. If the slope inclination is changed in a case where P-phase data and D-phase data are not read separately from each other, the code at the connecting point of the slope is affected by the P-phase inversion distribution, and becomes unclear. As a result, the connecting point cannot be extracted. In a case where P-phase data and D-phase data are read separately from each other, on the other hand, the connecting point at a time when the slope inclination of the reference signal REF is changed is apparent from acquired data, and thus, signal restoration can be performed in a later stage.

<Frequency Change Control on the Code Input Signal BITXn>

For the same reason as the reason that the slope inclination of the reference signal REF can be changed, the frequency of the code input signal BITXn can be changed at least once in 1 V.

Figure 51:
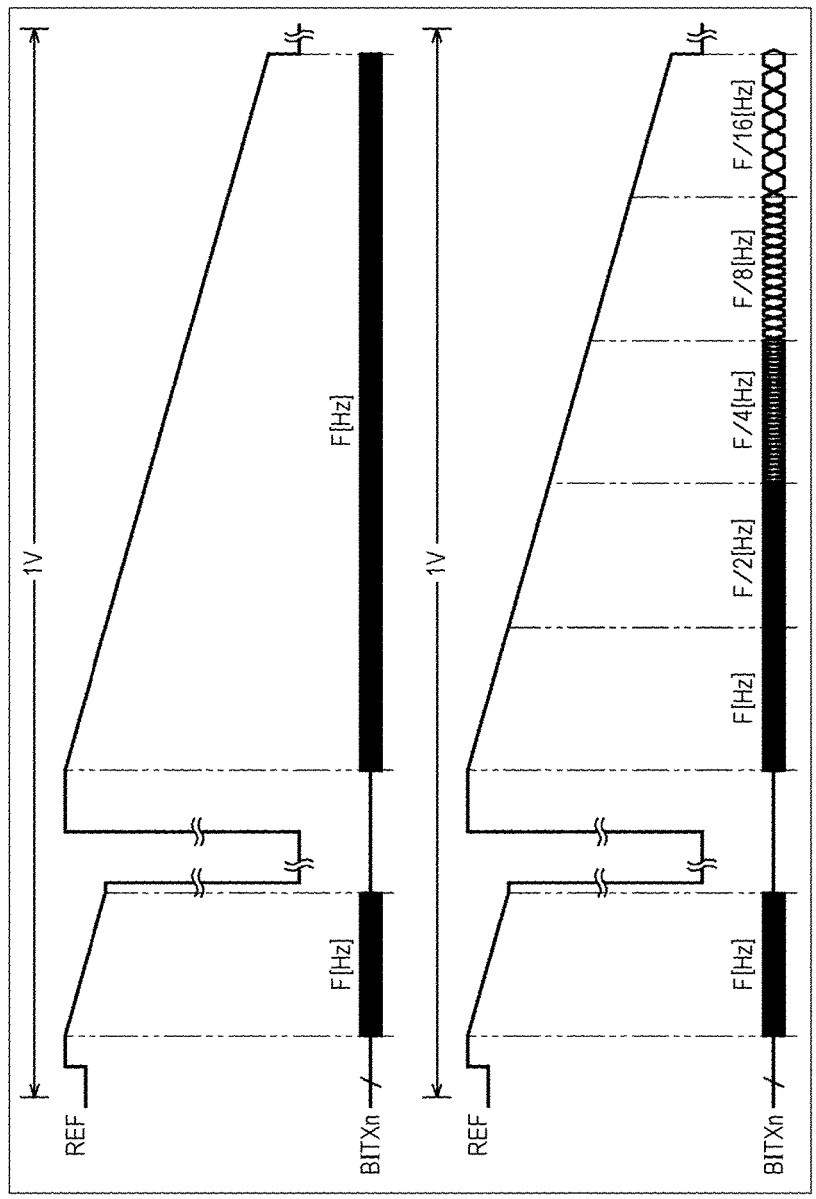
FIG. 51 is a diagram for explaining control to change the frequency of a code input signal.

The upper half of FIG. 51 shows an example case where the frequency of the code input signal BITXn is not changed, and the lower half of FIG. 51 shows an example case where the frequency of the code input signal BITXn is changed four times in a D-phase data acquisition period.

Although there is no effect to shorten the AD conversion process time as in the case where the slope inclination of the reference signal REF is changed, the number of counter bits can be reduced (high-order bits may not be held) by changing the frequency of the code input signal BITXn. Consequently, the circuit mounting area of the counter can be increased. Also, there is the effect to reduce electric power, as the number of clock transitions is reduced.

<Addition of Decoupling Capacitance>

With the structure of a pixel 21 according to the present disclosure, all the circuits operate substantially at the same time, and therefore, an instantaneous current might be generated due to the circuit operations.

Figure 52:
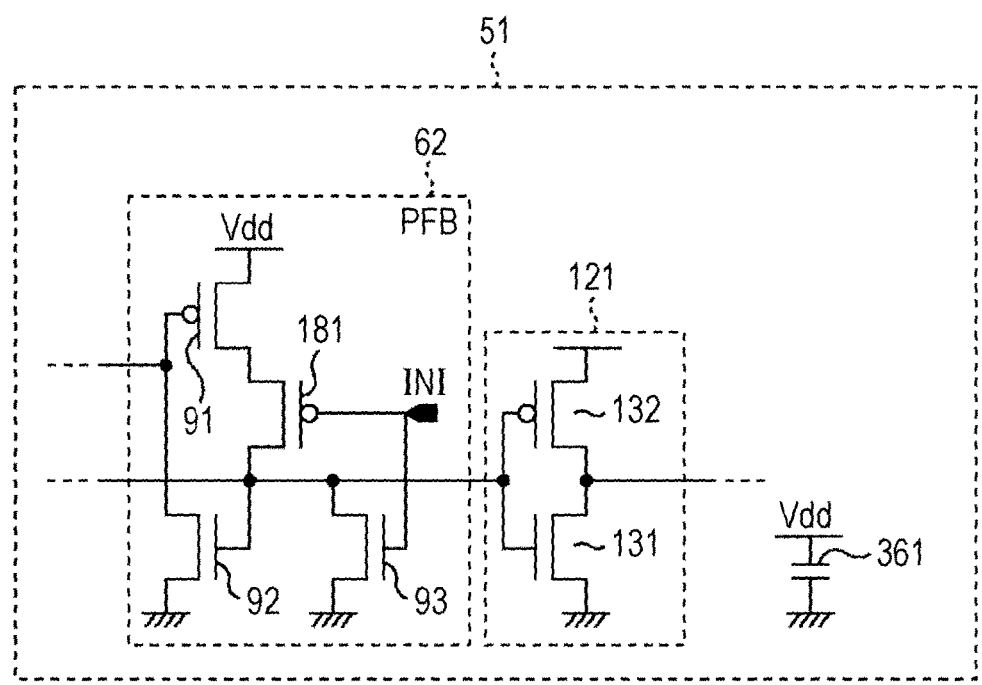
FIG. 52 is a diagram for explaining addition of a decoupling capacity.

To counter this, a capacitor 361 for restraining instantaneous currents may be provided as shown in FIG. 52.

The capacitor 361 is provided between GND and the power supply voltage Vdd of the inverter 121 and the positive feedback circuit 62 that generates a large instantaneous current. Due to the restrictions on the area and the process at the time of formation, the capacitor 361 may be a MOS capacitor formed with a transistor, for example, but is not limited to that.

One single capacitor 361 may be shared between the positive feedback circuit 62 and the inverter 121, or one capacitor 361 may be provided for each of the positive feedback circuit 62 and the inverter 121. If the restriction on area is strict, one capacitor 361 may be shared between two comparators 51.

<Bit Number Slope Input>

In each of the above described embodiments, the latch storage unit 52 of the ADC 42 includes N memories (the latch circuits 101-1 through 101-N) corresponding to the number of bits, and one slope signal (the reference signal REF) is input to the N memories in parallel.

However, the ADC 42 according to the present disclosure can input the slope signal (reference signal REF) the same number of times as the number of bits (N times), as disclosed in Non-Patent Document 1. In this case, the latch storage unit 52 of the ADC 42 includes only one (1-bit) latch circuit 101.

Figure 53:
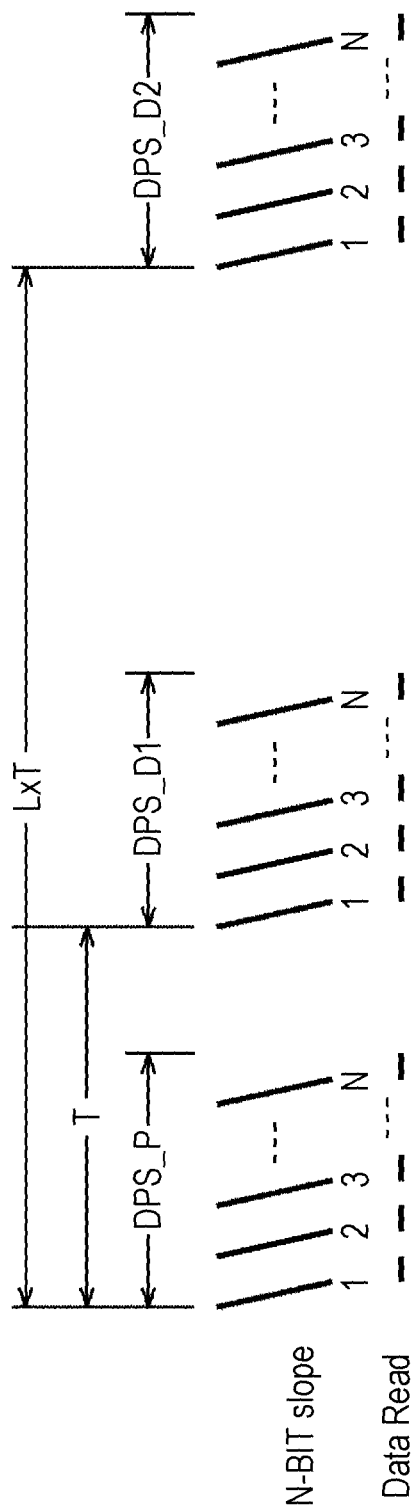
FIG. 53 is a diagram for explaining driving by bit-number slope inputs.

FIG. 53 is a timing chart schematically showing the drive control (the relationship between the slope signal and reading of 1-bit data) in a case where the slope signal is input N times in accordance with the N bits.

Figure 54:
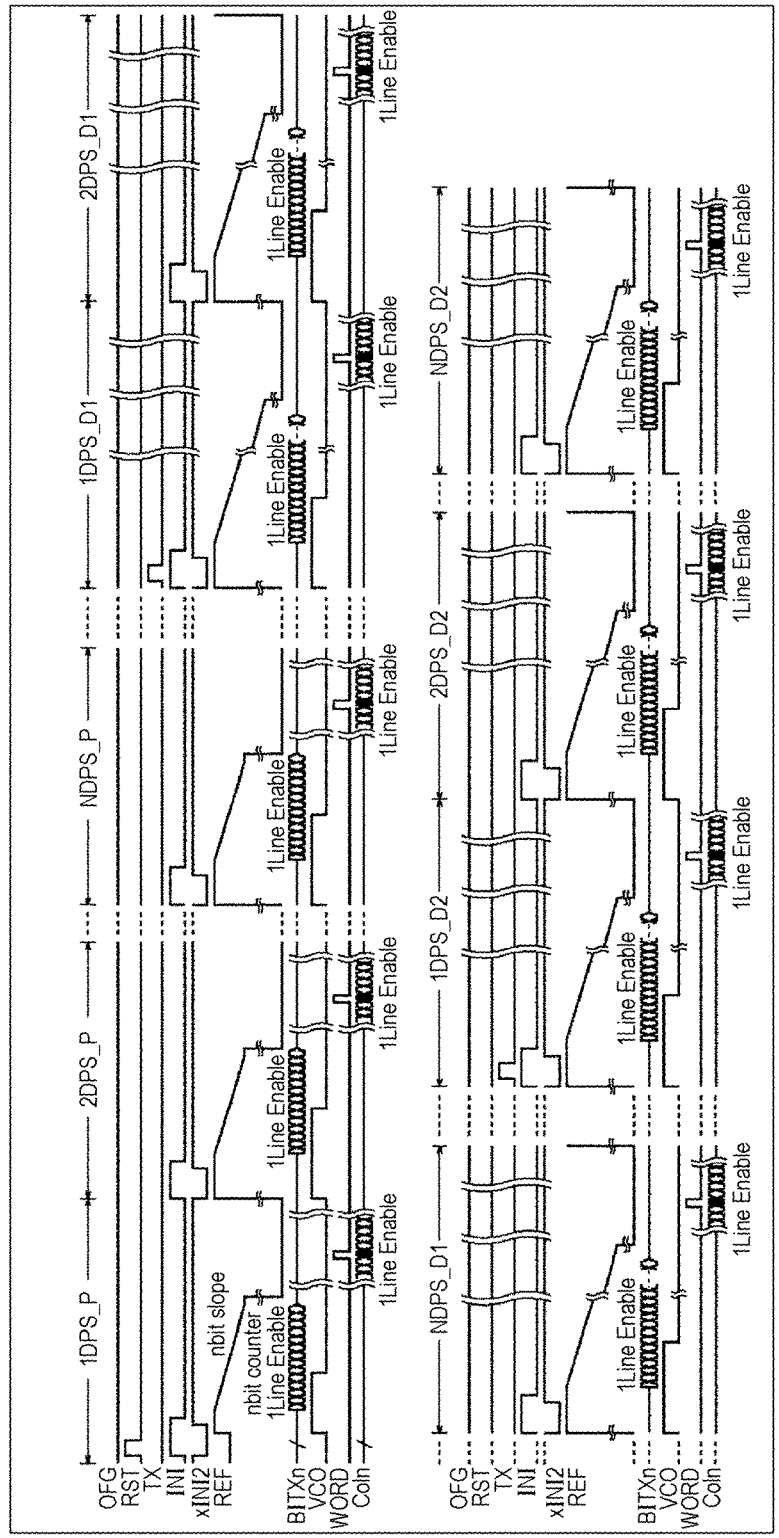
FIG. 54 is a diagram for explaining driving by bit-number slope inputs.

FIG. 54 is a diagram showing the details of the timing chart shown in FIG. 53.

In the example shown in FIG. 53, the duration of a D-phase data period is set at L*T, which is L times longer than the duration T of a P-phase data period, and the dynamic range is made L times wider with the exposure ratio.

In the operation to input the slope signal the same number of times (N times) as the number of bits as described above, power consumption can be reduced while the determination speed of the comparator 51 is increased, by virtue of the structure of the comparator 51 according to the present disclosure.

<20. Sixth Embodiment of the Pixel Unit>
<Where Code Input Signals are Differential Signals>

Figure 55:
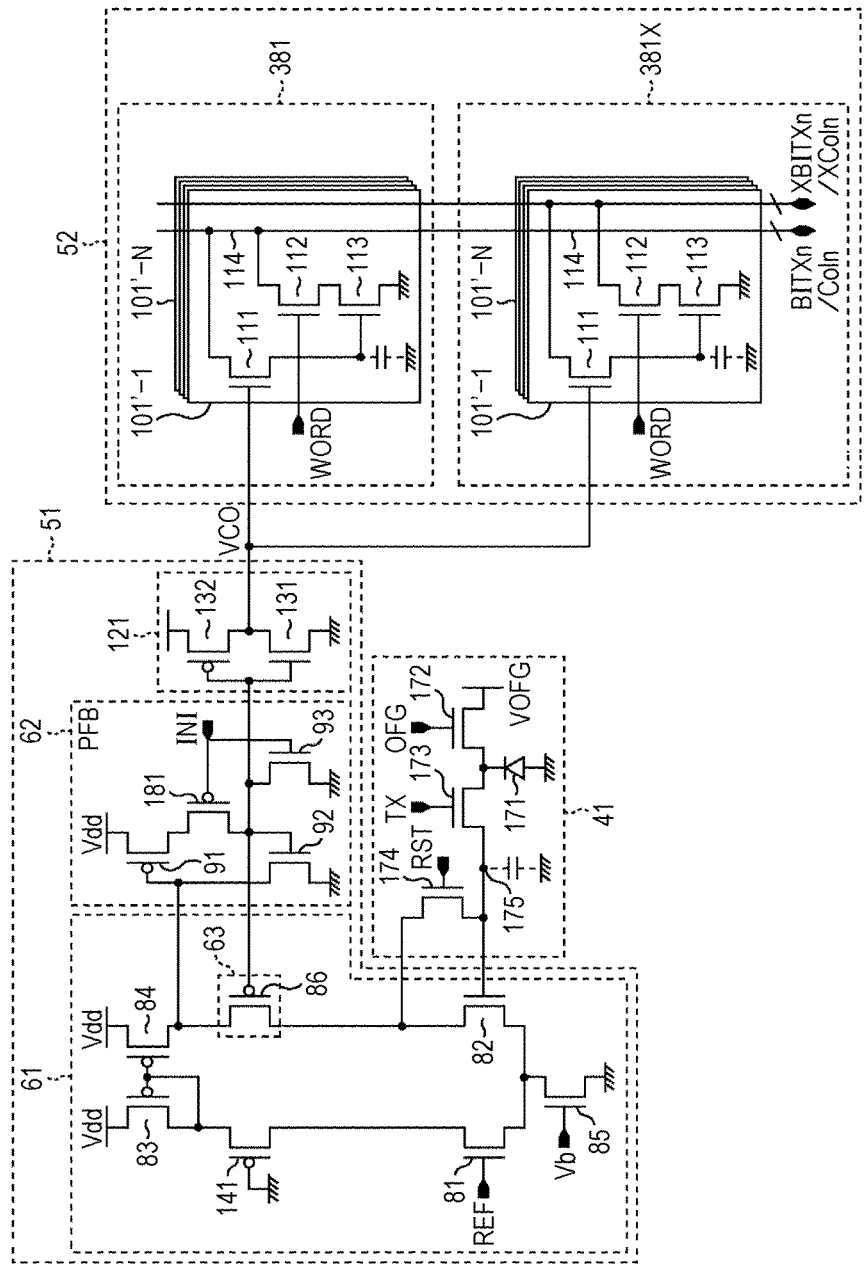
FIG. 55 is a circuit diagram showing the fifth embodiment of a pixel.

FIG. 55 is a circuit diagram showing a sixth embodiment of the pixel 21.

The differences between the structure of the pixel 21 according to the sixth embodiment shown in FIG. 55 and the structure of the pixel 21 according to the second embodiment shown in FIG. 20 are now described.

In the pixel 21 according to the sixth embodiment, the latch storage unit 52 includes two latch units 381 and 381X. Each of the latch units 381 and 381X includes the latch circuits 101'-1 through 101'-N that store N-bit data. However, the code input signal BITXn to be input to the latch unit 381 and the code input signal XBITXn to be input to the latch unit 381X are differential signals, and the latch signal Coln to be output from the latch unit 381 and the latch signal XColn to be output from the latch unit 381X are also differential signals.

In a case where the number of pixels in the pixel array unit 22 is large, the interconnect lengths of the write circuit and the read circuit are long, and it is difficult to accurate write and read data, due to noise.

To counter this in the pixel 21 according to the sixth embodiment, the latch storage unit 52 includes two N-bit memories that are the latch units 381 and 381X as shown in FIG. 55, and input/output signals are differential signals. Specifically, the latch storage unit 52 is designed so that one of the input/output signals of the latch units 381 and 381X is Hi when the other one of the input/output signals is Low. With this, high resistance to common mode noise in the lines for both signals is achieved. Also, in the write circuit and the read circuit, signals invariably act on one another in a complementary manner, and thus, power consumption can be maintained at a constant level.

<Measures Against Light Leakage>

Figure 56:
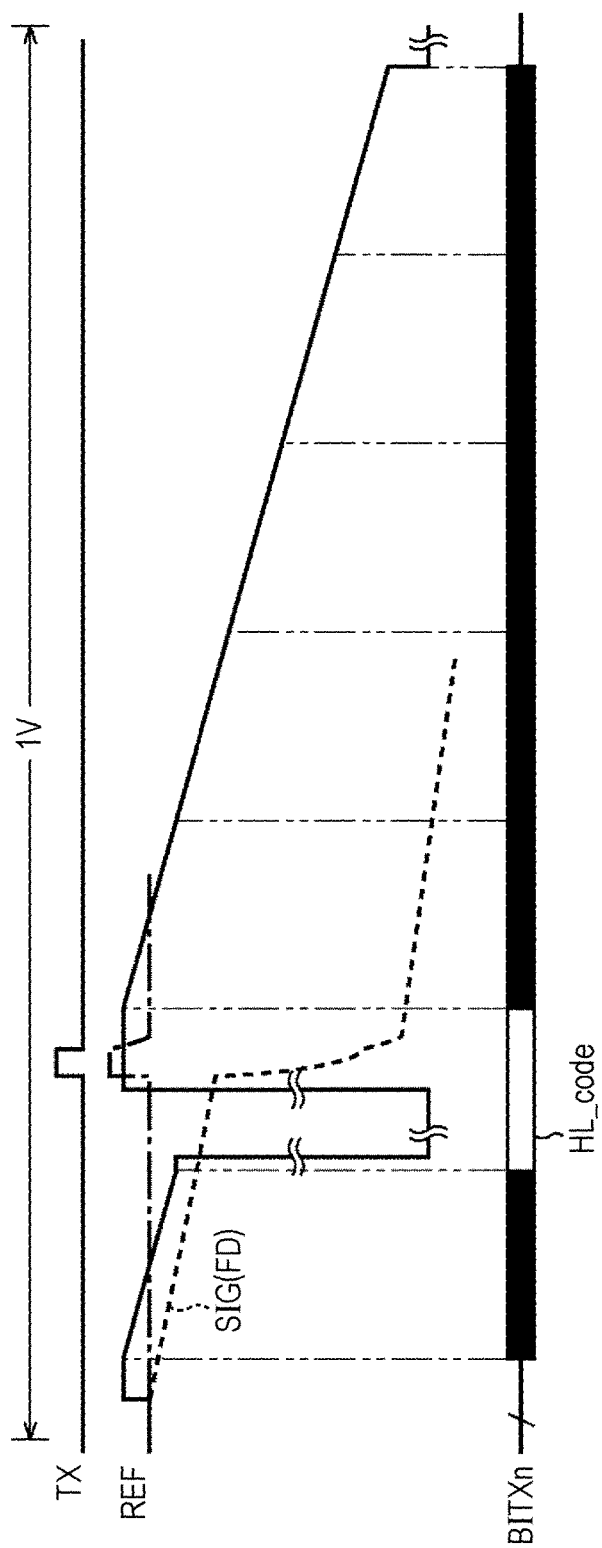
FIG. 56 is a diagram for explaining control on the measures against light leakage.

When strong light impinges on the photodiode 171, the charge leaks into the FD 175 via the transfer gate 173. In a case where the FD 175 does not adequately block light, charge might be generated through the photoelectric conversion at the FD 175. In such a situation, the pixel signal SIG drops as indicated by the dashed line in FIG. 56, due to the charge that has been generated at the FD 175 prior to transfer and is not the pixel signal SIG generated from originally-received light. In FIG. 56, the dot-and-dash line indicates the normal pixel signal SIG prior to transfer.

As the pixel signal SIG drops due to the charge generated at the FD 175 prior to transfer, the reference signal REF and the pixel signal SIG do not intersect with each other during the P-phase data period, as can be seen from comparison with the reference signal REF shown in FIG. 56. In such a case, correct AD conversion cannot be performed.

To counter this, the solid-state imaging device 1 sets the last code input signal BITXn in the P-phase data period at a predetermined code value HL_CODE indicating light leakage.

As described above with reference to FIG. 19 and others, after a signal write period ends, the voltage of the reference signal REF is lowered to the standby voltage $V_{stb}$ at which the transistor 81 is turned off, to reduce current consumption. Consequently, the output signal VCO is inverted outside the slope periods, and, in a stage after the ADC 42, the predetermined code value HL_CODE can be obtained. As a result, the circuit that has obtained the predetermined code value HL_CODE detects the above described situation where strong light has entered, and a process to replace the value with the maximum luminance value can be performed, for example.

The predetermined code value HL_CODE indicating light leakage is more preferably a code that appears when light also impinges on the latch circuit 101 of the latch storage unit 52. In a case where the latch circuit 101 is formed with an NMOS transistor like the latch circuit 101 according to the present disclosure, for example, charge is generated when light impinges on the floating diffusion layer, resulting in 0 V. In view of this, the code value HL_CODE may be a voltage that invariably becomes "0".

<Structure Having Delay in the Pixel Array Unit>

By a method according to the present disclosure, light reception and AD conversion are performed concurrently in all the pixels, and therefore, instantaneous current or instantaneous noise might be generated.

To counter this in a circuit that can cancel error components through a CDS process or the like, or a circuit that does not need to perform concurrent operations, the times for the inverting operations may be purposely shifted from one another.

Figure 57:
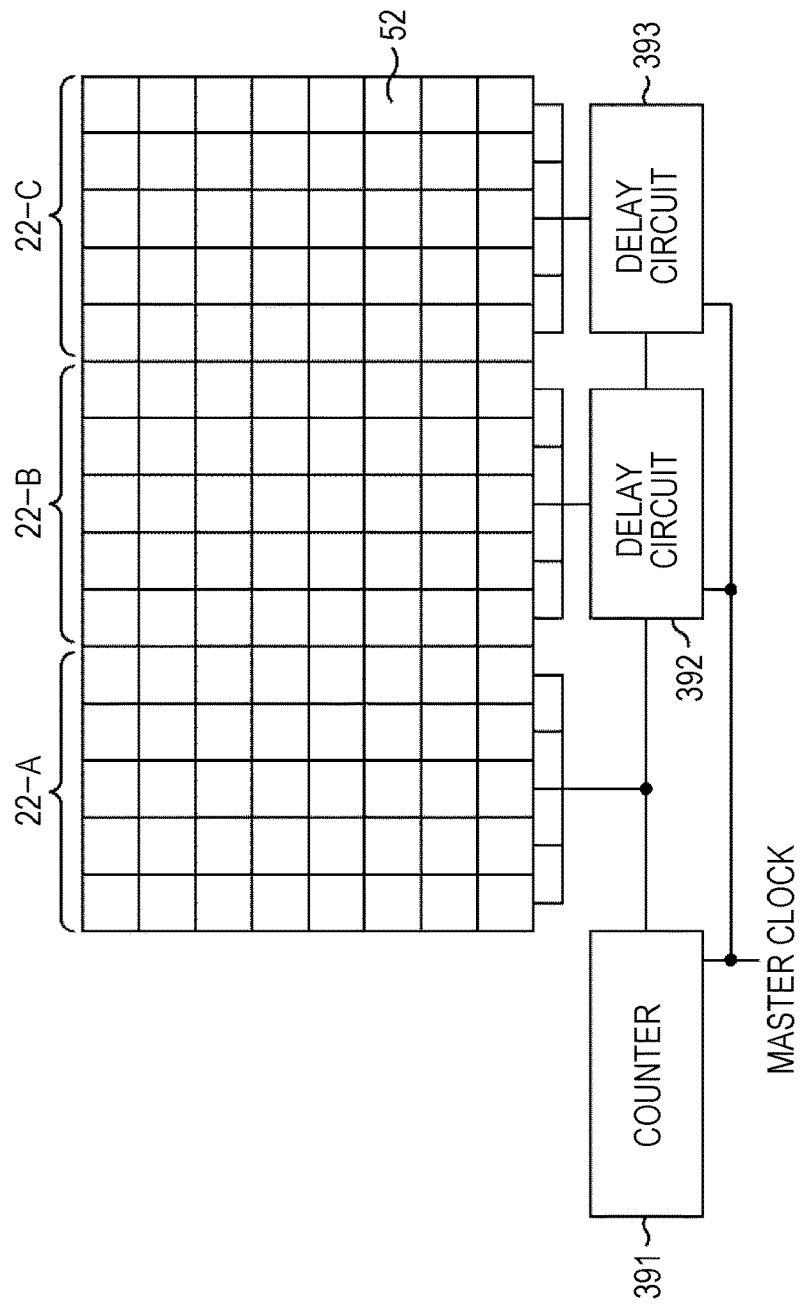
FIG. 57 is a diagram for explaining a structure that changes the times for inversion operations.

For example, as shown in FIG. 57, the pixel array unit 22 may be horizontally divided into three pixel array units 22-A, 22-B, and 22-C, and the operation to be performed at the latch storage unit 52 of each pixel 21 in the pixel array unit 22 to obtain P-phase data and the D-phase data may be performed at different times among the three regions of the pixel array units 22-A, 22-B, and 22-C.

In this case, delay circuits 392 and 393 are provided, as well as a counter 391 that outputs the code input signal BITXn to the latch storage unit 52 of each pixel 21 in the pixel array unit 22.

The code input signal BITXn output from the counter 391 is input directly to the latch storage unit 52 of each of the pixels 21 belonging to the pixel array unit 22-A. The code input signal BITXn is delayed a certain amount of time from the pixel array unit 22-A by the delay circuit 392, and is then input to the latch storage unit 52 of each of the pixels 21 belonging to the pixel array unit 22-B. The code input signal BITXn is further delayed a certain amount of time from the pixel array unit 22-B by the delay circuit 393, and is then input to the latch storage unit 52 of each of the pixels 21 belonging to the pixel array unit 22-C. Those shift components are equal in quantity to P-phase data and D-phase data, and thus, can be cancelled by a CDS process. The amount of delay is limited within such a range that the bit transition order of the code input signal BITXn is not changed.

<21. Example Structure of a Column ADC>

Although the ADC 42 is provided in each pixel 21 in the embodiments described so far, an ADC including the comparator 51 according to the present disclosure may be provided for each pixel column, and the solid-state imaging device 1 may be of a parallel column reading type.

Figure 58:
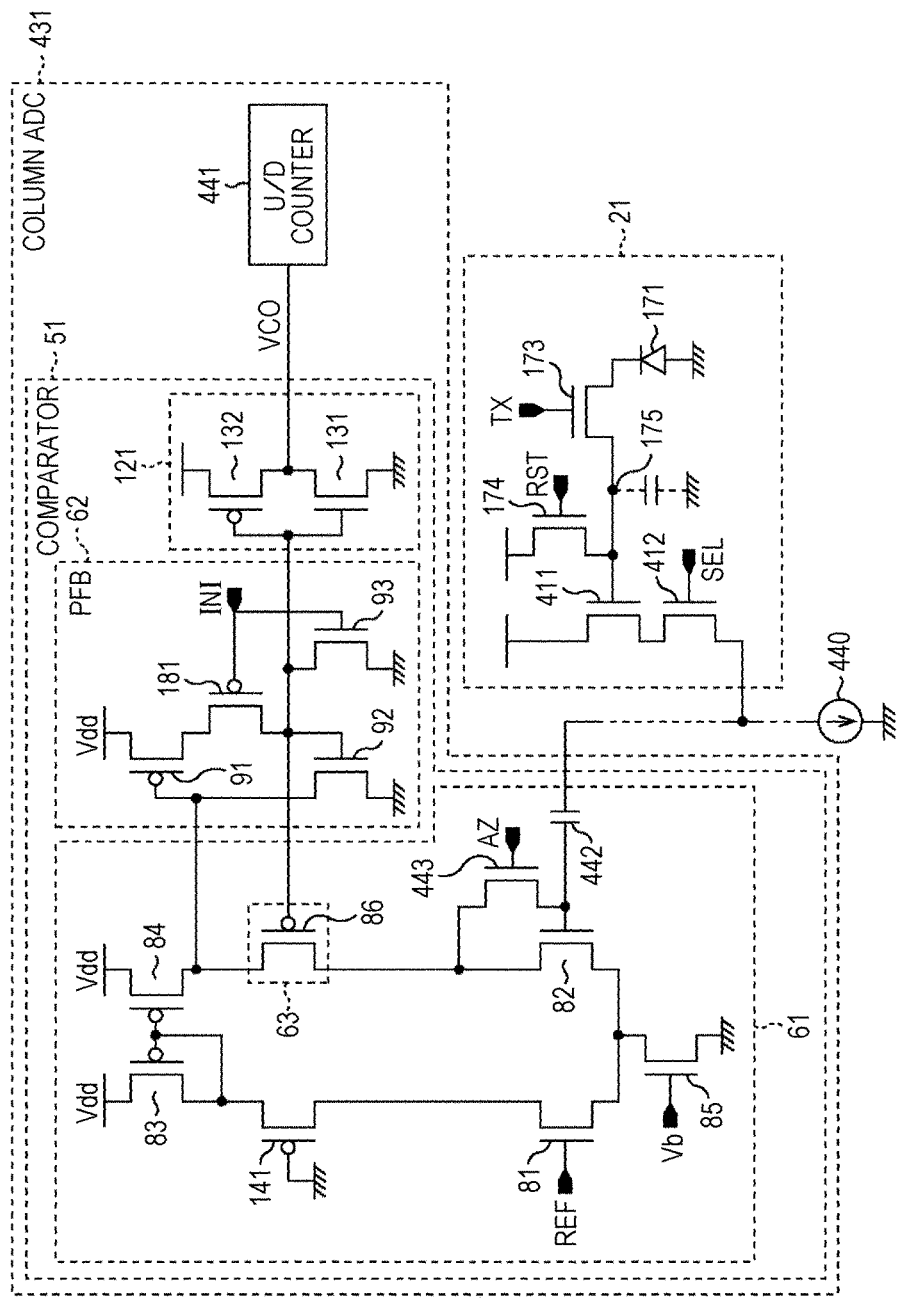
FIG. 58 is a diagram showing the circuit structure of a column ADC.

FIG. 58 is a diagram showing a circuit structure that has an ADC including the comparator 51 of the present disclosure for each pixel column.

In the case where ADCs are provided for the respective pixel columns, each pixel 21 includes the photodiode 171, the transfer transistor 173, the reset transistor 174, the FD 175, an amplification transistor 411, and a select transistor 412. The amplification transistor 411 forms a load MOS 440 as a constant current source and a source follower circuit. Although the discharge transistor 172 is not included in the structure, the discharge transistor 172 may of course be employed.

A column ADC 431 provided for the corresponding pixel column in the pixel array unit 22 includes the comparator 51 of the present disclosure and a count-up/down (U/D) counter 441. In the case where ADCs are provided for the respective pixel columns, the device formation area is larger than that in a case where ADCs are provided for the respective pixels, and accordingly, the latch storage unit 52 can be replaced with the U/D counter 441. Thus, a digital CDS process can be performed.

A capacitor 442 for cutting down DC components, and an NMOS transistor 443 for initializing the floating diffusion layer are further provided at the input end to which the pixel signal SIG of the column ADC 431 is input.

Figure 59:
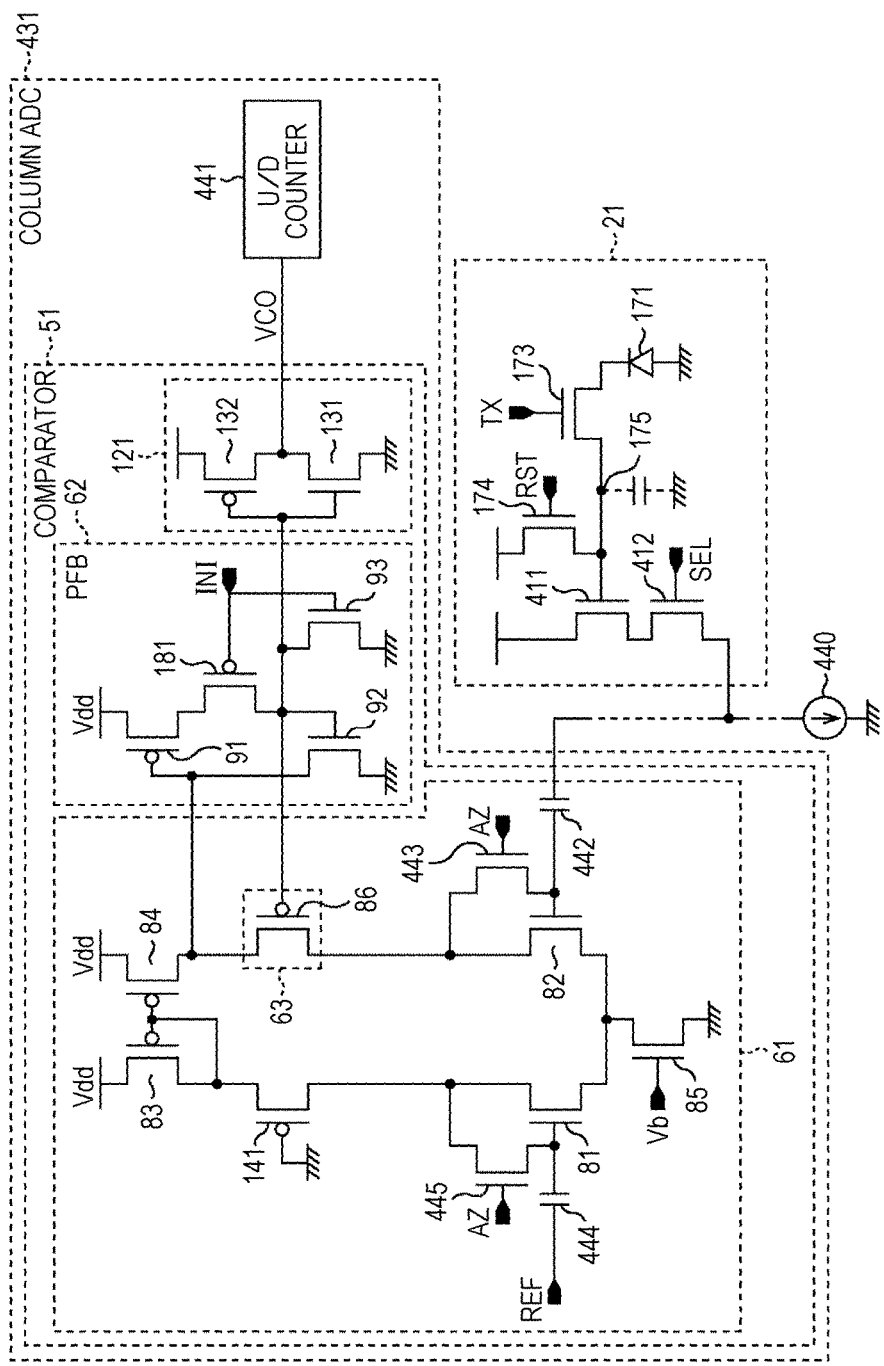
FIG. 59 is a diagram showing the circuit structure of a column ADC.

With the characteristics difference between the right side and the left side in the differential amplifier circuit 61 being taken into consideration as in the other examples described above, a capacitor 444 and an NMOS transistor 445 may be added to the left side in the differential amplifier circuit 61, as shown in FIG. 59.

Figure 60:
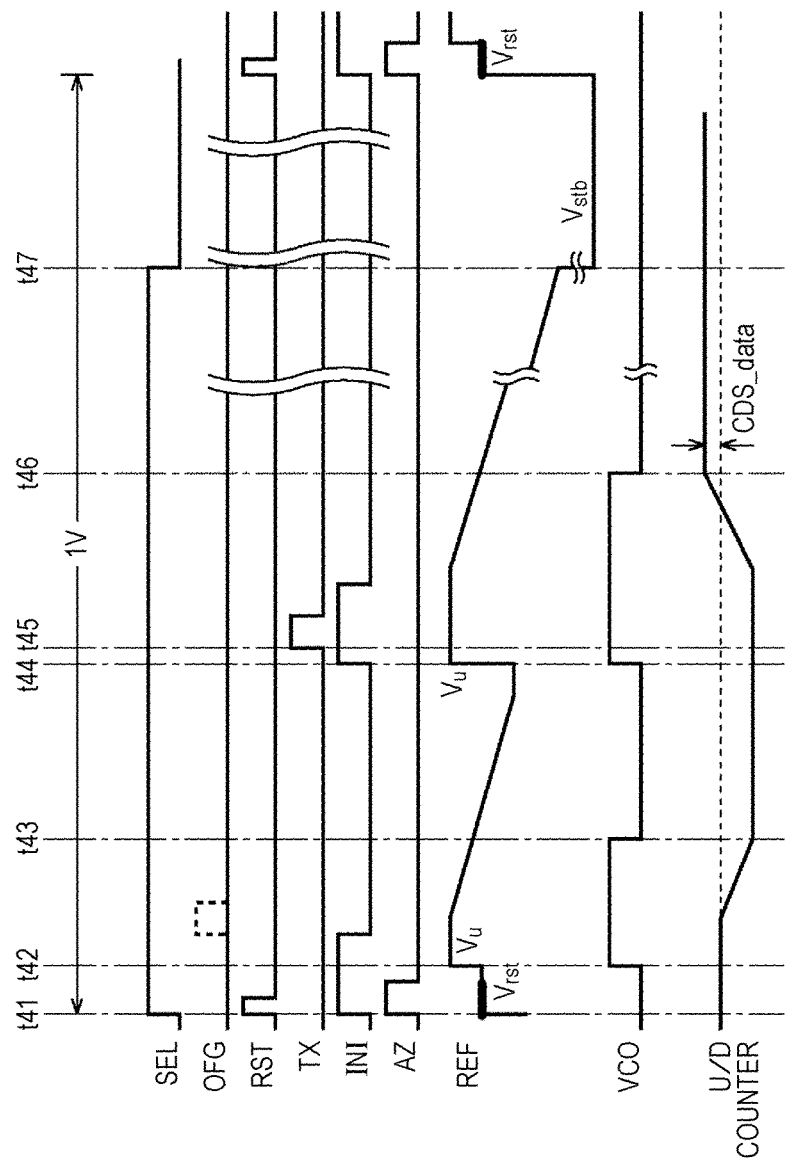
FIG. 60 is a timing chart for explaining operation of a column ADC.

Referring now to the timing chart in FIG. 60, operation of the solid-state imaging device 1 of the parallel column reading type shown in FIG. 58 is described.

First, at time t41, the select signal SEL to be supplied to the select transistor 412 of the pixel 21 is switched to Hi, the pixel 21 is selected, and the reset transistor 174 is turned on. Consequently, the charge in the FD 175 is reset. Also, at time t41, the initialization signal INI to be supplied to the gate of the transistor 93 of the positive feedback circuit 62 is set at Hi, the positive feedback circuit 62 is put into the initial state, and a control signal AZ to be input to the gate of the NMOS transistor 443 is set at Hi, to initialize the gate (floating portion) of the transistor 82 to which the pixel signal SIG is input.

At time t42, the reference signal REF is boosted to a predetermined voltage $V_u$, and comparison between the reference signal REF and the pixel signal SIG is started. At this point of time, the reference signal REF is larger than the pixel signal SIG, and therefore, the output signal VCO is Hi. After the reference signal REF turns into a slope signal, the U/D counter 441 counts down while the output signal VCO is Hi.

At time t43 when the reference signal REF and the pixel signal SIG are determined to be equal, the output signal VCO is inverted (to Low). As the output signal VCO is inverted, the speed of inversion of the output signal VCO is increased by the positive feedback circuit 62. The U/D counter 441 stops the counting down, and holds the count value at this point of time.

At time t44, the reference signal REF is boosted to a predetermined voltage $V_u$. As a result, the reference signal REF becomes larger than the pixel signal SIG, and therefore, the output signal VCO is switched to Hi. Also, the initialization signal INI to be supplied to the gate of the transistor 93 of the positive feedback circuit 62 is set at Hi, so that the positive feedback circuit 62 is put back into the initial state.

At time t45, the transfer transistor 173 of the pixel 21 is turned on, and the charge generated at the photodiode 171 is transferred to the FD 175.

After the reference signal REF turns into a slope signal, the U/D counter 441 counts up while the output signal VCO is Hi. At time t46 when the reference signal REF and the pixel signal SIG are determined to be equal, the output signal VCO is inverted (to Low). As the output signal VCO is inverted, the speed of inversion of the output signal VCO is increased by the positive feedback circuit 62. The U/D counter 441 then stops the counting up, and holds the count value CDS_data subjected to a CDS process.

At time t47, the select signal SEL to be supplied to the select transistor 412 of the pixel 21 is switched to Low, and the pixel 21 becomes non-selected. Also, the voltage of the reference signal REF to be supplied to the gate of the transistor 81 of the comparator 51 is lowered to the level (standby voltage $V_{stb}$) at which the transistor 81 is turned off. With this, the current to be consumed by the comparator 51 of the non-selected pixel 21 is reduced.

<22. Streaking Correction Calculation>

In a circuit structure according to the present disclosure, all the pixels (in a case where each pixel includes the ADC 42) or the pixel columns (in the case with the column ADCs 431) in the pixel array unit 22 operate in parallel, and therefore, the reference black level might vary when the circuits are collectively inverted. In other words, the reference black level might differ between a case where all the pixels output black signals and a case where bright signals are output at a certain rate. This phenomenon is known as "streaking" in the field of image sensors of rolling-shutter types.

In the description below, a method of correcting variation (streaking) in the reference black level at the output unit 27 of the solid-state imaging device 1 is described.

Figure 61:
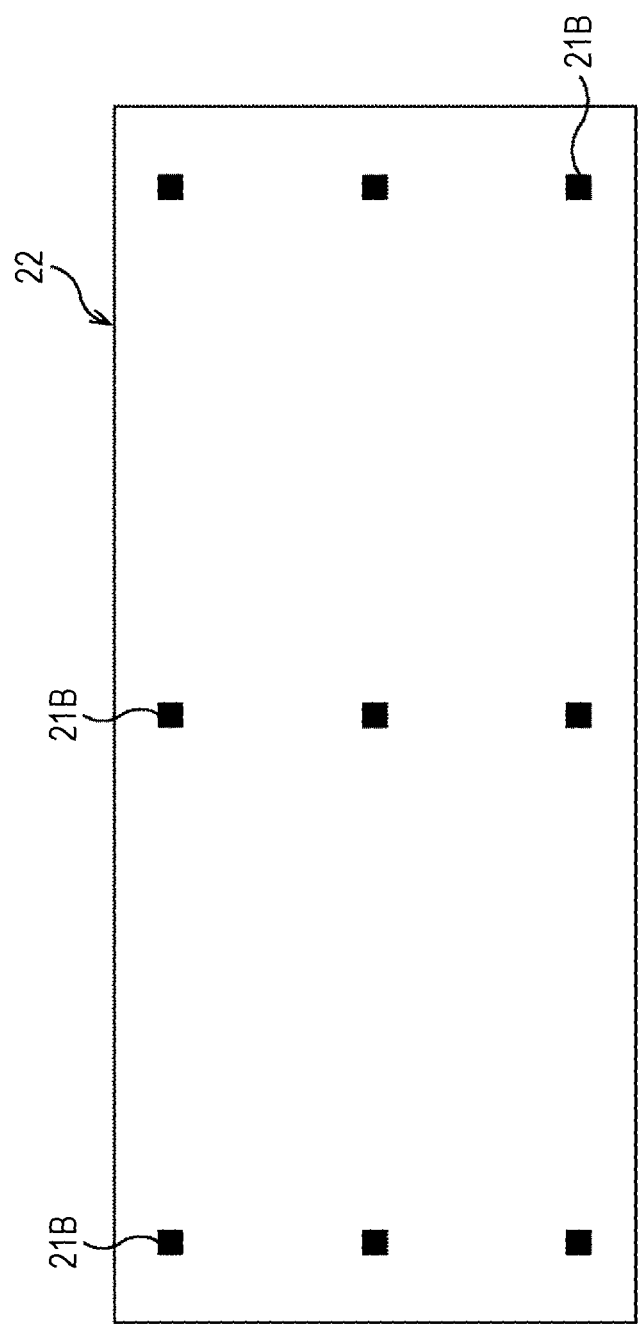
FIG. 61 is a diagram showing an example layout of black output pixels in black level correction.

As shown in FIG. 61, black output pixels 21B that output black levels are provided in the valid pixel region of the pixel array unit 22. The black output pixels 21B need to be provided in at least three positions in the same row or the same column. For example, the black output pixels 21B are arranged in nine (3×3) positions in the valid pixel region of the pixel array unit 22.

In a case where the reference black level is corrected in the horizontal direction (x-direction) of the pixel array unit 22, the black level error can be expressed by the equation (1) shown below. However, due to the trade-off between a reduction in the amount of calculation and effects, the third-degree and higher terms are ignored, and the equation (2) is considered. In the equations (1) and (2), x represents a pixel position in the horizontal direction.

[Mathematical Formula 1]

$$\text{ERROR} = \alpha_0 + \alpha_1 x + \alpha_2 x^2 + \alpha_3 x^3 + \alpha_4 x^4 + \quad (1)$$

[Mathematical Formula 2]

$$\text{ERROR} = \alpha_0 + \alpha_1 x + \alpha_2 x^2 \quad (2)$$

Figure 62:
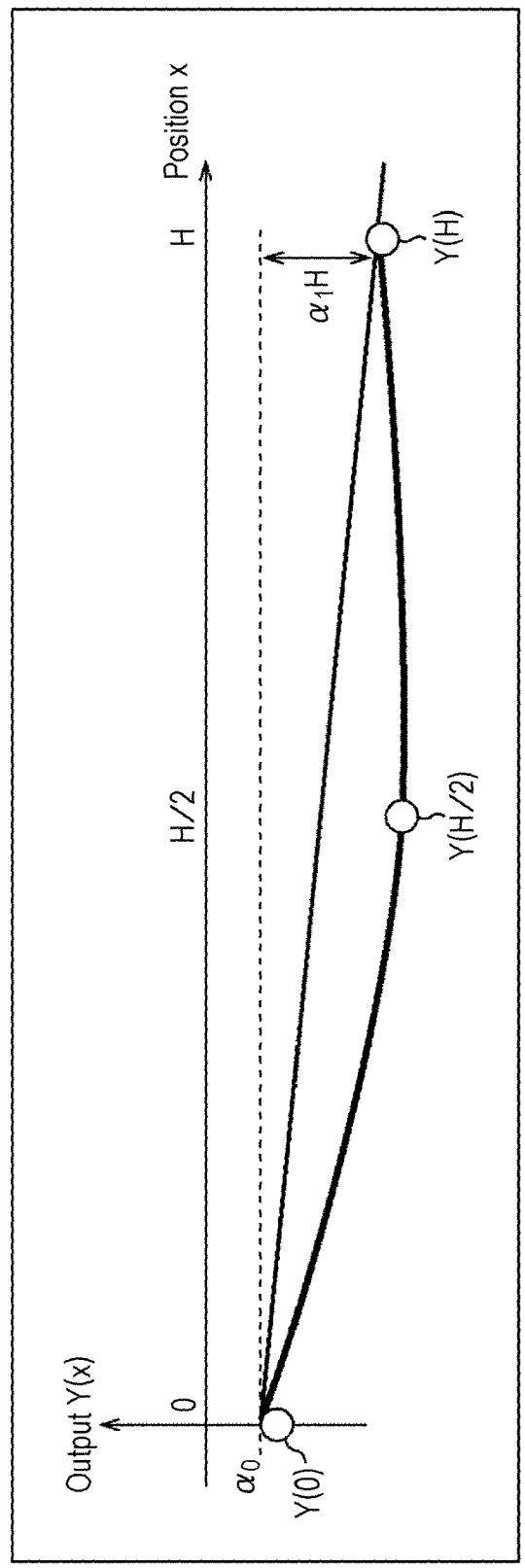
FIG. 62 is a diagram for explaining a method of correcting black levels.

As shown in FIG. 62, the output value Y(0) of a black output pixel 21B is obtained in a position where x=0, the output value Y(H/2) of a black output pixel 21B is obtained in a position where x=H/2, and the output value Y(H) of a black output pixel 21B is obtained in a position where x=H.

In this case, coefficients $\alpha_0$ and $\alpha_1$ are the intercept and the inclination of the equation (2), and therefore, are obtained according to the following mathematical formula:

$$\alpha_0 = Y(0) \quad \text{[Mathematical Formula 3]}$$
$$\alpha_1 = \frac{Y(H) - Y(0)}{H}$$

When the output value Y(H/2) in the position where x=H/2 and the above coefficients $\alpha_0$ and $\alpha_1$ are plugged into the equation (2), the following mathematical formula is obtained:

$$Y\left(\frac{H}{2}\right) = \alpha_0 + \alpha_1 \frac{H}{2} + \alpha_2 \left(\frac{H}{2}\right)^2 \quad \text{[Mathematical Formula 4]}$$
$$= Y(0) + \frac{Y(H) - Y(0)}{H} \cdot \left(\frac{H}{2}\right) + \alpha_2 \left(\frac{H}{2}\right)^2$$

When the mathematical formula is transformed into an equation to determine the coefficient $\alpha_2$, the coefficient $\alpha_2$ is expressed as follows:

$$\alpha_2 = \left[Y\left(\frac{H}{2}\right) - Y(0) - \frac{Y(H) - Y(0)}{H} \cdot \left(\frac{H}{2}\right)\right] \frac{4}{H^2} \quad \text{[Mathematical Formula 5]}$$

The dominant terms are extracted from the equation to determine the coefficient $\alpha_2$, and are simplified, to obtain the following equation:

$$\alpha_2 = \frac{4}{H^2}\left[Y\left(\frac{H}{2}\right) - Y(0)\right] \qquad \text{[Mathematical Formula 6]}$$

According to the equation to determine the coefficient $\alpha_2$, the calculation of the coefficient $\alpha_2$ can be made simpler if the correction position H is moved to a position represented by a power of 2.

Using the coefficients $\alpha_0$, $\alpha_1$, and $\alpha_2$ determined in the above manner, the output unit 27 of the solid-state imaging device 1 calculates the black level errors ERROR in accordance with the respective x-positions. The output unit 27 then subtracts the black level error values from the digital pixel values of the respective pixels, to output signals with reduced reference black level variation.

In the above described example of calculation, the correcting arithmetic equations correspond to the positions in the horizontal direction, but calculation can also be performed as to positions in the vertical direction.

It is known that variation in the reference black level depends on the power supply for the ADC or GND, and therefore, black output pixels 21B arranged in a direction parallel to the power supply line or the GND line can be used in calculation.

Although the third- and higher-degree terms are ignored in the above example, correction accuracy can be increased by using the third- and higher-degree coefficients $\alpha_3$, $\alpha_4$, . . . .

Figure 63:
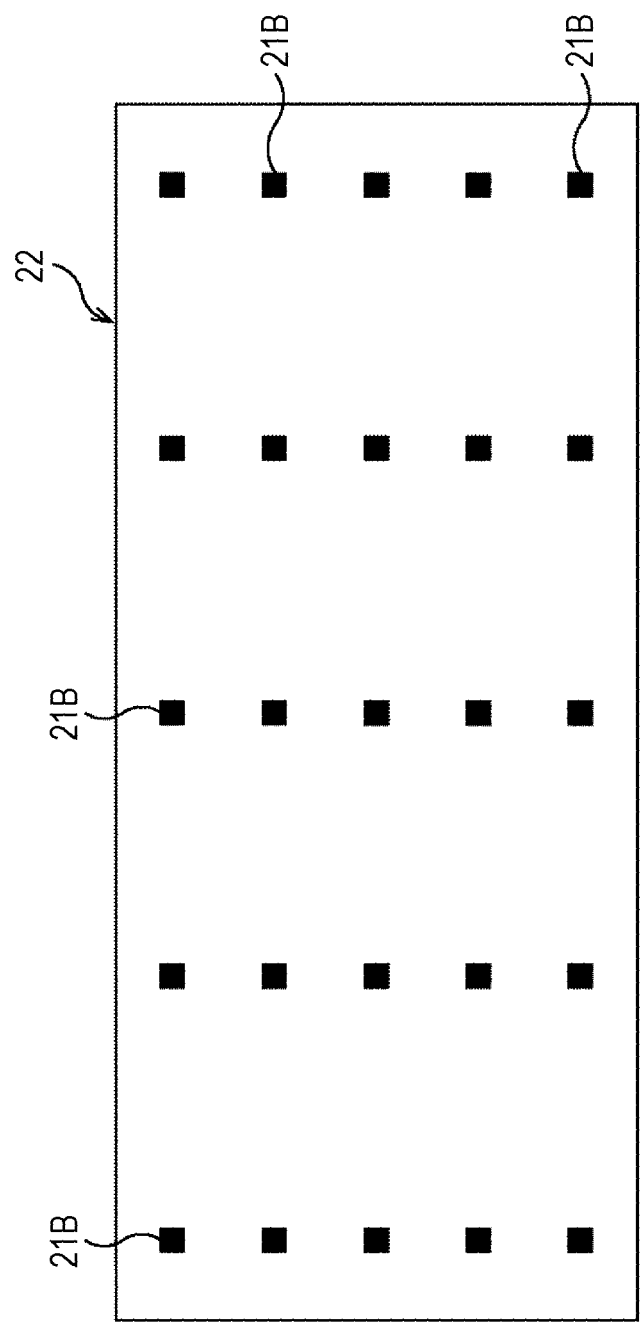
FIG. 63 is a diagram showing another example layout of black output pixels in black level correction.

As shown in FIG. 63, correction accuracy can also be improved by increasing the number of black output pixels 21B arranged in the pixel array unit 22.

The black output pixels 21B that output black levels may be pixels that are designed for correction and have the upper surfaces of the light receiving units (photodiodes 171) covered with light blocking film, or may be regular pixels like the other pixels 21 that output signals without any charge transfer with a control signal TX in the pixels 21. Alternatively, in a case where phase difference detection pixels that have the light receiving units partially shielded from light are arranged in the pixel array unit 22, the phase difference detection pixels may be driven without charge transfer, and be used as the black output pixels 21B.

In a case where pixels 21 or phase difference detection pixels that are not physically shielded from light by light blocking film are used as the black output pixels 21B without charge transfer, two TX signal control lines need to be provided in the solid-state imaging device 1 that drives pixels row by row so that pixels 21 that perform charge transfer and pixels 21 (black output pixels 21B) that do not perform charge transfer coexist in each pixel row as shown in FIG. 63.

Figure 64:
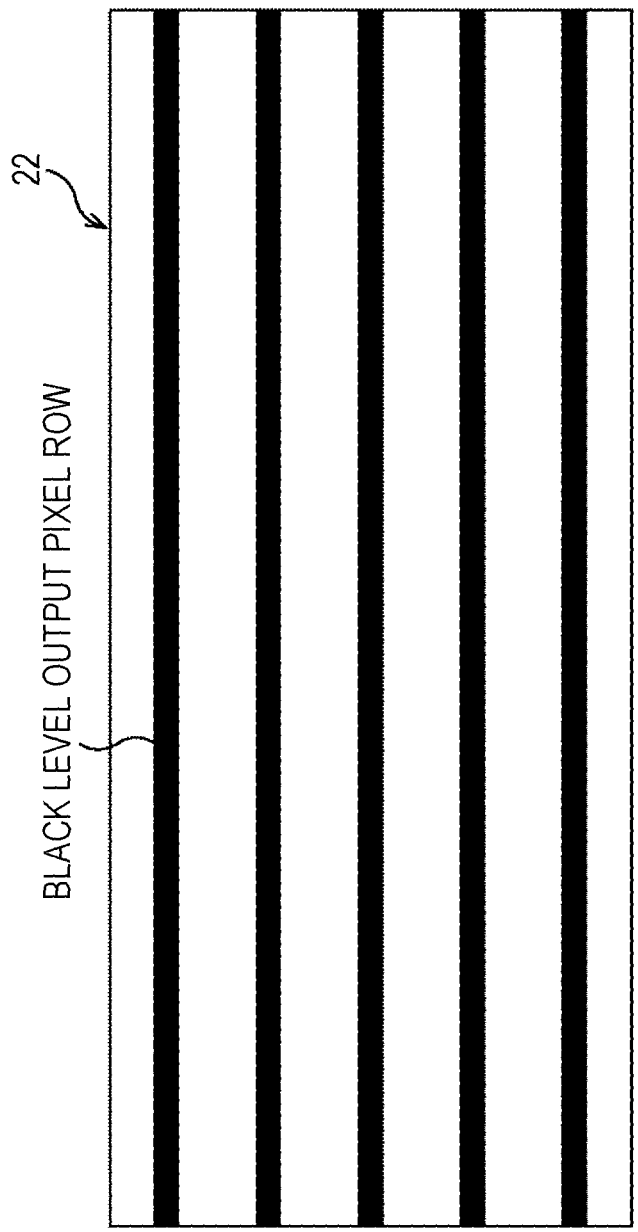
FIG. 64 is a diagram for explaining an example of control on black level correction.

In view of this, pixel rows that do not perform charge transfer may be arbitrarily set without the two TX signal control lines, as shown in FIG. 64, and black output pixels 21B may be set row by row. Correction of the reference black level may be performed in the horizontal direction with the black output pixels 21B in the same row, or may be performed in the vertical direction with the black output pixels 21B in the same column in the pixel array unit 22.

In a case where charge transfer is not performed, the dark current components of the black output pixels 21B are not output. However, the dark current components can be corrected by providing light blocking pixels that detect black levels outside the valid pixel region, and detecting the dark current components from the light blocking pixels.

In calculating correction of the reference black level, output signals are obtained from the black output pixels 21B more than once so as to lower the noise level, and signals from which high-frequency components have been removed with the mean value or the moving average of the output signals may be used.

<23. Seventh Embodiment of the Pixel Unit>
<Streaking Prevention Circuit>

Figure 65:
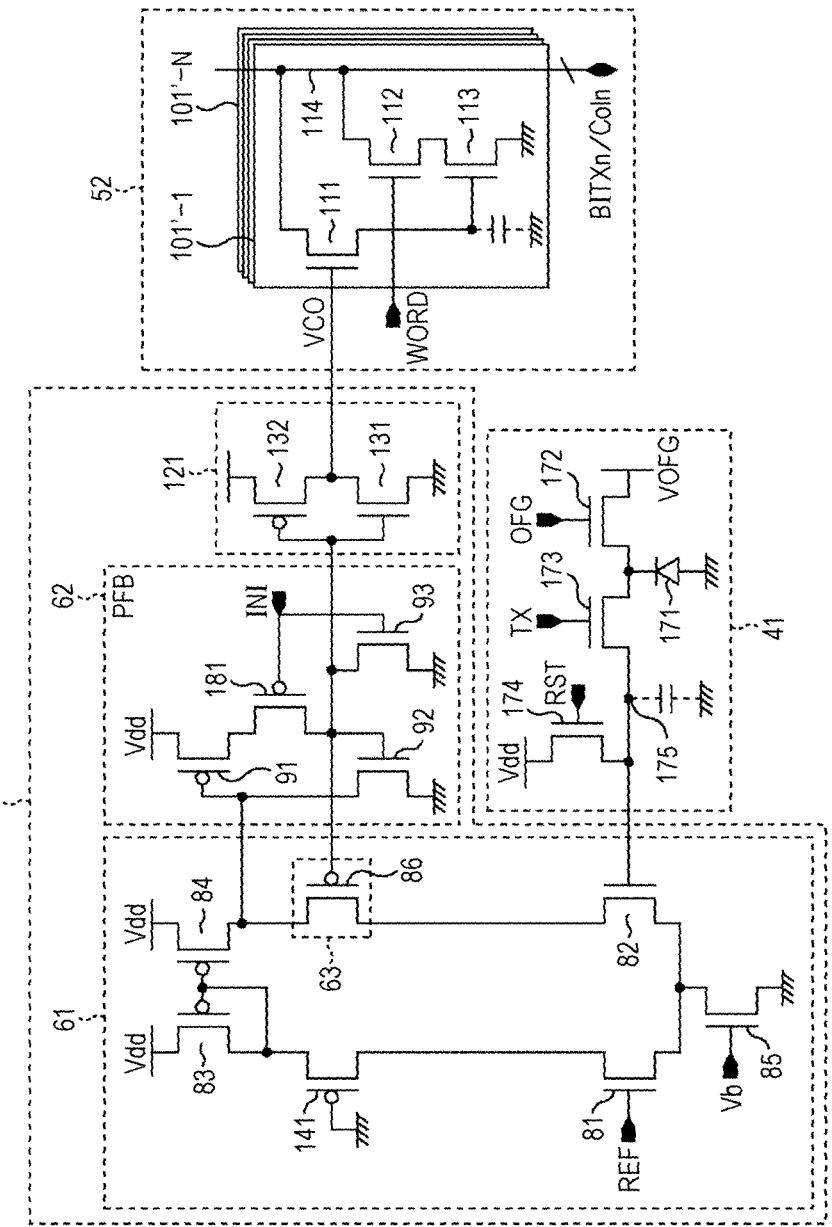
FIG. 65 is a circuit diagram showing a seventh embodiment of a pixel.

FIG. 65 is a circuit diagram showing a seventh embodiment of the pixel 21.

The seventh embodiment of the pixel 21 shown in FIG. 65 represents an example structure in which correction of variation in the reference black level due to collective inversion in the circuits is realized not by calculation but by a circuit.

The differences between the structure of the pixel 21 according to the seventh embodiment shown in FIG. 65 and the structure of the pixel 21 according to the second embodiment shown in FIG. 20 are now described.

In the second embodiment shown in FIG. 20, the drain of the reset transistor 174 of the pixel circuit 41 is connected to the drain of the transistor 82 to which the pixel signal SIG is input. In the seventh embodiment shown in FIG. 65, however, the drain of the reset transistor 174 of the pixel circuit 41 is connected to the power supply voltage Vdd.

In this structure, variation in the threshold of the transistor 82 to which the pixel signal SIG is input and variation in the threshold of the reset transistor 174 directly affect the floating diffusion layer. As a result, the collective inversion is scattered by the variation, and generation of streaking can be prevented. In an example interconnect layout, the source of the reset transistor 174 and the drain of the discharge transistor 172 may be integrated.

<24. Latch Circuit Output Control>

Next, read control on the latch signals Coln of the N latch circuits 101'-1 through 101'-N of the latch storage unit 52 is described.

Figure 66:
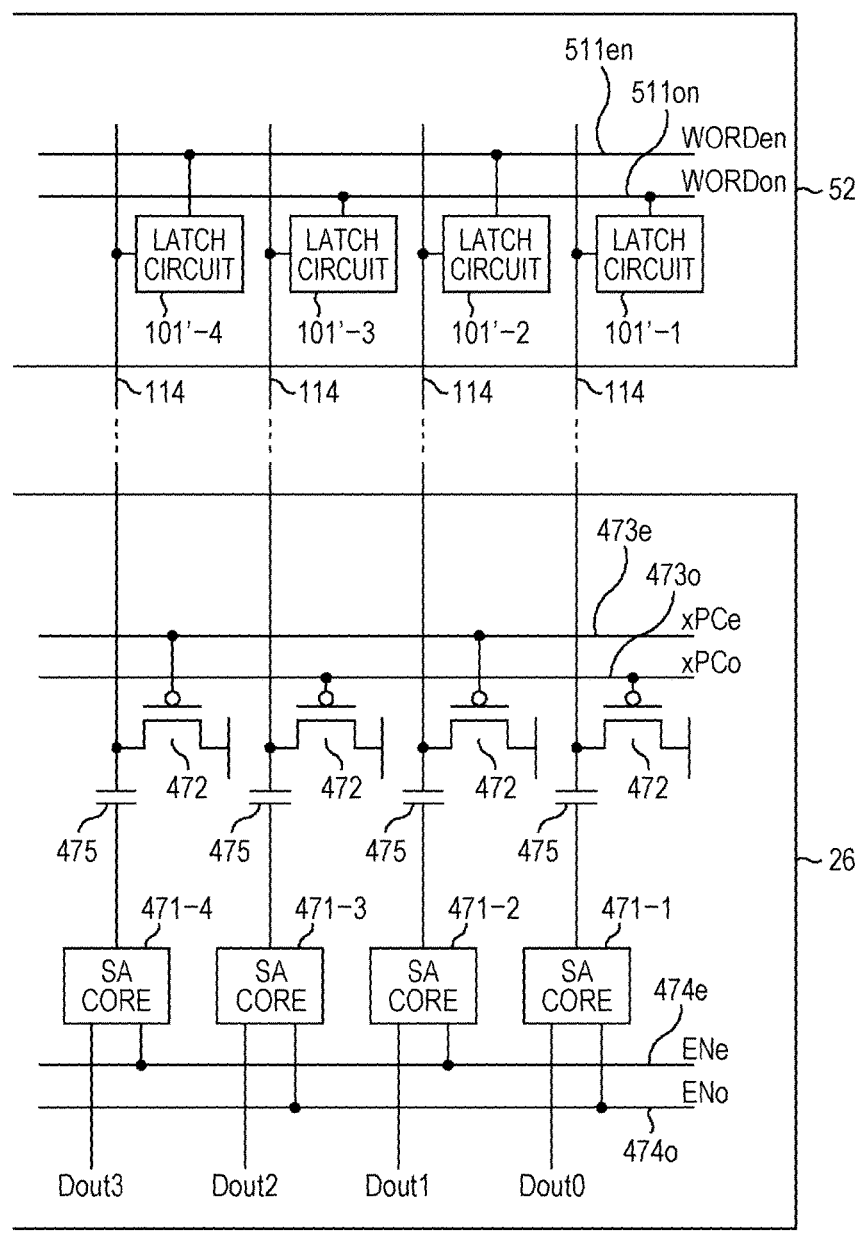
FIG. 66 is a diagram for explaining latch signal interleaved driving.

FIG. 66 is a circuit diagram related to read control on the latch storage unit 52 and the sense amplifier unit 26 in each pixel 21. The circuit for write control is not shown in the drawing.

The N latch circuits 101' of the latch storage unit 52 are connected to respective SA cores (sense amplifier core circuits) 471 of the sense amplifier unit 26 via the latch signal output lines 114, as shown in FIG. 66.

Capacitors 475 connected to the latch signal output lines 114, and transistors 472 for precharging the capacitors 475 with a predetermined potential are provided between the latch circuits 101' and the SA cores 471.

As for the reading of the latch signals Coln, the capacitors 475 are precharged with the predetermined potential by the transistors 472 prior to the reading, and the SA cores 471 determine whether the potential of the precharged capacitors 475 has been discharged with the latch signals Coln. In this manner, the reading of the latch signals Coln is performed. For example, if the latch signals Coln are "1", the potential given through the precharging is discharged. If the latch signals Coln are "0", the potential given through the precharging is maintained.

If the latch signals Coln of the N latch circuits 101' of the latch storage unit 52 in each pixel 21 are simultaneously read, coupling of adjacent signal lines might occur due to the small space between the adjacent signal lines. As a result, an erroneous operation might be performed.

To counter this in the solid-state imaging device 1 of the present disclosure, the WORD control lines 511 for transmitting read control signals WORD are divided into a WORD control line 511*on* for transmitting a control signal WORDon for the odd-numbered bits, and a WORD control line 511*en* for transmitting a control signal WORDen for the even-numbered bits, as shown in FIG. 66.

Also, xPC control lines 473 for transmitting a control signal xPC to the transistors 472 that precharge the capacitors 475 are divided into an xPC control line 473*o* for transmitting the control signal xPC to the transistors 472 of the odd-numbered bits, and an xPC control line 473*e* for transmitting the control signal xPC to the transistors 472 of the even-numbered bits.

Further, EN control lines 474 for transmitting control signals EN controlling the times for the SA cores 471 to detect the latch signals Coln are divided into an EN control line 474*e* for transmitting a control signal ENo to the SA cores 471 of the odd-numbered bits, and an EN control line 474*o* for transmitting a control signal ENe to the SA cores 471 of the even-numbered bits.

In this solid-state imaging device 1, the control signal WORDon, the control signal WORDen, the control signal ENo, and the control signal ENe are input so that adjacent SA cores 471 perform different operations from each other. Specifically, when the SA cores 471 of the odd-numbered bits are performing read operations on the latch circuits 101', the SA cores 471 of the even-numbered bits perform precharge operations on the latch circuits 101'. When the SA cores 471 of the odd-numbered bits are performing precharge operations on the latch circuits 101', on the other hand, the SA cores 471 of the even-numbered bits perform read operations on the latch circuits 101'.

Figure 67:
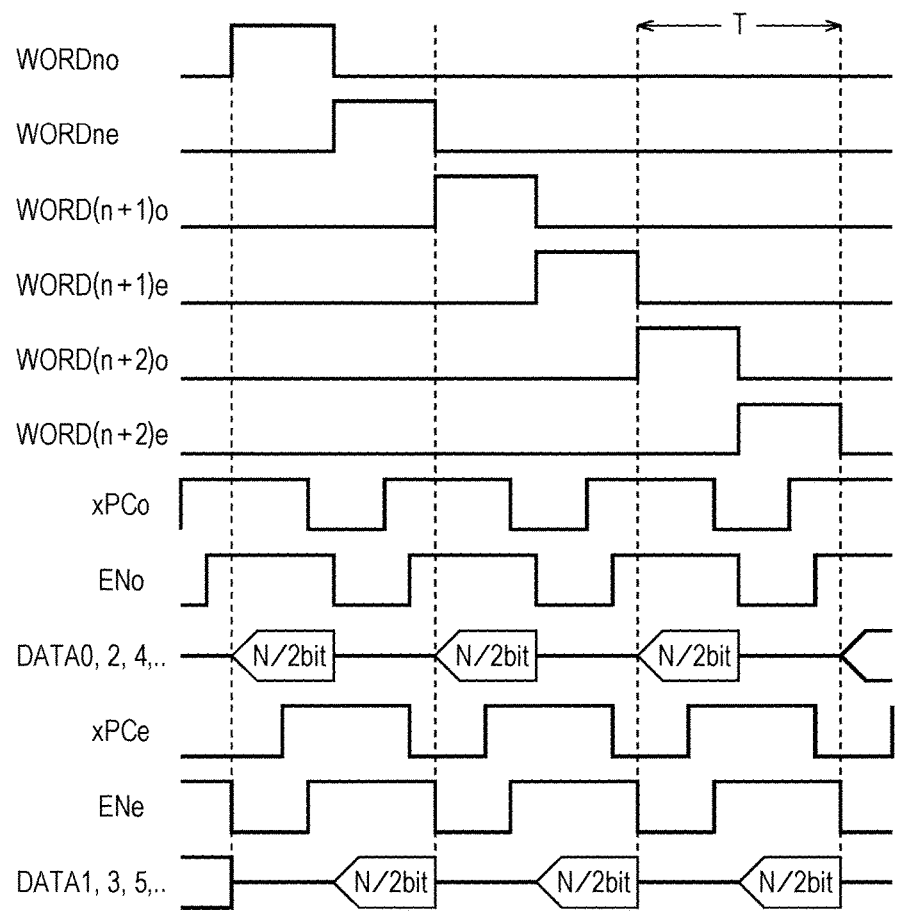
FIG. 67 is a timing chart for explaining latch signal interleaved driving.

FIG. 67 is a timing chart of the latch storage unit 52 and the sense amplifier unit 26 shown in FIG. 66.

Figure 68:
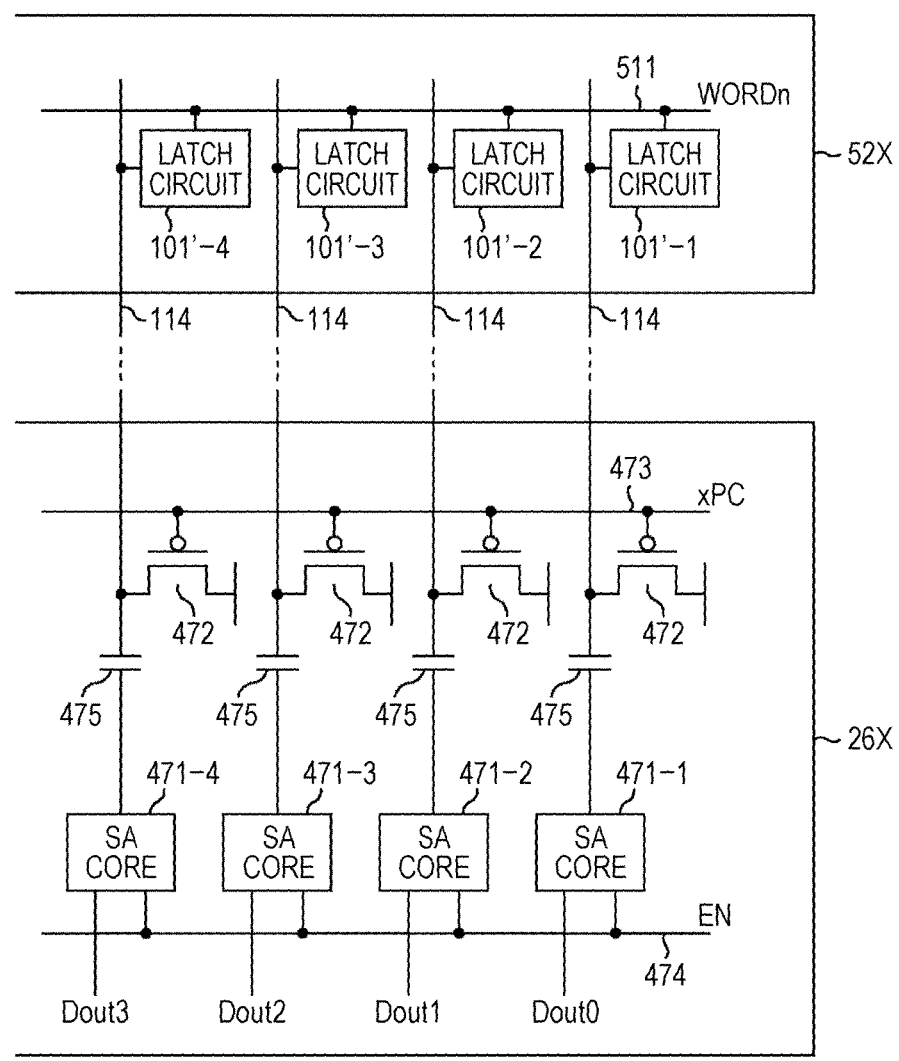
FIG. 68 is a diagram for explaining all-bit simultaneous read driving.
Figure 69:
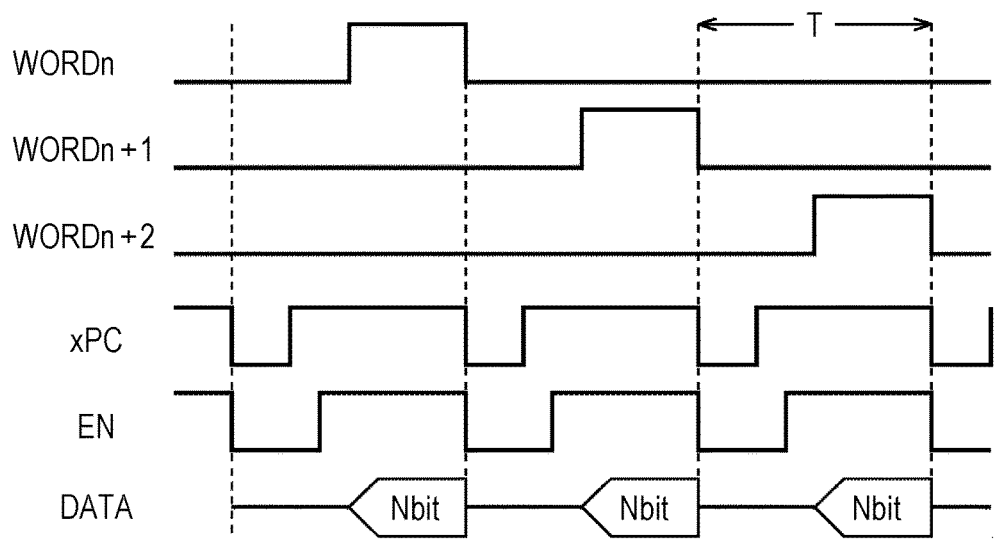
FIG. 69 is a timing chart for explaining all-bit simultaneous read driving.

For comparison, FIG. 68 shows an example of interconnection between a latch storage unit 52X and a sense amplifier unit 26X in a case where the latch signals Coln of the N latch circuits 101' are simultaneously read. FIG. 69 is a timing chart of driving of the latch storage unit 52X and the sense amplifier unit 26X shown in FIG. 68.

Where the unit time required for reading once is T in the driving to simultaneously read all the bits as shown in FIG. 68, the data (data of N/2 bits) of the odd-numbered bits and the data of the even-numbered bits are alternately read at intervals of T/2 in the interleaved driving to alternately read the odd-numbered bits and the even-numbered bits as shown in FIG. 67. The total read time in the interleaved driving is only T/2 longer than the total read time in the driving to simultaneously read all the pixels.

Figure 70:
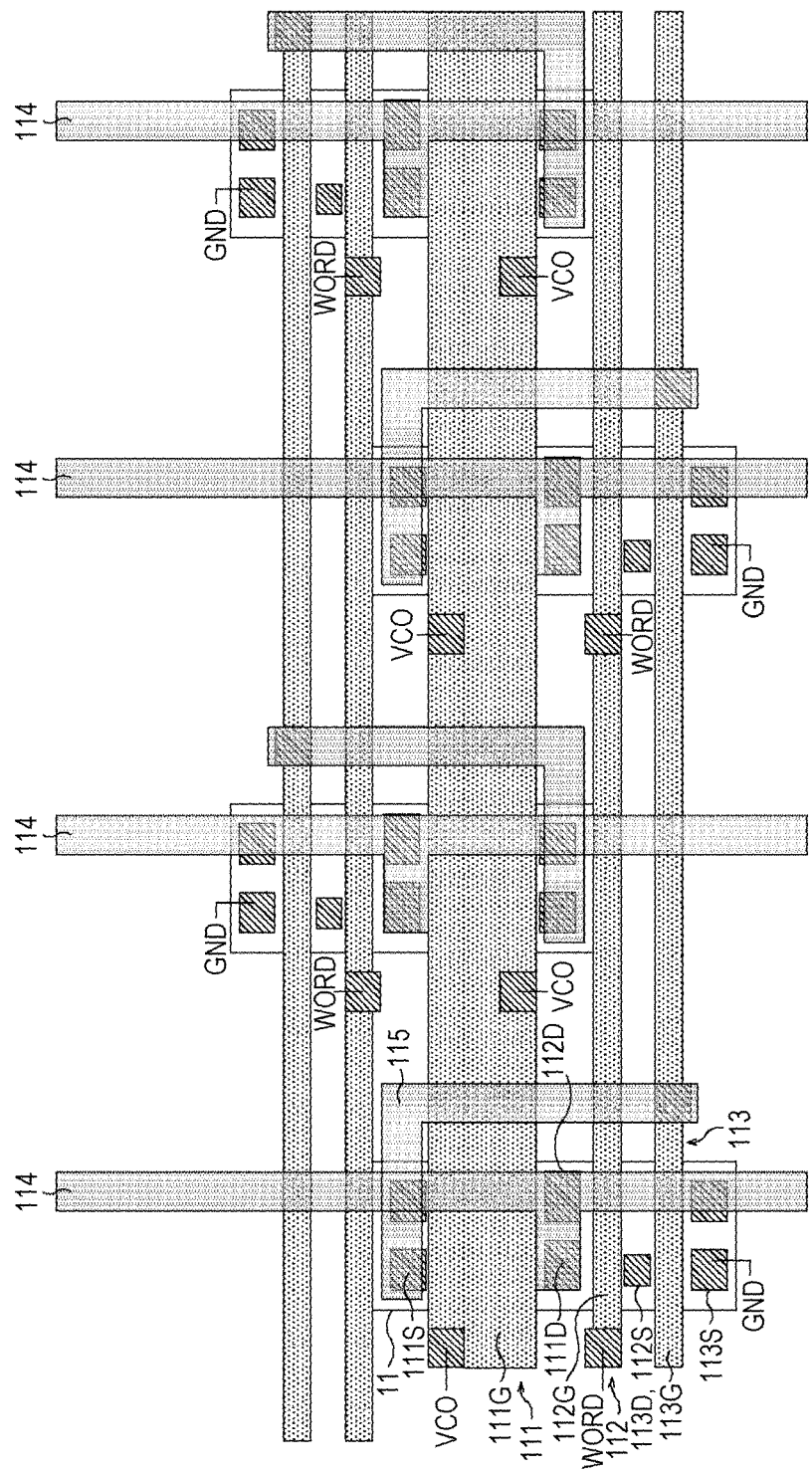
FIG. 70 is a diagram showing an example interconnect layout of a latch circuit when interleaved driving is performed.

FIG. 70 shows an example of the interconnect layout of the latch circuits 101' in a case where the interleaved driving is performed to alternately read the odd-numbered bits and the even-numbered bits as shown in FIGS. 66 and 67.

The gates 111G of the transistors 111 to which output signals VCO are input are integrally aligned in the middle, and the sources 111S and the drains 111D of the transistors 111 of the odd-numbered bits and the even-numbered bits are alternately arranged at upper portions and lower portions.

The gates 112G of the transistors 112 to which read control signals WORD are input are aligned at upper portions and lower portions of the gates 111G of the transistors 111 in the middle. The upper ones or the lower ones are for the even-numbered bits, and the other ones are for the odd-numbered bits.

The gates 113G of the transistors 113 are aligned on the outside of the respective gates 112G of the transistors 112. The upper ones or the lower ones are for the even-numbered bits, and the other ones are for the odd-numbered bits.

As the odd-numbered bits and the even-numbered bits are alternately arranged as described above, the interconnect layout can be efficiently designed.

<25. Example Application to an Electronic Apparatus>

The present disclosure is not limited to application to solid-state imaging devices. Specifically, the present disclosure can be applied to any electronic apparatus using a solid-state imaging device as an image capturing unit (a photoelectric conversion unit), such as an imaging apparatus like a digital still camera or a video camera, a mobile terminal device having an imaging function, or a copying machine using a solid-state imaging device as the image reader. A solid-state imaging device may be in the form of a single chip, or may be in the form of a module that is formed by packaging an imaging unit and a signal processing unit or an optical system, and has an imaging function.

Figure 71:
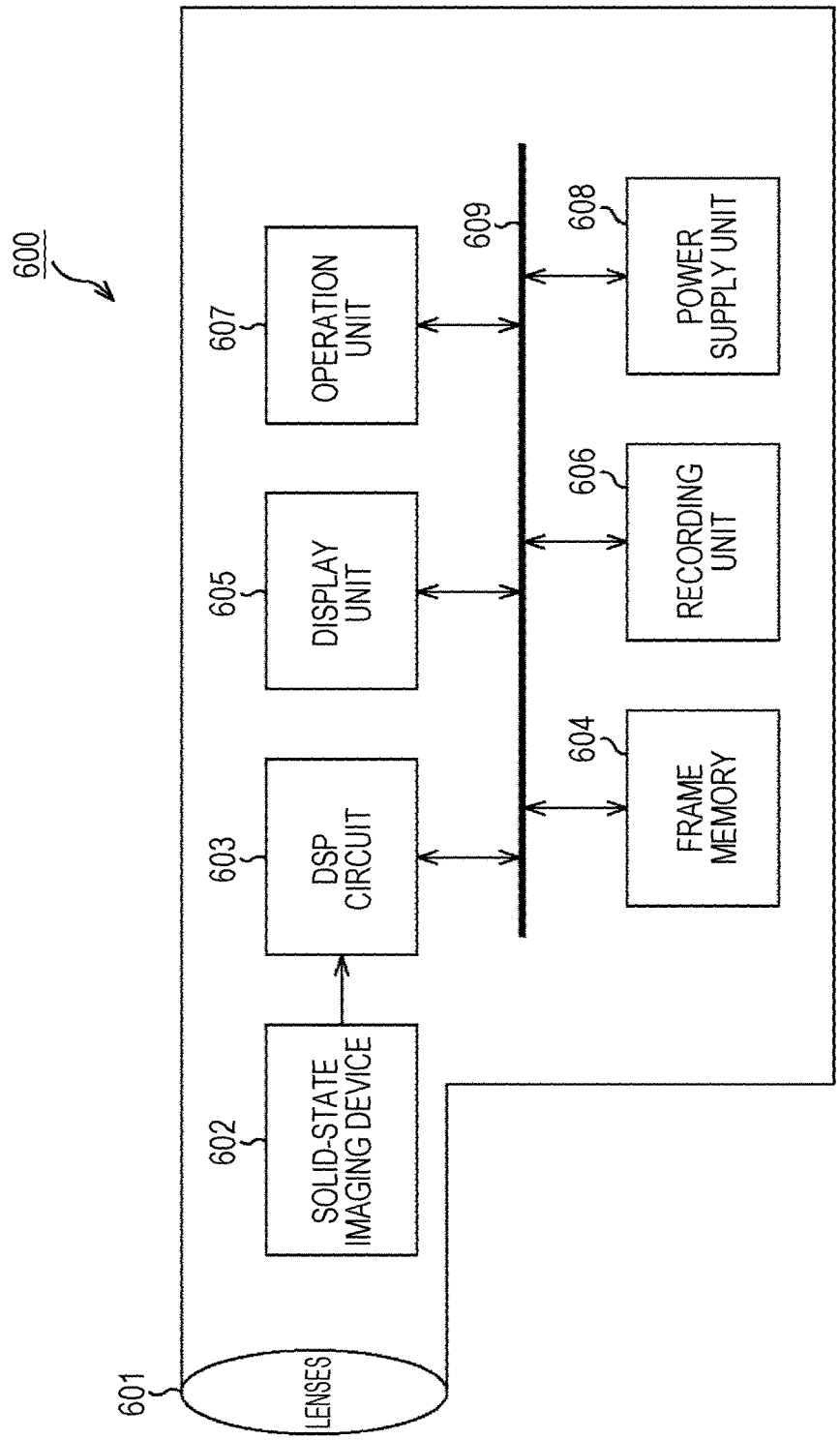
FIG. 71 is a block diagram showing an example structure of an imaging apparatus as an electronic apparatus according to the present disclosure.

FIG. 71 is a block diagram showing an example structure of an imaging apparatus as an electronic apparatus according to the present disclosure.

The imaging apparatus 600 shown in FIG. 71 includes an optical unit 601 formed with lenses and the like, a solid-state imaging device (an imaging device) 602 having the structure of the solid-state imaging device 1 shown in FIG. 1, and a digital signal processor (DSP) circuit 603 that is a camera signal processor circuit. The imaging apparatus 600 also includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected to one another via a bus line 609.

The optical unit 601 gathers incident light (image light) from an object and forms an image on the imaging surface of the solid-state imaging device 602. The solid-state imaging device 602 converts the amount of the incident light, which has been gathered as the image on the imaging surface by the optical unit 601, into an electrical signal for each pixel, and outputs the electrical signal as a pixel signal. This solid-state imaging device 602 may be the solid-state imaging device 1 shown in FIG. 1, or a solid-state imaging device that reduces power consumption while increasing the determination speed of the comparator 51 at the time when a pixel signal is subjected to AD conversion.

The display unit 605 is formed with a panel-type display device such as a liquid crystal panel or an organic electroluminescence (EL) panel, and displays a moving image or a still image formed by the solid-state imaging device 602. The recording unit 606 records the moving image or the still image formed by the solid-state imaging device 602 into a recording medium such as a hard disk or a semiconductor memory.

When operated by a user, the operation unit 607 issues operating instructions as to various functions of the imaging apparatus 600. The power supply unit 608 supplies various power sources as the operation power sources for the DSP circuit 603, the frame memory 604, the display unit 605, the recording unit 606, and the operation unit 607, as appropriate.

As the solid-state imaging device 1 according to the above described embodiment is used as the solid-state imaging device 602 as described above, power consumption can be reduced while the determination speed in AD conversion is increased. Thus, imaging at higher speed and smaller power consumption can also be realized in the imaging apparatus 600 such as a video camera, a digital still camera, or a camera module for mobile devices such as portable telephones.

Although the comparator 51 and the ADC 42 have been described as components incorporated into the solid-state imaging device 1, the comparator 51 and the ADC 42 may be products (a comparator and an AD converter) to be sold individually.

Also, the present disclosure can be applied not only to solid-state imaging devices but also to semiconductor devices having other semiconductor integrated circuits.

It should be noted that embodiments of the present disclosure are not limited to the above described embodiments, and various modifications may be made to the above embodiments without departing from the scope of the present disclosure.

Although the circuit structures of the above described embodiments are circuit structures in which charges are electrons, the present disclosure can also be applied to circuit structures in which charges are holes. Also, in each of the above described circuit structures, the polarities of transistors (the NMOS transistor and the PMOS transistor) may be reversed. In that case, the control signals to be input to the transistors are reversed between Hi and Low.

In each of the above described embodiments, the reference signal REF is a slope signal that monotonically decreases in level (voltage) with time. However, the reference signal REF may be a slope signal that monotonically increases in level (voltage) with time.

In each of the above described embodiments, four pixel circuits 41 are shared in a case where pixel circuits 41 are shared. However, the number of shared pixel circuits 41 is not limited to four, and may be any other number (such as eight).

Other than the above, it is possible to employ a combination of all or some of the above described embodiments. It is also possible to employ an embodiment formed by combining other embodiments not described above.

The advantageous effects described in this specification are merely examples, and the advantageous effects of the present technology are not limited to them and may include effects other than those described in this specification.

The present disclosure may also be embodied in the structures described below.

(1)
A comparator including:
a comparison unit that compares the voltage of an input signal with the voltage of a reference signal, and outputs a comparison result signal;
a positive feedback circuit that increases the speed of transition at the time when the comparison result signal is inverted; and
a current limiting unit that limits the current flowing in the comparison unit after the inversion of the comparison result signal.

(2)
An AD converter including:
a comparator including:
a comparison unit that compares the voltage of an input signal with the voltage of a reference signal, and outputs a comparison result signal;
a positive feedback circuit that increases the speed of transition at the time when the comparison result signal is inverted; and
a current limiting unit that limits the current flowing in the comparison unit after the inversion of the comparison result signal; and
a storage unit that stores the code input signal at the time when the comparison result signal is inverted, and outputs the code input signal.

(3)
The AD converter of (2), wherein the storage unit includes data storage units corresponding to respective bits.

(4)
The AD converter of (2) or (3), wherein the storage unit stores the code input signal having three or more levels, and outputs the code input signal.

(5)
The AD converter of any one of (2) through (4), wherein the input line for inputting the code input signal and the output line for outputting the stored code input signal as a code output signal are integrated.

(6)
The AD converter of any one of (2) through (5), further including
an inverter that inverts the comparison result signal having the speed increased by the positive feedback circuit,
wherein the comparison result signal inverted by the inverter is output to a later stage.

(7)
The AD converter of any one of (2) through (6), wherein:
the current limiting unit is formed with a transistor; and
the comparison unit includes a suppression transistor that suppresses a characteristics difference in the transistor of the current limiting unit.

(8)
The AD converter of (7), wherein the suppression transistor is controlled in the same manner as the transistor of the current limiting unit.

(9)
The AD converter of any one of (2) through (8), wherein, after the comparison result signal is inverted, the voltage of the reference signal is set at the level at which the transistor to which the reference signal is input is turned off.

(10)
A solid-state imaging device including:
an AD converter including:
a comparator including:
a comparison unit that compares the voltage of an input signal with the voltage of a reference signal, and outputs a comparison result signal;
a positive feedback circuit that increases the speed of transition at the time when the comparison result signal is inverted; and
a current limiting unit that limits the current flowing in the comparison unit after the inversion of the comparison result signal; and
a storage unit that stores the code input signal at the time when the comparison result signal is inverted, and outputs the code input signal as a code output signal; and
a pixel circuit that outputs a charge signal as the input signal to the comparison unit, the charge signal having been generated by receiving light entering a pixel and photoelectrically converting the light.

(11)
The solid-state imaging device of (10), wherein:
the comparison unit includes at least a first transistor to which the input signal is input, and a second transistor to which the reference signal is input; and
the first transistor is connected to a floating diffusion layer of the pixel circuit holding the charge signal.

(12)
The solid-state imaging device of (11), wherein the voltage of the reference signal to be input to the second transistor is set at a predetermined voltage, to reset the floating diffusion layer of the pixel circuit.

(13)

The solid-state imaging device of (12), further including a suppression transistor that suppresses a feedthrough current flowing in the positive feedback circuit when the voltage of the reference signal to be input to the second transistor is set at a reset voltage at which the floating diffusion layer of the pixel circuit is reset.

(14)

The solid-state imaging device of any one of (10) through (13), wherein, after storing and outputting the code output signal at a reset level of the pixel, the storage unit of the AD converter stores and outputs the code output signal at a signal level of the pixel.

(15)

The solid-state imaging device of any one of (10) through (14), wherein the comparator is provided for the pixel circuit in one-to-one correspondence.

(16)

The solid-state imaging device of any one of (10) through (14), wherein the comparator is provided for a plurality of the pixel circuits.

(17)

The solid-state imaging device of (16), wherein the voltage of the reference signal to be input to the second transistor is set at a predetermined voltage, to make at least one of the pixel circuits non-selected.

(18)

The solid-state imaging device of (16) or (17), wherein a plurality of the pixels are simultaneously read with a combination of color filters, a color of the combination of the color filters being white.

(19)

The solid-state imaging device of any one of (16) through (18), wherein the simultaneously-read pixels form one image.

(20)

The solid-state imaging device of any one of (16) through (19), wherein:

the comparator is provided for M (M>1) of the pixel circuits; and after outputting the input signal at a reset level of the M pixel circuits to the comparison unit, the M pixel circuits sharing the comparator outputs the input signal at a signal level of the M pixel circuits to the comparison unit.

(21)

The solid-state imaging device of any one of (16) through (20), wherein the pixel circuit includes at least a select transistor that controls selection of the pixel.

(22)

The solid-state imaging device of (21), wherein the comparison unit includes a suppression transistor that suppresses a characteristics difference caused by the select transistor.

(23)

The solid-state imaging device of any one of (10) through (22), wherein:

a pixel array unit in which a plurality of the pixels are two-dimensionally arranged is divided into a plurality of areas; and the voltage of the reference signal is controlled in each of the areas.

(24)

The solid-state imaging device of (23), wherein the voltage of the reference signal in at least one of the areas is equal to or lower than a threshold voltage of the transistor to which the reference signal is input.

(25)

The solid-state imaging device of any one of (10) through (24), which is formed with semiconductor substrates.

(25A)

The solid-state imaging device of (25), which is formed with a first semiconductor substrate and a second semiconductor substrate, wherein the first semiconductor substrate and the second semiconductor substrate are connected by an input unit of the storage unit.

(25B)

The solid-state imaging device of (25), which is formed with a first semiconductor substrate and a second semiconductor substrate, wherein the first semiconductor substrate and the second semiconductor substrate are connected by the drain and the source of the charge signal input transistor of the comparison unit to which the charge signal output from the pixel circuit is input.

(25C)

The solid-state imaging device of (25), which is formed with a first semiconductor substrate and a second semiconductor substrate, wherein the first semiconductor substrate and the second semiconductor substrate are connected by the drain of the charge signal input transistor of the comparison unit to which the charge signal output from the pixel circuit is input, and the drain of the reference signal input transistor of the comparison unit to which the reference signal is input.

(25D)

The solid-state imaging device of (25), which is formed with first through third semiconductor substrates, wherein:

the first semiconductor substrate and the second semiconductor substrate are connected by the drain of the charge signal input transistor of the comparison unit to which the charge signal output from the pixel circuit is input, and the drain of the reference signal input transistor of the comparison unit to which the reference signal is input; and the second semiconductor substrate and the third semiconductor substrate are connected by an input unit of the storage unit.

(25E)

The solid-state imaging device of (25), which is formed with stacked substrates formed by stacking semiconductor substrates, and a side substrate joined to the sidewalls of the stacked substrates.

(26)

The solid-state imaging device of any one of (10) through (25), wherein:

the storage unit includes a P-phase storage unit that stores the code output signal at a reset level of the pixel, and a D-phase storage unit that stores the code output signal at a signal level of the pixel; and the P-phase storage unit and the D-phase storage unit simultaneously output the code output signal at the reset level of the pixel and the code output signal at the signal level.

(27)

The solid-state imaging device of any one of (10) through (26), wherein the pixel circuit includes a transistor that changes the capacitance of the floating diffusion layer holding the charge signal until the charge signal is output to the comparison unit.

(28)

The solid-state imaging device of any one of (10) through (27), wherein the voltage change rate of the reference signal is changed at least once in one vertical scan period.

(29)

The solid-state imaging device of any one of (10) through (28), wherein the frequency of a signal to be the code value is changed at least once in one vertical scan period.

(30)

The solid-state imaging device of any one of (10) through (29), wherein the pixel circuit outputs the charge signal amplified by a source follower circuit as the input signal to the comparison unit.

(30A)

The solid-state imaging device of any one of (10) through (30), wherein the comparator further includes a capacitor connected between a power supply and GND.

(30B)

The solid-state imaging device of any one of (10) through (30A), wherein the storage unit includes a data storage unit that stores 1-bit data, and repeatedly stores and outputs the code output signal the same number of times as the number of AD conversion bits.

(30C)

The solid-state imaging device of any one of (10) through (30B), wherein:
the storage unit includes two data storage units that store the code output signal; and
the code input signal in the two data storage units is a differential signal, and the stored code output signal is a differential signal.

(30D)

The solid-state imaging device of any one of (10) through (30C), wherein the last code input signal in a reset detection period for detecting a reset level of the pixel is set at a predetermined value and is input to the storage unit.

(30E)

The solid-state imaging device of (30D), wherein the predetermined value is the voltage value generated when light impinges on the floating diffusion layer of the pixel circuit.

(30F)

The solid-state imaging device of any one of (10) through (30E), wherein:
a pixel array unit in which a plurality of the pixels are two-dimensionally arranged is horizontally divided into areas; and
the time to input the code input signal varies among the respective areas.

(31)

The solid-state imaging device of any one of (10) through (12), further including
an output unit configured to calculate a black level from a black output pixel for black level correction in a pixel array unit in which a plurality of the pixels are two-dimensionally arranged, subtract the black level from pixel signals of the pixels, and output the pixel signals.

(31A)

The solid-state imaging device of (31), wherein the output unit calculates the black level, using a plurality of the black output pixels arranged in a direction parallel to a power supply line.

(31B)

The solid-state imaging device of (31), wherein the output unit calculates the black level, using a plurality of the black output pixels arranged in a direction parallel to a GND line.

(31C)

The solid-state imaging device of (31), wherein the black output pixel is a regular pixel that is driven without charge transfer.

(31D)

The solid-state imaging device of (31), wherein the black output pixel is a phase difference detection pixel that is driven without charge transfer.

(31E)

The solid-state imaging device of (31), wherein the black output pixel is a regular pixel in a pixel row that is driven without charge transfer.

(32)

The solid-state imaging device of any one of (10) through (31), wherein:
the pixel circuit includes a reset transistor that resets the floating diffusion layer holding the charge signal; and
the drain of the reset transistor is connected to a power supply voltage.

(33)

The solid-state imaging device of any one of (10) through (32), further including
a code reading unit that reads the code output signal stored in the storage unit by performing a precharge operation and a read operation,
wherein the code reading unit performs the read operation when an adjacent code reading unit is performing the precharge operation.

(34)

An electronic apparatus including
a solid-state imaging device including:
an AD converter including:
a comparator including:
a comparison unit configured to compare a voltage of an input signal with a voltage of a reference signal, and output a comparison result signal;
a positive feedback circuit configured to increase a speed of transition at a time when the comparison result signal is inverted; and
a current limiting unit configured to limit a current flowing in the comparison unit after the inversion of the comparison result signal; and
a storage unit configured to store a code input signal at the time when the comparison result signal is inverted, and output the code input signal as a code output signal; and
a pixel circuit configured to output a charge signal as the input signal to the comparison unit, the charge signal having been generated by receiving light entering a pixel and photoelectrically converting the light.

(35)

A method of controlling a comparator including a comparison unit, a positive feedback circuit, and a current limiting unit,
the method including:
the comparison unit comparing the voltage of an input signal with the voltage of a reference signal, and outputting a comparison result signal;
the positive feedback circuit increasing the speed of transition at the time when the comparison result signal is inverted; and
the current limiting unit limiting the current flowing in the comparison unit after the inversion of the comparison result signal.

REFERENCE SIGNS LIST

1 Solid-state imaging device
21 Pixel
22 Pixel array unit
24 DAC
26 Sense amplifier unit
27 Output unit 41 Pixel circuit
42 ADC
51 Comparator
52 Latch storage unit
61 Differential amplifier circuit
62 Positive feedback circuit
63 Current limiting unit
81, 82, 86 Transistor
121 Inverter
141 Transistor
174 Reset transistor
175 FD
176 Select transistor
181 PMOS transistor
211 Transistor
322P P-phase latch unit
322D D-phase latch unit
341, 342 NMOS transistor
361 Capacitor
381, 381X Latch unit
600 Imaging apparatus
602 Solid-state imaging device

What is claimed is:

1. A comparator comprising:
a comparison unit configured to output a comparison result signal based on a comparison of a voltage of an input signal with a voltage of a reference signal, wherein the comparison unit includes at least a first transistor to which the input signal is input and at least a second transistor to which the reference signal is input, wherein the first transistor is connected to a floating diffusion layer of a pixel circuit, and wherein the voltage of the reference signal is set at a predetermined voltage to reset the floating diffusion layer of the pixel circuit;
a positive feedback circuit configured to increase a speed of transition when the comparison result signal is inverted, wherein when the comparison result signal is inverted a code input signal is stored in a storage unit; and
a current limiting unit configured to limit a current flowing in the comparison unit after an inversion of the comparison result signal.

* * * * *